(12) United States Patent
Saikaku et al.

(10) Patent No.: US 8,890,252 B2
(45) Date of Patent: Nov. 18, 2014

(54) SEMICONDUCTOR DEVICE HAVING SWITCHING ELEMENT AND FREE WHEEL DIODE AND METHOD FOR CONTROLLING THE SAME

(75) Inventors: Hirotaka Saikaku, Kariya (JP); Tsuyoshi Yamamoto, Kariya (JP); Shoji Mizuno, Okazaki (JP); Masakiyo Sumitomo, Okazaki (JP); Tetsuo Fujii, Toyohashi (JP); Jun Sakakibara, Nagoya (JP); Hitoshi Yamaguchi, Nisshin (JP); Yoshiyuki Hattori, Aichi-gun (JP); Rie Taguchi, Toyota (JP); Makoto Kuwahara, Nagoya (JP)

(73) Assignee: DENSO CORPORATION, Kariya (JP)

( * ) Notice: Subject to any disclaimer, the term of this patent is extended or adjusted under 35 U.S.C. 154(b) by 118 days.

(21) Appl. No.: 13/190,798

(22) Filed: Jul. 26, 2011

(65) Prior Publication Data
US 2012/0025874 A1    Feb. 2, 2012

(30) Foreign Application Priority Data

Jul. 27, 2010 (JP) ................................ 2010-168300
Sep. 20, 2010 (JP) ................................ 2010-210302
Feb. 11, 2011 (JP) ................................ 2011-27994

(51) Int. Cl.
*H01L 21/70* (2006.01)
*H01L 21/78* (2006.01)
*H01L 29/739* (2006.01)
*H01L 29/78* (2006.01)
*H01L 29/10* (2006.01)
*H01L 29/40* (2006.01)
*H01L 29/49* (2006.01)
*H01L 29/66* (2006.01)
*H01L 29/06* (2006.01)
*H01L 29/423* (2006.01)
*H01L 29/861* (2006.01)
*H02M 7/00* (2006.01)

(52) U.S. Cl.
CPC ........ *H01L 29/7813* (2013.01); *H01L 29/7397* (2013.01); *H01L 29/7819* (2013.01); *H01L 29/7393* (2013.01); *H01L 29/0696* (2013.01); *H01L 29/4238* (2013.01); *H01L 29/42368* (2013.01); *H01L 29/7825* (2013.01); *H01L 29/1095* (2013.01); *H01L 29/861* (2013.01); *H01L 29/407* (2013.01); *H01L 29/0634* (2013.01); *H01L 29/4983* (2013.01); *H01L 29/7391* (2013.01); *H01L 29/7831* (2013.01); *H01L 29/66734* (2013.01); *H01L 29/7805* (2013.01); *H02M 7/003* (2013.01)
USPC ........... 257/368; 257/330; 257/331; 257/332; 257/333; 257/334; 257/267; 257/328; 438/29; 438/212; 438/268; 438/270; 438/272; 438/273; 438/294; 438/334; 438/430; 438/431

(58) Field of Classification Search
CPC .............. H01L 29/1095; H01L 29/407; H01L 29/42368; H01L 29/4983; H01L 29/66734; H01L 29/7393; H01L 29/7397; H01L 29/7805; H01L 29/7813; H01L 29/7819; H01L 29/7825; H01L 29/7831; H01L 29/0634; H01L 29/4238; H01L 29/7391; H01L 29/6659; H01L 29/783; H01L 27/1104; H01L 29/0696; H01L 29/41766; H01L 2924/13091; H01L 29/0653; H01L 29/4236; H01L 29/7835; H01L 29/0847; H01L 29/7809; H01L 29/7804; H01L 29/861; H01L 29/78; H01L 29/00
USPC ........... 257/77, 133–136, 365, 140, 260–264, 257/267, 327, 368, 341–343, 330–335, 328, 257/E29.199, E27.016, E27.013, E29; 438/29, 212, 268, 270, 272, 273, 294, 438/334, 430, 431
See application file for complete search history.

(56) References Cited

U.S. PATENT DOCUMENTS

| | | | |
|---|---|---|---|
| 5,256,892 | A | 10/1993 | Yoshida |
| 5,828,101 | A | 10/1998 | Endo |
| 5,864,159 | A | 1/1999 | Takahashi |
| 6,049,108 | A | 4/2000 | Williams et al. |
| 2005/0045960 | A1 | 3/2005 | Takahashi |
| 2006/0157779 | A1 | 7/2006 | Kachi et al. |
| 2006/0199319 | A1 | 9/2006 | Takaishi |
| 2006/0261391 | A1 | 11/2006 | Nakazawa et al. |
| 2008/0012040 | A1 | 1/2008 | Saito et al. |
| 2008/0048255 | A1 | 2/2008 | Ishida et al. |
| 2008/0315301 | A1* | 12/2008 | Takemori et al. ............. 257/331 |
| 2009/0026535 | A1 | 1/2009 | Matsuura et al. |
| 2009/0140327 | A1* | 6/2009 | Hirao et al. .................. 257/328 |

FOREIGN PATENT DOCUMENTS

| | | |
|---|---|---|
| JP | A-63-296282 | 12/1988 |
| JP | A-06-204463 | 7/1994 |
| JP | A-H11-97715 | 4/1999 |
| JP | A-2003-133557 | 5/2003 |
| JP | A-2004-22716 | 1/2004 |
| JP | A-2009-170670 | 7/2009 |
| JP | A-2011-146555 | 7/2011 |

OTHER PUBLICATIONS

Office Action mailed Oct. 16, 2012 in corresponding JP Application No. 2010-210302 (and English translation).

Office Action dated Oct. 10, 2013 in the corresponding CN application No. 201110211992.9 (English translation).

* cited by examiner

*Primary Examiner* — Jae Lee
*Assistant Examiner* — Junaiden Mirsalahuddin
(74) *Attorney, Agent, or Firm* — Posz Law Group, PLC

(57) ABSTRACT

A semiconductor device includes a switching element having: a drift layer; a base region; an element-side first impurity region in the base region; an element-side gate electrode sandwiched between the first impurity region and the drift layer; a second impurity region contacting the drift layer; an element-side first electrode coupled with the element-side first impurity region and the base region; and an element-side second electrode coupled with the second impurity region, and a FWD having: a first conductive layer; a second conductive layer; a diode-side first electrode coupled to the second conductive layer; a diode-side second electrode coupled to the first conductive layer; a diode-side first impurity region in the second conductive layer; and a diode-side gate electrode in the second conductive layer sandwiched between first impurity region and the first conductive layer and having a first gate electrode as an excess carrier injection suppression gate.

7 Claims, 35 Drawing Sheets

STATE (1), (4)

STATE (2)

STATE (3)

SEMICONDUCTOR DEVICE HAVING SWITCHING ELEMENT AND FREE WHEEL DIODE AND METHOD FOR CONTROLLING THE SAME

CROSS REFERENCE TO RELATED APPLICATIONS

This application is based on Japanese Patent Applications No. 2010-168300 filed on Jul. 27, 2010, No. 2010-210302 filed on Sep. 20, 2010, and No. 2011-27994 filed on Feb. 11, 2011, the disclosures of which are incorporated herein by reference.

TECHNICAL FIELD

The present disclosure relates to a semiconductor device having a semiconductor switching element with an insulated gate structure and a free wheel diode coupled in parallel with each other, and a control method therefor.

BACKGROUND

Structures in which a vertical MOSFET and a free wheel diode are contained in one chip for the simplification of the structure of MOSFET used in an inverter have been conventionally proposed. (Refer to Patent Document 1, for example.) In semiconductor devices obtained by containing a vertical MOSFET and a free wheel diode in one chip, the free wheel diode is formed of a p-n junction comprised of a body layer and a drift layer provided in the vertical MOSFET.
[Patent Document 1] Japanese Unexamined Patent Publication No. 2004-22716

The above conventional configuration makes it possible to carry out diode operation without need for an external free wheel diode during inverter operation. This reduces a number of required components and brings about an advantage of the feasibility of size and cost reduction. With the above conventional configuration, however, excess carriers are discharged during diode operation and they flow out as reverse recovered charge Qrr and this poses a problem of increased recovery loss.

To solve this problem, the present applicants proposed a technique for suppressing excess carrier injection using a gate for driving MOSFET. This technique is as follows: during diode operation, a positive voltage slightly lower than the threshold value of MOSFET is applied to form a weak inversion layer to accelerate the recombination of injected excess carriers; or a depletion layer is formed to reduce an area used as a diode. (Refer to Japanese Patent Application No. 2010-6549.)

This method brings about an effect that it is possible to suppress the injection of excess carriers to reduce reverse recovered charge Qrr without increasing loss during diode operation. However, a difficulty arises because one and the same gate has charge of MOSFET operation and excess carrier injection suppressing operation. When noise enters the gate and the gate voltage fluctuates during excess carrier injection suppressing operation, there is a possibility that the threshold value of the MOSFET is readily exceeded. In this case, self turn-on occurs and the MOSFET is unintentionally turned on.

In the above description, a vertical MOSFET has been taken as an example of the semiconductor switching element with an insulated gate structure. However, the above problems arise also in any vertical MOSFET including trench gate type, planar type, and concave type and the horizontal MOSFETs also involve the same difficulties. The same difficulties arise also in vertical and horizontal IGBTs. These difficulties arise not only in semiconductor devices in which a semiconductor switching element with an insulated gate structure and a free wheel diode are contained in one chip. They arise also in those in which a semiconductor switching element and a free wheel diode are formed in different chips as long as they are semiconductor devices so structured that a semiconductor switching element with an insulated gate structure and a free wheel diode are coupled in parallel. Also when a semiconductor switching element and a free wheel diode are formed in different chips, the above excess carrier injection suppression can be implemented. Even when this technique is applied, however, recovery measures can be carried out but the difficulty of self turn-on still remains.

Systems with the following structure have been conventionally adopted: a structure in which IGBT as a semiconductor switching element used in an inverter for driving an electric induction load such as a motor and a free wheel diode (hereafter, abbreviated as FWD) are formed in different chips and they are coupled in parallel. To further reduce the size of these systems, the following practice has been taken: IGBT is replaced with a vertical MOSFET and a body diode incorporated in the vertical MOSFET is caused to function as FWD.

In case of structures in which a vertical MOSFET and FWD are contained in one chip, injection efficiency is intentionally reduced by controlling minority carrier life or taking other like measures to reduce the recovery loss of the FWD. In this case, conversely, on-voltage during back flow operation is raised and this increases back flow loss. Therefore, a difficulty in achieving both recovery loss reduction and back flow loss reduction arises.

To cope with this, the technology for implementing the following is disclosed in Patent Document 2: a deep trench gate is formed in a diode region where the injection efficiency is low in a chip in which a semiconductor switching element is formed; during back flow operation, a negative bias is applied to the trench gate to form an accumulation layer in a vicinal region to enhance injection efficiency and reduce on-voltage.
[Patent Document 2] Japanese Unexamined Patent Publication No. 2009-170670

However, structures in which a deep trench gate is formed in a diode region as described in Patent Document 2 involve a difficulty. It is necessary to form a trench gate for diode region different in depth from the trench gate for forming a semiconductor switching element. For this reason, a process for forming the trench gate different in depth is required and this incurs increase in the number of manufacturing process steps and increase in manufacturing cost.

SUMMARY

In view of the above-described difficulty, it is an object of the present disclosure to provide a semiconductor device having a semiconductor switching element with an insulated gate structure and a free wheel diode coupled in parallel with each other. It is another object of the present disclosure to provide a method for controlling a semiconductor device having a semiconductor switching element with an insulated gate structure and a free wheel diode coupled in parallel with each other. The semiconductor device has a structure in which recovery loss can be reduced and self turn-on due to noise is restricted.

According to a first aspect of the present disclosure, a semiconductor device includes: a semiconductor switching element with an insulated gate structure; and a free wheel diode. The semiconductor switching element includes: a drift layer having a first conductivity type; a base region having a second conductivity type and arranged on the drift layer; an element-side first impurity region having the first conductivity type, arranged in a surface part of the base region, separated from the drift layer by the base region therebetween, and having an impurity concentration higher than the drift layer; an element-side gate electrode disposed in the base region sandwiched between the first impurity region and the drift layer through a gate insulating film; a second impurity region having the first or second conductivity type, contacting the drift layer, having an impurity concentration higher than the drift layer, and separated from the base region; an element-side first electrode electrically coupled with the element-side first impurity region and the base region; and an element-side second electrode electrically coupled with the second impurity region. The semiconductor switching element provides an inversion channel in a portion of the base region opposite to the element-side gate electrode via the gate insulating film therebetween. The semiconductor switching element provides a current flowing between the element-side first electrode and the element-side second electrode through the channel. The free wheel diode includes: a first conductivity type layer; a second conductivity type layer arranged on the first conductivity type layer; a diode-side first electrode coupled to the second conductivity type layer; and a diode-side second electrode coupled to the first conductivity type layer. The free wheel diode provides a p-n junction including the first conductivity type layer and the second conductivity type layer. The free wheel diode provides a current flowing between the diode-side first electrode and the diode-side second electrode. The semiconductor switching element and the free wheel diode are coupled in parallel with each other. The free wheel diode further includes: a diode-side first impurity region having the first conductivity type, arranged in a surface part of the second conductivity type layer, and having an impurity concentration higher than the first conductivity type layer; and a diode-side gate electrode arranged in the second conductivity type layer sandwiched between the first impurity region and the first conductivity type layer through a gate insulating film. The diode-side gate electrode includes a first gate electrode. The first gate electrode provides an excess carrier injection suppression gate. When a gate voltage is applied to the diode-side gate electrode, the first gate electrode provides the channel in a part of the second conductivity type layer. The part of the second conductivity type layer is arranged between the diode-side first impurity region and a predetermined position, which is disposed between the diode-side first impurity region and the first conductivity type layer.

The above semiconductor device includes the first gate electrode and can be used as an excess carrier injection suppression gate by forming a channel in the following portion of the second conductivity type layer when gate voltage is applied: a portion extended from the first impurity region side to an intermediate position on the way to the first conductivity type layer located on the opposite side to the first impurity region with the second conductivity type layer in between. This makes it possible to implement the following: the injection of excess carriers is suppressed when a time of keeping the FWD in diode operation is changed to a time of turning on the semiconductor switching element to reduce the excess carriers existing in the second conductivity type layer and recovery loss is reduced. In addition, it is possible to apply gate voltage only to the first gate electrode to form an inversion layer and not to apply any voltage to the second gate electrode and thereby reduce recovery loss. Even though gate voltage due to noise is applied to the second gate electrode, therefore, a threshold value at which the semiconductor switching element is turned on is less prone to be exceeded. Therefore, a semiconductor device with such a structure that self turn-on due to noise is less prone to occur can be obtained.

According to a second aspect of the present disclosure, a control method for the semiconductor device of the first aspect includes: switching from a diode operation state of the free wheel diode to an on-state of the semiconductor switching element; and before the semiconductor switching element turns on in the switching, applying a gate voltage to the first gate electrode in order to generate an inversion layer in a portion of the second conductivity type layer opposed to the first gate electrode via the gate insulating film.

In the above control method for the semiconductor device, the injection of excess carriers is suppressed when a time of keeping the FWD in diode operation is switched to a time of turning on the semiconductor switching element. This makes it possible to reduce excess carriers existing in the second conductivity type layer and reduce recovery loss. In addition, it is possible to apply gate voltage only to the first gate electrode to form an inversion layer and not to apply any voltage to the second gate electrode and reduce recovery loss. For this reason, even though gate voltage due to noise is applied to the second gate electrode, a threshold value at which the semiconductor switching element is turned on is less prone to be exceeded. Therefore, a semiconductor device with such a structure that self turn-on due to noise is less prone to occur can be obtained.

According to a third aspect of the present disclosure, a semiconductor device includes: a first conductivity type semiconductor layer; a drift layer having the first conductivity type, arranged on the semiconductor layer, and having an impurity concentration lower than the semiconductor layer; a base region having a second conductivity type, arranged on the drift layer opposite to the semiconductor layer; a first conductivity type impurity region arranged on the base region, and having an impurity concentration higher than the drift layer; a second conductivity type impurity layer arranged at a position deeper than the base region, and contacting the base region; a trench arranged on a surface of the base region, wherein the trench extends in a longitudinal direction, and the first conductivity type impurity region and the base region are arranged on both sides of the trench; a gate insulating film arranged on a surface of the trench; a gate electrode arranged in the trench through the gate insulating film; a front surface electrode electrically coupled to the first conductivity type impurity region and the base region; and a back surface electrode arranged on a back surface of the first conductivity type semiconductor layer opposite to the drift layer. When a voltage is applied to the gate electrode, an inversion layer is generated in a surface portion of the base region located on a side of the trench. A current flows between the front surface electrode and the back surface electrode through the first conductivity type impurity region, the inversion layer, and the drift layer so that an inverting vertical semiconductor switching element is provided. A p-n junction is provided between the base region and the drift layer so that a free wheel diode having a diode operation is provided. The semiconductor switching element and the free wheel diode are arranged in one chip. The trench includes a first trench and a second trench. The first trench is deeper than the base region and reaches the drift layer. The second trench has a same depth as the first trench, reaches the second conductivity type impurity layer and is shallower than a bottom portion of the second conductivity type impurity layer. The gate electrode includes a driving gate electrode for driving the vertical semiconductor switching element and a diode gate electrode for generating an inversion layer in the base region at a position where the free wheel diode is arranged. The driving gate electrode is arranged in the first trench. The diode gate electrode is arranged in the second trench.

In the above semiconductor device, the following gate electrodes are formed using the first and second trenches identical in depth: the driving gate electrode for driving the vertical semiconductor switching element and the diode gate electrode for forming an inversion layer on the FWD side. The diode gate electrode is formed in a region where the impurity layer of second conductivity type is formed and is so structured that the second trench in which the diode gate electrode is placed is not extended to the drift layer. Use of a semiconductor device with this structure makes it possible to reduce carrier injection efficiency. Therefore, it is possible to achieve both back flow loss reduction and recovery loss reduction without need for trench gates different in depth.

According to a fourth aspect of the present disclosure, a control method for an apparatus including two semiconductor devices of the third aspect, which are connected in series with each other, and an inductive load connected at a junction point between the two semiconductor devices, includes: switching the vertical semiconductor switching element in one of the semiconductor devices arranged on a high side from an off state to an on state, and switching the free wheel diode in the other semiconductor device arranged on a low side from an on state to an off state; and, before the vertical semiconductor switching element in the one of semiconductor devices on the high side is switched from the off state to the on state, applying a gate voltage to the diode gate electrode in the other semiconductor device on the low side in order to generate an inversion layer in the base region located on the side of the second trench, in which the diode gate electrode is arranged.

According to this control method for the device, the carrier injection efficiency can be reduced. Therefore, it is possible to achieve both back flow loss reduction and recover loss reduction without need for trench gates different in depth.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

First Embodiment

Figure 1:
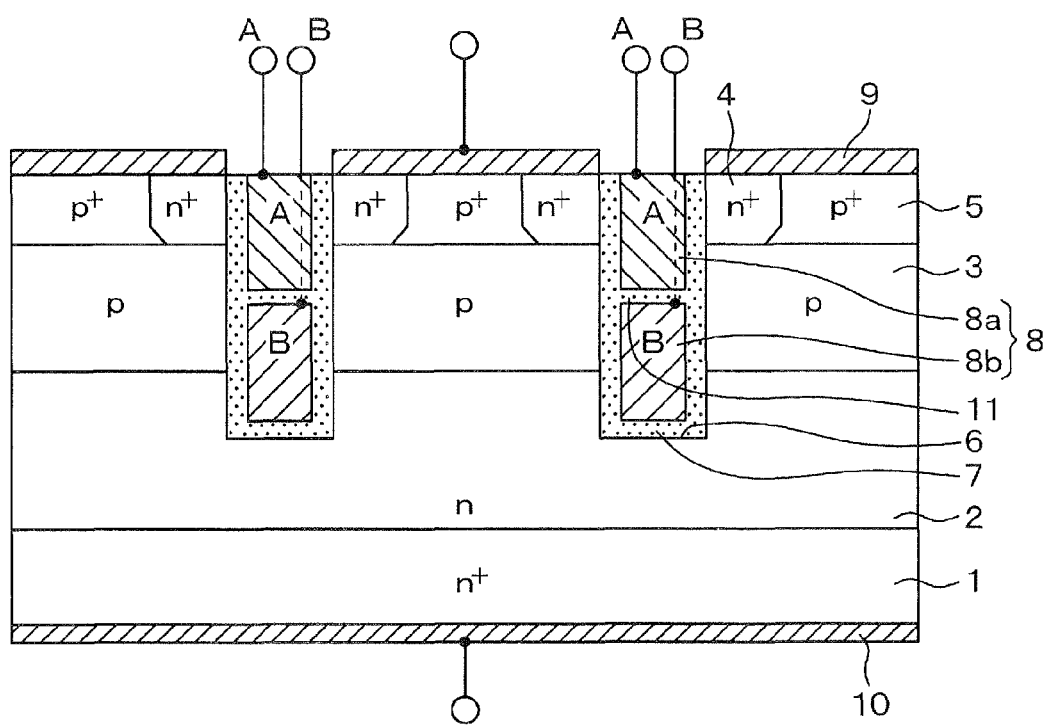
FIG. 1 is a diagram showing a cross sectional view of a semiconductor device in which a vertical MOSFET and FWD are formed in a first embodiment.

Description will be given to an embodiment of the disclosure. In the description of this embodiment, a semiconductor device in which an n-channel vertical MOSFET and FWD are formed in a cell region will be taken as an example. FIG. 1 is a sectional view of a semiconductor device in this embodiment. Hereafter, description will be given to the structure of the semiconductor device in this embodiment with reference to this drawing.

The semiconductor device illustrated in FIG. 1 is so structured that it includes a cell region where a vertical MOSFET and FWD are formed and a peripheral region, surrounding the cell region, where a peripheral high-breakdown voltage structure is formed. FIG. 1 shows only the cell region. The structure of the regions other than the cell region of the semiconductor device is the same as conventional and only the cell region will be described here.

The semiconductor device is formed using a $n^+$-type semiconductor substrate 1 formed of a semiconductor material such as silicon high in impurity concentration. The following are formed over the surface of the $n^+$-type semiconductor substrate 1 in the following order: an $n^-$-type drift layer 2 lower in impurity concentration than the $n^+$-type semiconductor substrate 1 and a p-type base region 3 whose impurity concentration is set relatively low.

In the surface part of the p-type base region 3, a $n^+$-type impurity region 4 equivalent to a source region higher in impurity concentration than the $n^-$-type drift layer 2 is provided; and in addition, a $p^+$-type contact region 5 higher in impurity concentration than the p-type base region 3 is formed. A trench 6 that penetrates the $n^+$-type impurity region 4 and the p-type base region 3 and is extended from the surface side of the substrate to the $n^-$-type drift layer 2 is formed. A gate insulating film 7 is so formed as to cover the inner wall surface of the trench 6 and a gate electrode 8 formed of doped Poly-Si is formed over the surface of the gate insulating film 7. The trench gate structure comprised of the trench 6, gate insulating film 7, and gate electrode 8 are laid out in stripes; that is, for example, multiple trenches 6 are arranged in the direction perpendicular to the plane of the drawing.

An interlayer insulating film (not shown) comprised of an oxide film or the like is so formed as to cover the gate electrode 8 and a first electrode 9 equivalent to a source electrode is formed over this interlayer insulating film. The first electrode 9 is electrically coupled to the n$^+$-type impurity region 4 and the p$^+$-type contact region 5 through a contact hole formed in the interlayer insulating film. The drawing shows only the portion of the first electrode 9 located in the contact hole; however, in actuality, the first electrode 9 is formed also over the interlayer insulating film, not shown.

A second electrode 10 equivalent to a drain electrode is formed over the surface of the n$^+$-type semiconductor substrate 1 on the opposite side to the n$^-$-type drift layer 2. This configuration forms the basic structure of the vertical MOSFET. FIG. 1 shows only vertical MOSFETs equivalent to two cells; however, in actuality, multiple cells of the vertical power MOSFETs illustrated in FIG. 1 are congregated to form a cell region.

In the vertical MOSFET having this basic structure of the semiconductor device in this embodiment, the gate electrode 8 is provided with a double gate structure. Specifically, the gate electrode 8 includes the following electrodes: a first gate electrode 8a placed on the upper side of the trench 6 and a second gate electrode 8b placed under the first gate electrode 8a, that is, on the bottom side of the trench 6. The first gate electrode 8a functions as an excess carrier injection excess carrier injection suppression gate and a MOSFET driving gate and the second gate electrode 8b functions as a MOSFET driving gate together with the first gate electrode 8a.

The first gate electrode 8a is so formed that it is extended upward from a depth equivalent to the intermediate position in the p-type base region 3. The second gate electrode 8b is so formed that it is extended from the depth equivalent to the intermediation position in the p-type base region 3 to the depth at which it reaches the n$^-$-type drift layer 2. The first gate electrode 8a and the second gate electrode 8b are insulated and separated from each other by an insulating film 11 comprised of an oxide film or the like placed therebetween and their voltages can be independently controlled. More specific description will be given. As illustrated in the drawing, the first and second gate electrodes 8a, 8b are electrically coupled with external sources through different gate wirings and voltages applied thereto can be independently controlled. In the drawing, the first gate electrode 8a and the gate wiring leading thereto are notated as "A," and the second gate electrode 8b and the gate wiring leading thereto are notated as "B." Description will be given to the states of the first and second gate electrodes 8a, 8b based on the notations of "A" and "B."

With this structure, a semiconductor device having a vertical MOSFET and FWD is formed. The vertical MOSFET forms an inversion layer in the p-type base region 3 located along the side of the trench 6 and thereby passes a current between source and drain through the n$^+$-type impurity region 4, n$^-$-type drift layer 2, and n$^+$-type semiconductor substrate 1 equivalent to a drain region. The FWD utilizes a p-n junction formed between the p-type base region 3 and the n$^-$-type drift layer 2.

Subsequently, description will be given to the semiconductor device having the vertical MOSFET and the FWD configured as mentioned above.

When the first electrode 9 is grounded and positive voltage is applied to the second electrode 10, the p-n junction formed between the p-type base region 3 and the n$^-$-type drift layer 2 is brought into an inverse voltage state. For this reason, when voltage is not applied to the first or second gate electrode 8a, 8b and they are off, a depletion layer is formed at the p-n junction and the current between source and drain is interrupted.

To turn on the vertical MOSFET, the first electrode 9 is grounded and positive voltage is applied to both the first and second gate electrodes 8a, 8b to turn them on with positive voltage applied to the second electrode 10. Thus an inversion layer is formed in the portion of the p-type base region 3 in contact with the trench 6 in proximity to the first and second gate electrodes 8a, 8b and a current is passed between source and drain.

To turn off the vertical MOSFET and cause the FWD to perform diode operation, the following procedure is taken: voltages applied to the first electrode 9 and the second electrode 10 are switched and positive voltage is applied to the first electrode 9 and the second electrode 10 is grounded; and further voltage application to the first and second gate electrodes 8a, 8b is stopped to turn them off. As a result, an inversion layer is not formed in the p-type base region 3 and the FWD formed between source and drain performs diode operation.

As mentioned above, the time of turning on the vertical MOSFET and the time of turning off the vertical MOSFET and causing the FWD to perform diode operation are switched. Thus direct current-alternating current conversion can be carried out by an inverter using the semiconductor device in this embodiment.

When this operation is performed, control for reducing recovery loss is carried out during a period from when the vertical MOSFET is off and the FWD is in diode operation to immediately before the vertical MOSFET is switched on. Description will be given to this control method with reference to the schematic diagrams indicating the operation of the semiconductor device in FIGS. 2A to 2C and FIGS. 3A to 3B and the timing chart of this operation in FIG. 4.

Figure 2A:
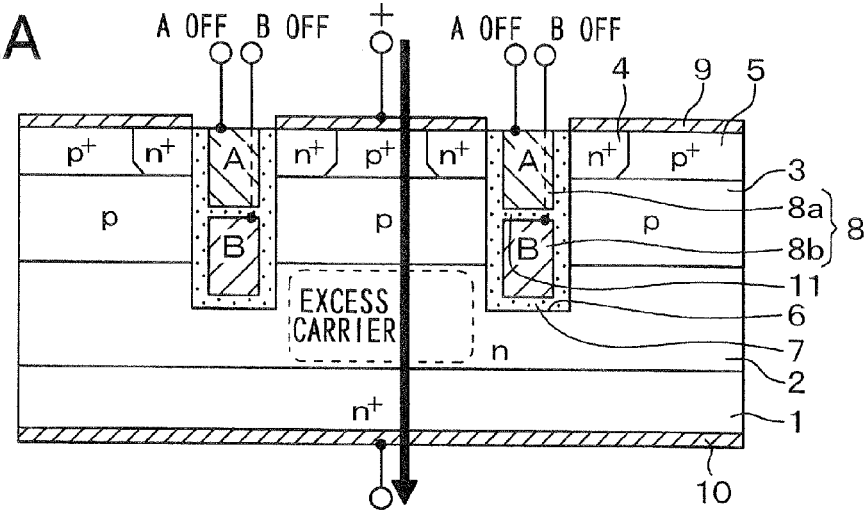
FIG. 2A is a diagram showing an explanatory drawing of the operation of the semiconductor device illustrated in FIG. 1.
Figure 2B:
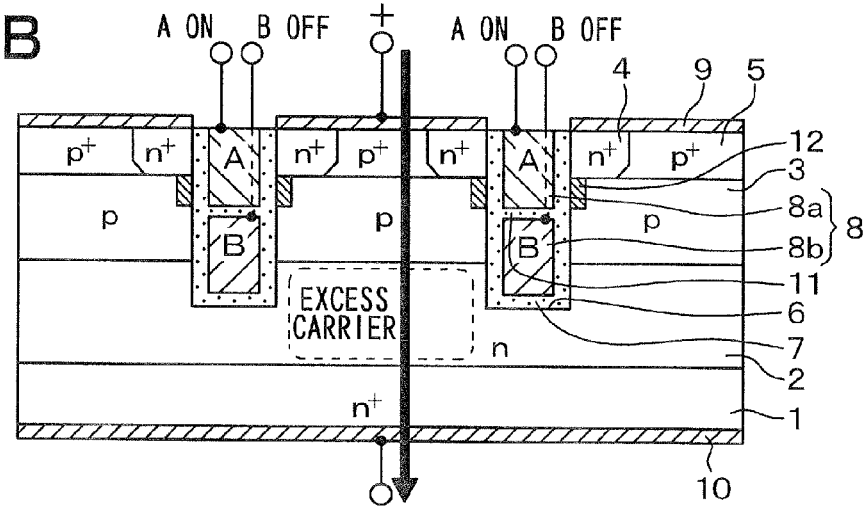
FIG. 2B is a diagram showing an explanatory drawing of the operation of the semiconductor device illustrated in FIG. 1.
Figure 4:
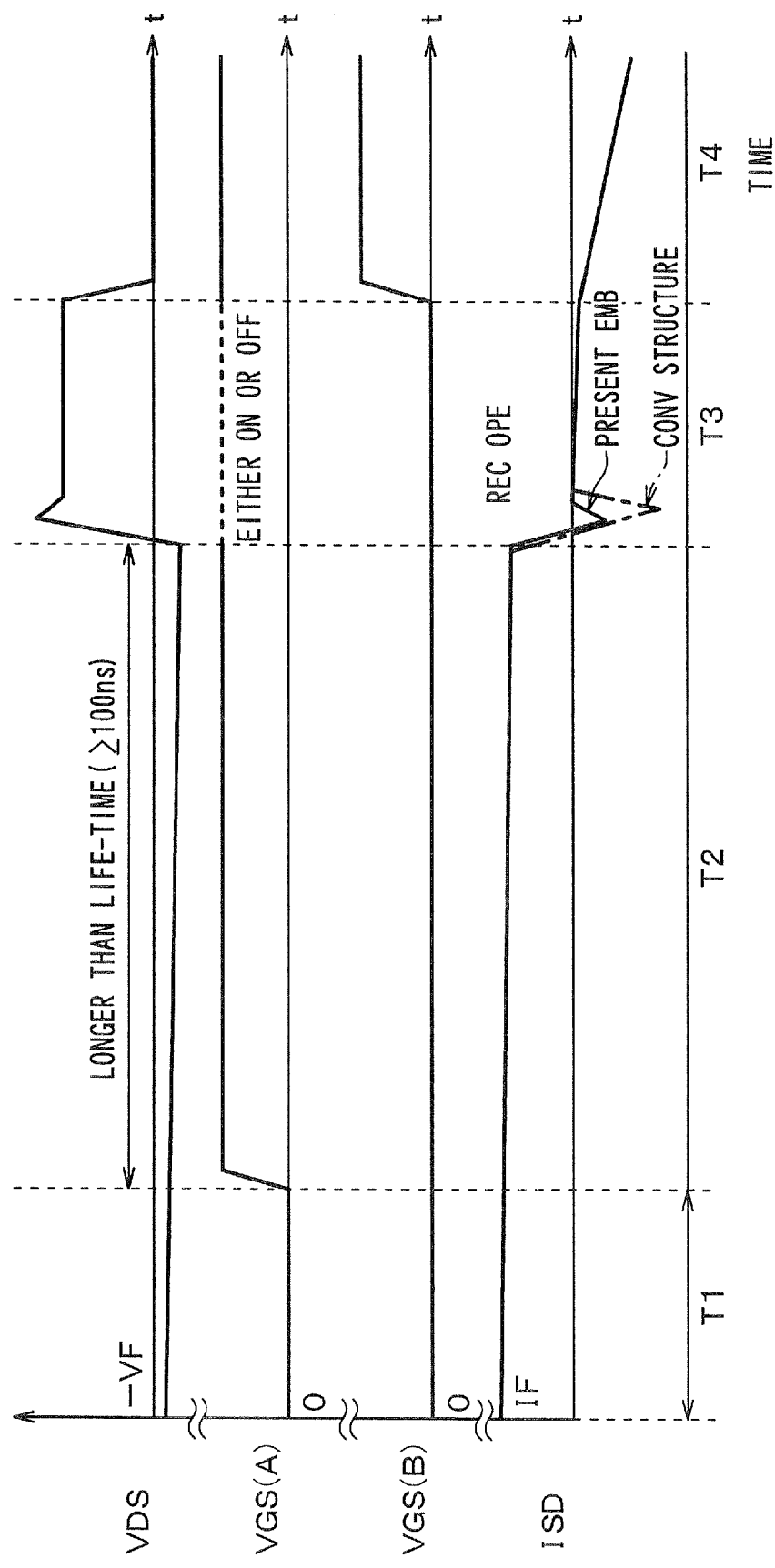
FIG. 4 is a diagram showing a timing chart of the semiconductor device illustrated in FIG. 1 in operation.

FIG. 2A illustrates a state in which the vertical MOSFET is off and the FWD is kept in diode operation. This state is represented as time T1 in FIG. 4 and the FWD using the p-n junction formed between the p-type base region 3 and the n$^-$-type drift layer 2 is formed between source and drain. Therefore, when positive voltage is applied to the first electrode 9 and negative voltage is applied to the second electrode 10, the FWD is turned on and excess carriers are injected into the p-n junction portion. At this time, gate voltage is not applied to the first or second gate electrode 8a, 8b and they are off. When the control illustrated in FIG. 2B is carried out in this state, the following operation is carried out:

At the initial stage of time T2 in FIG. 4, as illustrated in FIG. 2B, the second gate electrode 8b is kept off and positive voltage is applied to the first gate electrode 8a to turn on the first gate electrode 8a. As a result, electrons as minority carriers in the p-type base region 3 are attracted to the vicinity of the first gate electrode 8a and an inversion layer 12 is formed on the side surface of the trench 6 in a place corresponding to the first gate electrode 8a.

Figure 2C:
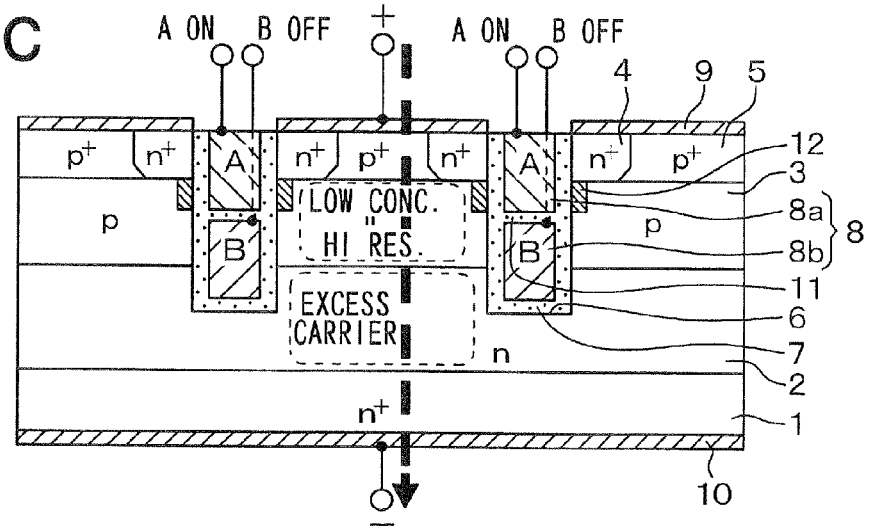
FIG. 2C is a diagram showing an explanatory drawing of the operation of the semiconductor device illustrated in FIG. 1.

In the latter half of time T2 in FIG. 4, the minority carriers in the p-type base region 3 have been reduced; and thus holes as majority carriers in the p-type base region 3 are also reduced as illustrated in FIG. 2C because of the charge neutral condition. Therefore, the resistance component of the p-type base region 3 becomes higher than before and the injection efficiency is reduced. As a result, Vf of the FWD is also increased and excess carrier injection is suppressed or the majority carriers in the inversion layer 12 are recombined with the majority carriers in the p-type base region 3.

Figure 3A:
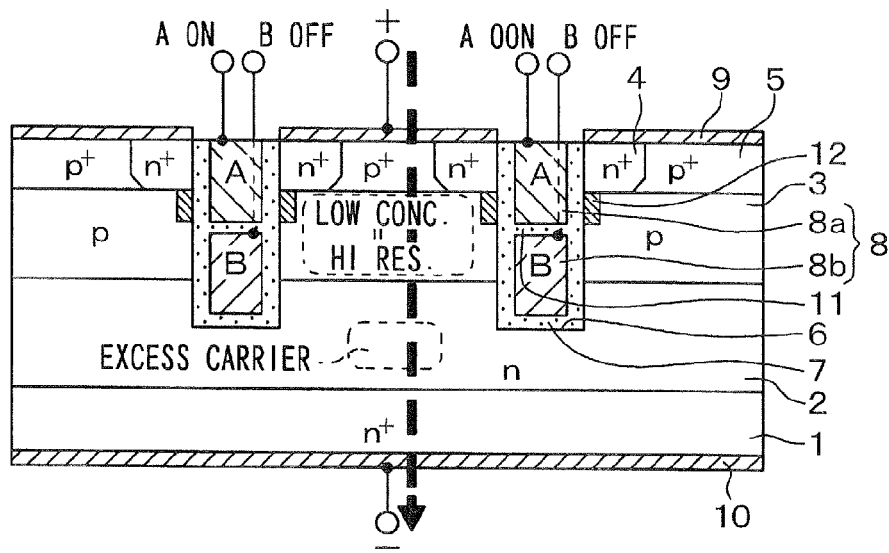
FIG. 3A is a diagram showing an explanatory drawing of the operation of the semiconductor device, following FIG. 2C.

Since excess carrier injection was suppressed, subsequently, the following takes place as illustrated in FIG. 3A: a large quantity of excess carriers originally injected into the n⁻-type drift layer 2 and remaining there cannot exist any more because of the life time and are annihilated. More specific description will be given. When ordinary diode operation is performed as conventional, a large quantity of the excess carriers in the n⁻-type drift layer 2 is injected and the excess carriers are not reduced. Excess carriers can be reduced by suppressing excess carrier injection.

Figure 3B:
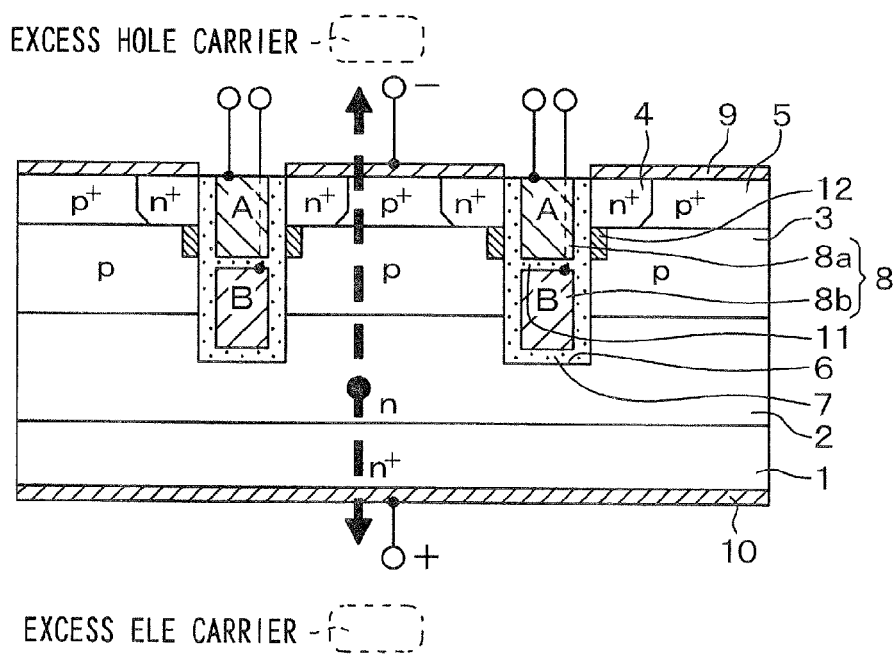
FIG. 3B a diagram showing an explanatory drawing of the operation of the semiconductor device, following FIG. 3A.

When the excess carriers in the n⁻-type drift layer 2 have been reduced as mentioned above, voltages applied to the first electrode 9 and the second electrode 10 are switched as illustrated in FIG. 3B. That is, inverse voltage application is carried out to apply negative voltage to the first electrode 9 and positive voltage to the second electrode 10. As a result, recovery operation is carried out during time T3 in FIG. 4 and reverse recovered charge Qrr is produced. Since the excess carriers in the n⁻-type drift layer 2 are small in quantity, however, the following can be implemented: it is possible to make the value of reverse recovered charge Qrr a sufficiently smaller value than in cases where only the first gate electrode 8a is turned on and excess carrier injection is not suppressed. When positive voltage is applied to both the first and second gate electrodes 8a, 8b to turn them on, the following can be implemented during time T4 in FIG. 4: an inversion layer is formed in the portion of the p-type base region 3 in contact with the trench 6 in the vicinity of the first and second gate electrodes 8a, 8b; and a current is passed between source and drain and the vertical MOSFET is turned on.

In this embodiment, as described up to this point, the gate electrode 8 is provided with a double gate structure and includes the first and second gate electrodes 8a, 8b different in depth. For this reason, the following can be implemented by turning on only the first gate electrode 8a of the first and second gate electrodes 8a, 8b: the inversion layer 12 is formed in the p-type base region 3 but the inversion layer 12 is prevented to be formed to the depth at which the n⁻-type drift layer 2 and the n⁺-type impurity region 4 are joined with each other. For this reason, the first gate electrode 8a can be caused to function as an excess carrier injection excess carrier injection suppression gate.

Specifically, when the time of keeping the FWD in diode operation is changed to the time of turning on the vertical MOSFET, control is carried out so as to turn on only the first gate electrode 8a. Thus the following can be implemented when the timing of keeping the FWD in diode operation is changed to the time of turning on the vertical MOSFET: the injection of excess carriers is suppressed to reduce the excess carriers existing in the n⁻-type drift layer 2 and recovery loss is reduced.

According to the semiconductor device with this structure, it is possible to apply positive voltage only to the first gate electrode 8a to form an inversion layer and reduce recovery loss without applying any voltage to the second gate electrode 8b. Therefore, even though gate voltage due to noise is applied to the second gate electrode 8b, the threshold value at which the vertical MOSFET is turned on is less prone to be exceeded. Therefore, a semiconductor device with such a structure that self turn-on due to noise is less prone to occur can be obtained.

The manufacturing method for the semiconductor device formed as mentioned above is basically substantially the same as in conventional cases where the gate electrode 8 is provided with a single layer structure. To manufacture the above semiconductor device, steps only have to be changed so as to form the double gate structure.

Specifically, after the formation of the trench 6, the gate insulating film 7 is formed by thermal oxidation or the like and then a film of doped Poly-Si is formed. The gate electrode 8 is thereby formed so that the trench 6 is filled. At this time, the doped Poly-Si is etched back to a level deeper than the upper part of the p-type base region 3. Thereafter, the insulating film 11 is formed by thermal oxidation or the like and then a film of doped Poly-Si is formed again to fill the trench 6. Then the doped Poly-Si is etched back so that it is left up to a position higher than the upper part of the p-type base region 3. The double gate structure can be configured as mentioned above.

Figure 5:
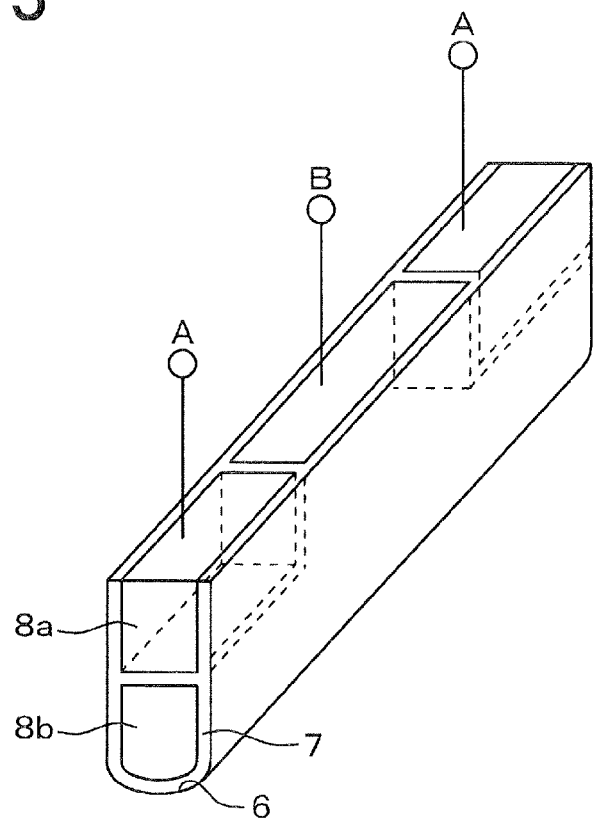
FIG. 5 is a diagram showing a schematic perspective view of the trench gate structure of the semiconductor device illustrated in FIG. 1.

In the double gate structure as in this embodiment, gate wirings are separately drawn from the first gate electrode 8a and the second gate electrode 8b. For this reason, the following measure can be taken as illustrated in, for example, the schematic perspective view of the trench gate structure in FIG. 5: the second gate electrode 8b is formed to the surface of the substrate at some midpoint (for example, the middle position) in the direction of the length of the trench 6; and a gate wiring is drawn in this position or a pad is formed in this position. To partly form the second gate electrode 8b up to the surface of the substrate, an etching mask only has to be placed there during etch back.

Second Embodiment

Description will be given to the second embodiment of the disclosure. The semiconductor device in this embodiment is obtained by modifying the configuration of the trench gate structure in the first embodiment. The other respects are the same as those in the first embodiment and description will be given only to a difference from the first embodiment.

Figure 6:
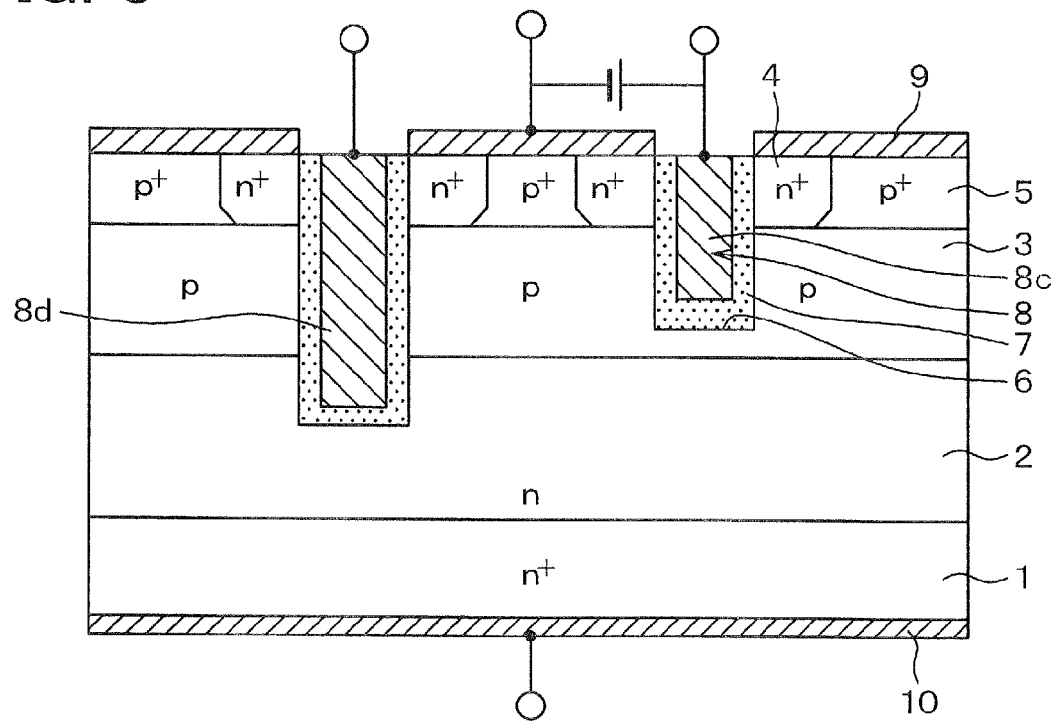
FIG. 6 is a diagram showing a cross sectional view of a semiconductor device in which a vertical MOSFET and FWD are formed in a second embodiment.

FIG. 6 is a sectional view of a semiconductor device with a vertical MOSFET and FWD formed therein in this embodiment. Description will be given to the semiconductor device in this embodiment with reference to this drawing.

In this embodiment, as illustrated in FIG. 6, the gate electrode 8 is comprised of first and second gate electrodes 8c, 8d different in depth in different positions obtained by changing the depths of trenches 6 within a cell. The first gate electrode 8c functions as an excess carrier injection suppression gate and shallower than the second gate electrode 8d and its depth does not reach the n⁻-type drift layer 2. The second gate electrode 8d functions as a MOSFET driving gate and its depth reaches the n⁻-type drift layer 2.

Even when the gate electrode 8 is comprised of the first and second gate electrodes 8c, 8d formed in different positions with their depths made different from each other, the same effect as in the first embodiment can be obtained by taking the following measure: the first gate electrode 8c is caused to operate like the first gate electrode 8a described in relation to the first embodiment; and further the second gate electrode 8d is caused to operate like the second gate electrode 8b described in relation to the first embodiment.

The semiconductor device with such a structure as in this embodiment is basically formed by the same technique as the manufacturing method for conventional semiconductor devices having a vertical MOSFET with a trench gate structure. However, since the trenches 6 in which the first gate electrode 8c and the second gate electrode 8d are placed are different in depth, different etching masks are used to from them. The other steps are the same as those in the manufacturing method for conventional semiconductor devices having a vertical MOSFET with a trench gate structure.

Third Embodiment

Description will be given to the third embodiment of the disclosure. The semiconductor device in this embodiment is also obtained by modifying the configuration of the trench gate structure in the first embodiment. The other respects are the same as those in the first embodiment and description will be given only to a difference from the first embodiment.

Figure 7:
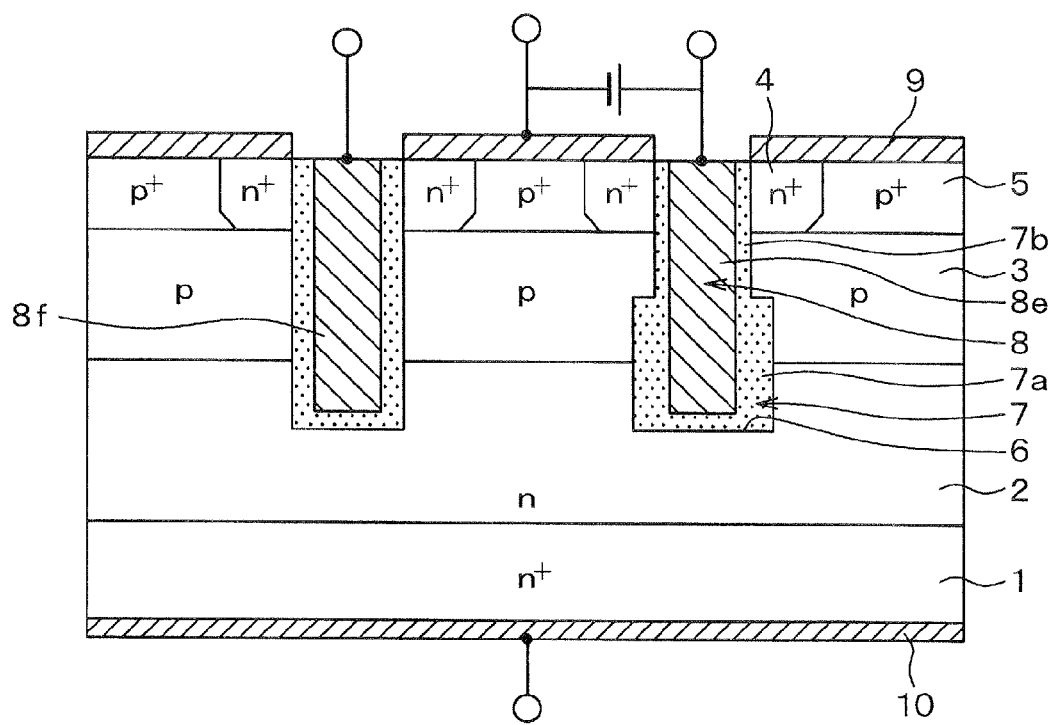
FIG. 7 is a diagram showing a cross sectional view of a semiconductor device in which a vertical MOSFET and FWD are formed in a third embodiment.

FIG. 7 is a sectional view of a semiconductor device with a vertical MOSFET and FWD formed therein in this embodiment. Description will be given to the semiconductor device in this embodiment with reference to this drawing.

In this embodiment, as illustrated in FIG. 7, the gate electrodes 8 are all identical in depth. However, a first gate electrode 8e that functions as an excess carrier injection suppression gate and a second gate electrode 8f that functions as a MOSFET driving gate are configured by modifying the configuration of the vicinity of a gate electrode 8.

Specifically, the thickness of the gate insulating film 7 formed around the first gate electrode 8e is changed and the following portion (first portion) 7a of the gate insulating film 7 is made thicker than the portion (second portion) 7b shallower than the first portion: a portion located below the upper part of the p-type base region 3 and above the n⁻-type drift layer 2 and deeper than an intermediate position a predetermined distance away from the upper part of the p-type base region 3. That is, the following is implemented by changing the thickness of the gate insulating film 7: the thicker portion 7a is made higher than the thinner portion 7b in threshold value at which the vertical MOSFET can be turned on by the formation of an inversion layer.

As a result, the following can be implemented when positive voltage is applied to the first gate electrode 8e: an inversion layer is formed in the thinner portion 7b of the gate insulating film 7 and an inversion layer is not formed in the thicker portion 7a. That is, it is possible to form only an inversion layer whose depth does not reach the n⁻-type drift layer 2 around the first gate electrode 8e. Therefore, even in the semiconductor device with such a structure as in this embodiment, the same effect as in the first embodiment can be obtained by taking the following measure: the first gate electrode 8e is caused to operate like the first gate electrode 8a described in relation to the first embodiment; and further the second gate electrode 8f is caused to operate like the second gate electrode 8b described in relation to the first embodiment.

Figure 8A:
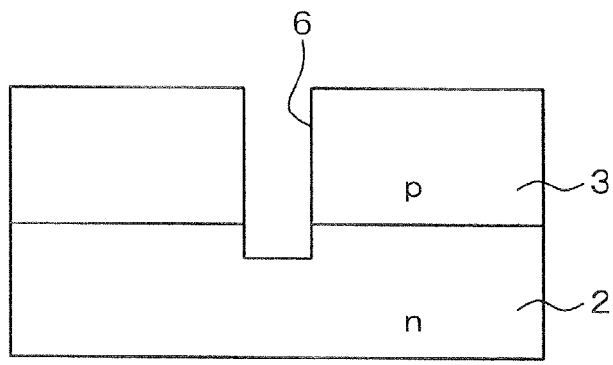
FIG. 8A is a diagram showing a cross sectional view illustrating the process of formation of the trench gate structure of the semiconductor device illustrated in FIG. 7.
Figure 8B:
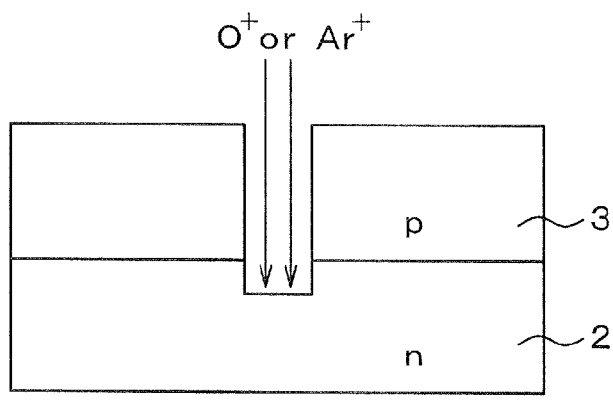
FIG. 8B is a diagram showing a cross sectional view illustrating the process of formation of the trench gate structure of the semiconductor device illustrated in FIG. 7.
Figure 8C:
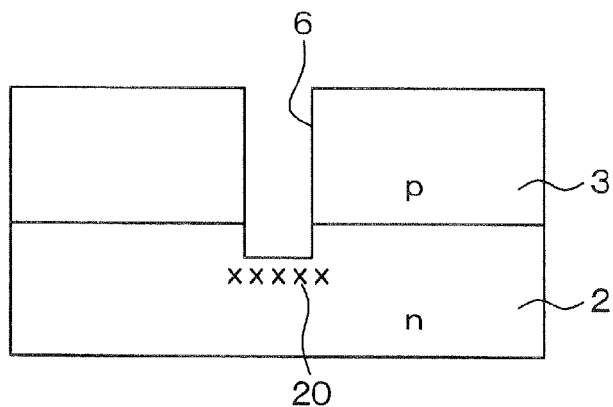
FIG. 8C is a diagram showing a cross sectional view illustrating the process of formation of the trench gate structure of the semiconductor device illustrated in FIG. 7.
Figure 8D:
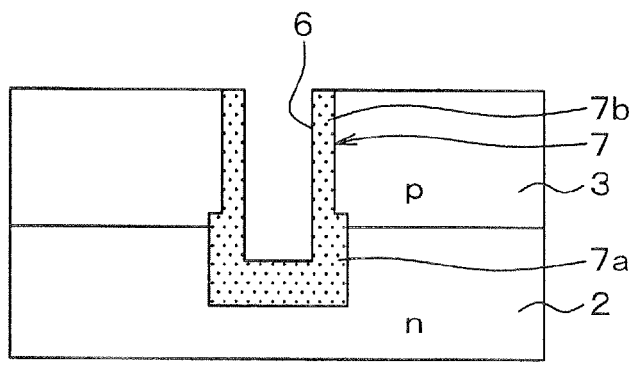
FIG. 8D is a diagram showing a cross sectional view illustrating the process of formation of the trench gate structure of the semiconductor device illustrated in FIG. 7.

The semiconductor device with such a structure as in this embodiment is also basically formed by the same technique as the manufacturing method for conventional semiconductor devices having a vertical MOSFET with a trench gate structure. However, a step of forming a damage layer at the bottom portion of the trench 6 where the first gate electrode 8e is to be formed is carried out before the formation of the gate insulating film 7. FIGS. 8A to 8D are sectional views illustrating this step. As illustrated in FIG. 8A, first, a mask, not shown, is placed over the surface of the p-type base region 3 and etching is carried out to form the trench 6. Subsequently, as illustrated in FIG. 8B, oxygen ions (O⁺) or argon ions (Ar⁺) are implanted in the bottom portion of the trench 6 where the first gate electrode 8e is to be formed. As a result, as illustrated in FIG. 8C, the damage layer 20 is formed in the bottom portion of the trench 6. Subsequently, as illustrated in FIG. 8D, the gate insulating film 7 is formed by thermal oxidation. Thus the oxidation rate becomes higher in the place with the damage layer 20 formed therein than the other places and the gate insulating film 7 is so formed that it is thicker in the portion 7a on the bottom side of the trench 6 than in the portion 7b located thereabove. Thereafter, the same steps as conventional are carried out and as a result, the semiconductor device in this embodiment can be manufactured.

FIGS. 8A to 8D illustrate a case where the trench 6 is formed before the n⁺-type impurity region 4 and the p⁺-type contact region 5 are formed in the surface part of the p-type base region 3. Instead, the trench 6 may be formed after these regions are formed. Ion implantation for the formation of the damage layer 20 need not be carried out after the formation of the trench 6 and may be carried out before the formation of the trench 6.

Fourth Embodiment

Description will be given to the fourth embodiment of the disclosure. The semiconductor device in this embodiment is also obtained by modifying the configuration of the trench gate structure in the first embodiment. The other respects are the same as those in the first embodiment and description will be given only to a difference from the first embodiment.

Figure 9:
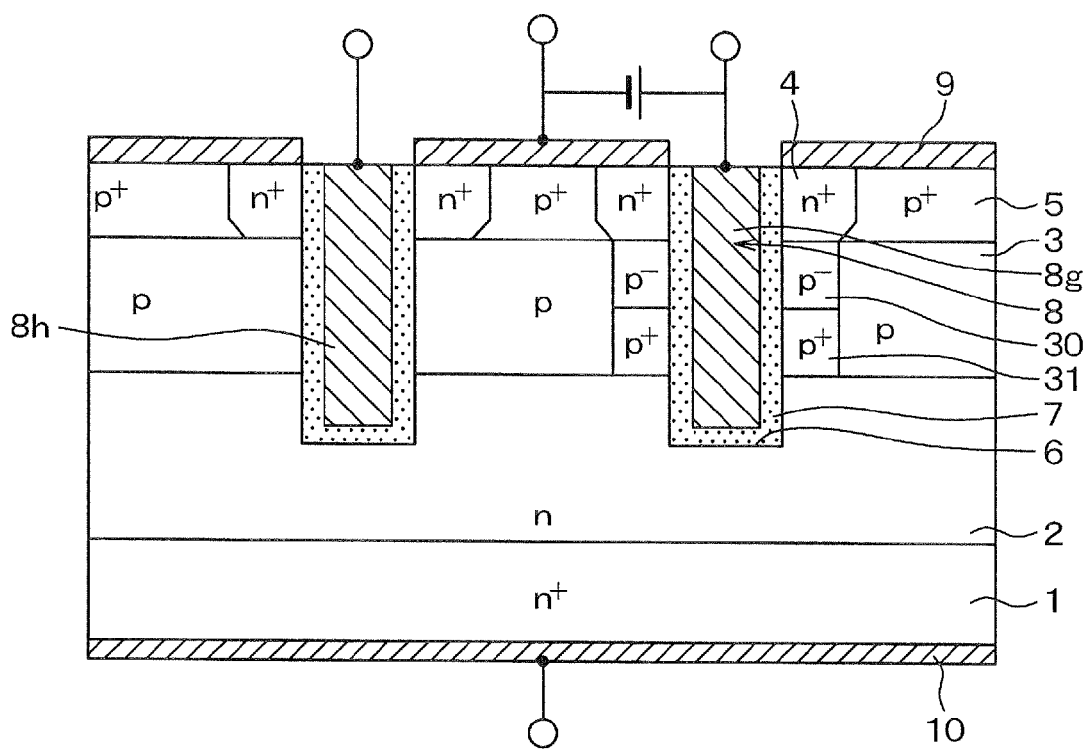
FIG. 9 is a diagram showing a cross sectional view of a semiconductor device in which a vertical MOSFET and FWD are formed in a fourth embodiment.

FIG. 9 is a sectional view of a semiconductor device with a vertical MOSFET and FWD formed therein in this embodiment. Description will be given to the semiconductor device in this embodiment with reference to this drawing.

Also in this embodiment, as illustrated in FIG. 9, the gate electrodes 8 are all identical in depth. However, a first gate electrode 8g that functions as an excess carrier injection suppression gate and a second gate electrode 8h that functions as a MOSFET driving gate are configured by modifying the configuration of the vicinity of a gate electrode 8.

Specifically, this embodiment is so structured that the following is implemented: a p⁻-type region (first region) 30 and a p⁺-type region (second region) 31 different in impurity concentration are provided around the first gate electrode 8g in positions where they are in contact with the side surface of the trench 6. The p⁻-type region 30 is formed in a portion located below the upper part of the p-type base region 3 and above the n⁻-type drift layer 2; and the p⁺-type region 31 is so formed that the following is implemented: it is extended from a position deeper than the p⁻-type region 30 and a predetermined distance away from the upper part of the p-type base region 3 to the depth where it reaches the n⁻-type drift layer 2. Since the p⁻-type region 30 and the pt-type region 31 different in impurity concentration are formed as mentioned above, the following is implemented: the threshold value at which an inversion layer is formed and the vertical MOSFET is turned on is higher in the p⁺-type region 31 than in the p⁻-type region 30.

As the result, the following can be implemented when positive voltage is applied to the first gate electrode 8g: an inversion layer is formed in the p⁻-type region 30 and an inversion layer is not formed in the p⁺-type region 31. Therefore, also in the semiconductor device with such a structure as in this embodiment, the same effect as in the first embodiment can be obtained by taking the following measure: the first gate electrode 8g is caused to operate like the first gate electrode 8a described in relation to the first embodiment; and further the second gate electrode 8h is caused to operate like the second gate electrode 8b described in relation to the first embodiment.

The semiconductor device with such a structure as in this embodiment is also basically formed by the same technique as the manufacturing method for conventional semiconductor devices having a vertical MOSFET with a trench gate structure. However, a step of forming the p⁻-type region 30 and the p⁺-type region 31 is carried out before the formation of the trench 6 where the first gate electrode 8e is to be formed. They can be formed by ion implantation and activation of p-type impurity using a mask in which the regions where the p⁻-type region 30 and the p⁺-type region 31 are to be formed are open.

The p⁻-type region 30 and the p⁺-type region 31 different in impurity concentration can be formed by taking the following measure: the dose amount and ion implantation energy of p-type impurity are made different between when the p⁻-type region 30 is formed and when the p⁺-type region 31 is formed.

The p⁻-type region 30 only has to be lower in impurity concentration than the p⁺-type region 30; therefore, the p-type base region 3 may be caused to directly functions as the p⁻-type region 30. That is, the following measure may be taken: only the p⁺-type region 31 is formed and the portion of the p-type base region 3 positioned along the side of the trench 6 located above the p⁺-type region 31 is used as the p⁻-type region 30. The method for forming the p⁻-type region 30 is not limited to the ion implantation of p-type impurity. Instead, the p⁻-type region 30 may be formed by ion-implanting n-type impurity and reducing the carrier concentration of part of the p-type base region 3.

Fifth Embodiment

Description will be given to the fifth embodiment of the disclosure. The semiconductor device in this embodiment is obtained by applying the same structure as in the first embodiment to a horizontal MOSFET with a trench gate structure. The other respects are the same as those in the first embodiment and description will be given only to a difference from the first embodiment.

Figure 10A:
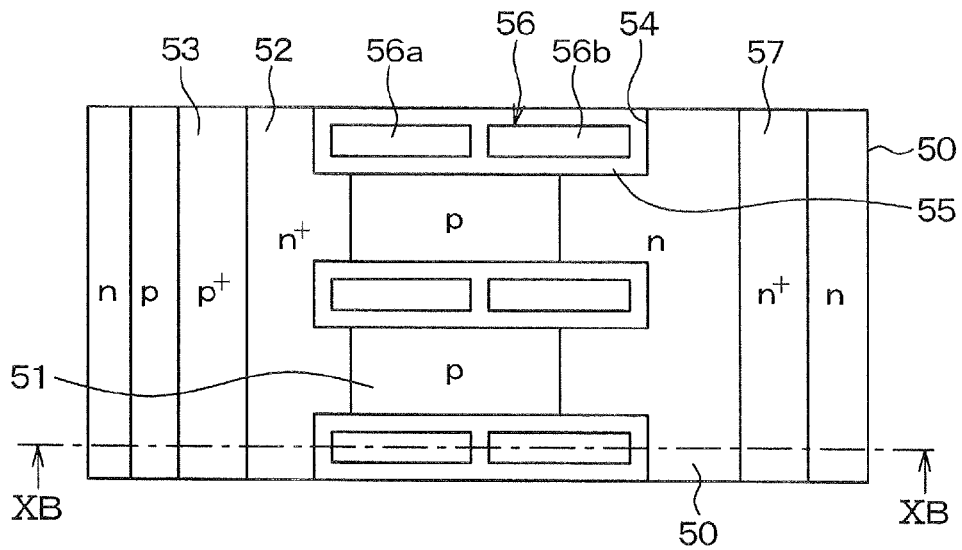
FIG. 10A is a diagram showing a layout chart illustrating a semiconductor device having a horizontal MOSFET with a trench gate structure and FWD in a fifth embodiment.
Figure 10B:
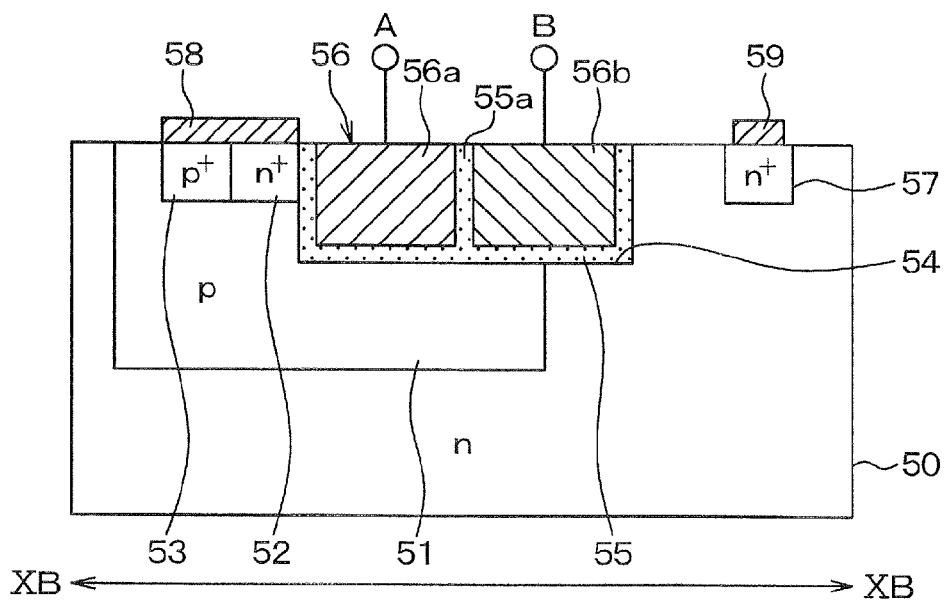
FIG. 10B is a diagram showing a cross sectional view taken along line XB-XB of FIG. 10A.

FIGS. 10A and 10B illustrate a semiconductor device having a horizontal MOSFET with a trench gate structure and FWD in this embodiment. FIG. 10A is a layout chart and FIG. 10B is a sectional view taken along line XB-XB of FIG. 10A. Description will be given to the semiconductor device in this embodiment with reference to these drawings.

As illustrated in FIGS. 10A and 10B, the semiconductor device in this embodiment is configured by forming various parts comprising the horizontal MOSFET with a trench gate structure and the FWD in predetermined regions in an n-type region 50 comprising an n-type drift layer. The n-type region 50 may be comprised of an n-type substrate or may be comprised of an n-type well region or the like formed in the semiconductor substrate.

A p-type base region 51 having a predetermined depth is formed in a predetermined region in the surface part of the n-type region 50. Further, a n⁺-type impurity region 52 equivalent to a source region and a p⁺-type contact region 53 shallower than the p-type base region 51 are formed in predetermined regions in the p-type base region 51. The p-type base region 51, n⁺-type impurity region 52, and p⁺-type contact region 53 are extended with an identical direction taken as the direction of length.

A trench 54 is formed in the surface parts of the n-type region 50 and the p-type base region 51 on the opposite side to the p⁻-type contact region 53 with the n⁺-type impurity region 52 in between. The trench 54 is so formed that it penetrates the p-type base region 51 and is extended from the n⁺-type impurity region 52 to the n-type region 50. A gate electrode 56 with a double gate structure, including a first gate electrode 56a and a second gate electrode 56b, is formed in the trench 54 through a gate insulating film 55. The first gate electrode 56a and the second gate electrode 56b are separated from each other by an insulating film 55a. The first gate electrode 56a functions as an excess carrier injection suppression gate. It is so formed that it extended from a place where it is opposed to the n⁺-type impurity region 52 with the gate insulating film 55 in between to a place where it is opposed to an intermediate position in the p-type base region 51. The second gate electrode 56b functions as a MOSFET driving gate. It is so formed that it is extended from a place where it is opposed to an intermediate position in the p-type base region 51 with the gate insulating film 55 in between to a place where it is opposed to the n-type region 50.

Further, a n⁺-type impurity region 57 equivalent to a drain region is formed in the surface part of the n-type region 50 away from the p-type base region 51, n⁺-type impurity region 52, and p⁺-type contact region 53. The n⁺-type impurity region 52 and the p⁺-type contact region 53 are electrically coupled to a first electrode 58 equivalent to a source electrode and the n⁺-type impurity region 57 is electrically coupled to a second electrode 59 equivalent to a drain electrode. Further, the first gate electrode 56a and the second gate electrode 56b are coupled to different gate wirings and voltages applied thereto can be independently controlled.

A semiconductor device with a horizontal MOSFET with a trench gate structure and FWD coupled in parallel is configured with this structure. In this semiconductor device, the horizontal MOSFET with a trench gate structure performs the following operation by applying positive voltage both to the first gate electrode 56a and to the second gate electrode 56b: a channel is formed in the p-type base region 51 located along the side of the gate electrode 56; and as a result, a current is passed between the first electrode 58 and the second electrode 59 in the direction parallel to the substrate (horizontal direction). In the semiconductor device with this structure, the direction of passage of current is different from the direction perpendicular to the substrate (vertical direction) in the first embodiment; however, the other basic operations are the same as in the first embodiment.

As described up to this point, the same structure as in the first embodiment can also be applied to a horizontal MOSFET with a trench gate structure. Even with this structure, the same effect as in the first embodiment can be obtained.

The semiconductor device with such a structure as in this embodiment is basically formed by the same technique as the manufacturing method for conventional semiconductor devices having a horizontal MOSFET with a trench gate structure. However, the method for forming the first gate electrode 56a, second gate electrode 56b, and insulating film 55a differs. For example, doped Poly-Si is patterned to simultaneously form the first and second gate electrodes 56a, 56b; and when they are thereafter covered with an interlayer insulating film from above, it is caused to also get into between the first and second gate electrodes 56a, 56b to from the insulating film 55a. Thus the horizontal MOSFET with a trench gate structure illustrated in FIGS. 10A and 10B can be manufactured.

Sixth Embodiment

Description will be given to the sixth embodiment of the disclosure. The semiconductor device in this embodiment is obtained by applying the same structure as in the second embodiment to such a horizontal MOSFET with a trench gate structure as described in relation to the fifth embodiment. The basic structure of the semiconductor device in this embodiment is the same as that in the fifth embodiment and description will be given only to a difference from the fifth embodiment.

Figure 11A:
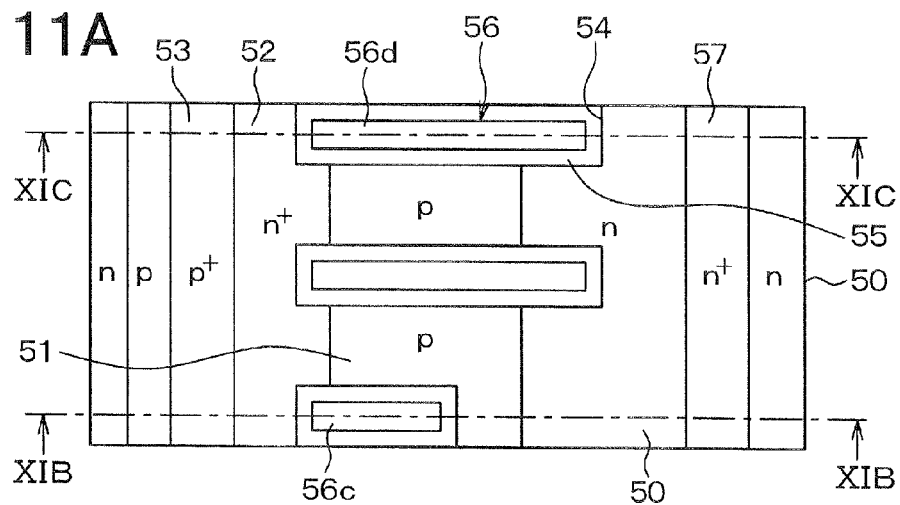
FIG. 11A is a diagram showing a layout chart illustrating a semiconductor device having a horizontal MOSFET with a trench gate structure and FWD in a sixth embodiment.
Figure 11B:
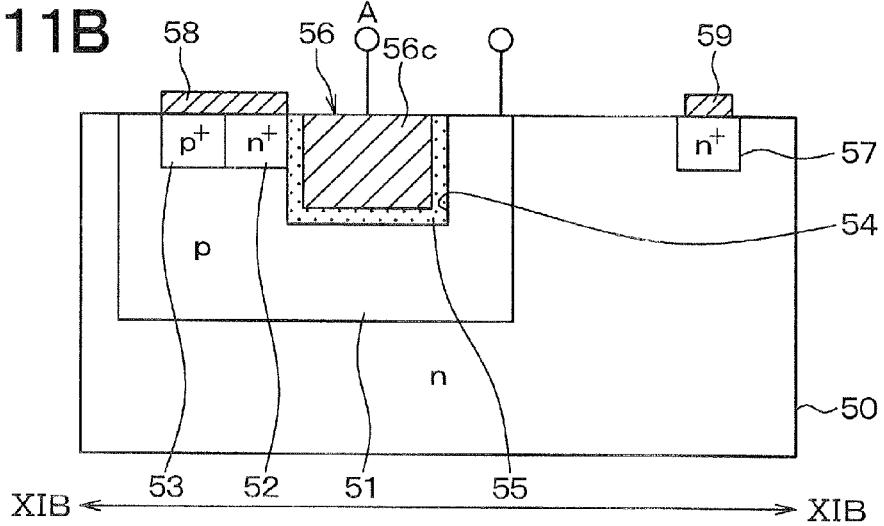
FIG. 11B is a diagram showing a cross sectional view taken along line XIB-XIB of FIG. 11A.
Figure 11C:
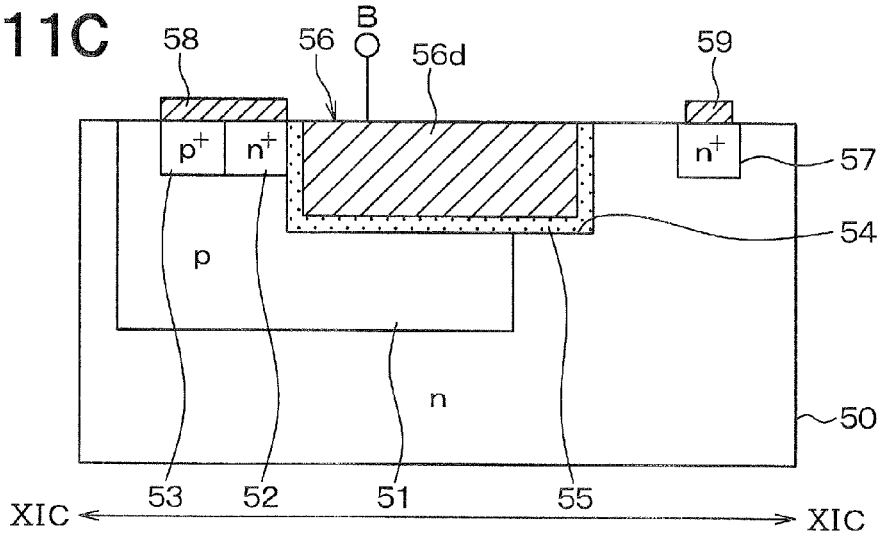
FIG. 11C is a diagram showing a cross sectional view taken along line XIC-XIC of FIG. 11A.

FIGS. 11A to 11C illustrate a semiconductor device having a horizontal MOSFET with a trench gate structure and FWD in this embodiment. FIG. 11A is a layout chart, FIG. 11B is a sectional view taken along line XIB-XIB of FIG. 11A, and FIG. 11C is a sectional view taken along line XIC-XIC of FIG. 11A. Description will be given to the semiconductor device in this embodiment with reference to these drawings.

In the semiconductor device in this embodiment, as illustrated in FIGS. 11A to 11C, gate electrodes 56 are comprised of first and second gate electrodes 56c, 56d whose length is changed in different positions by changing the length of a trench 54 within a cell. The first gate electrode 56c functions as an excess carrier injection suppression gate and is shorter in length than the second gate electrode 56d. It is extended from the n+-type impurity region 52 toward the n+-type impurity region 57. However, its length is such that: it does not reach the n-type region 50; and it is extended from a place where it is opposed to the n+-type impurity region 52 with the gate insulating film 55 in between and is terminated in a place where it is opposed to an intermediate position in the p-type base region 51. The second gate electrode 56d functions as a MOSFET driving gate. Its length is such that it is extended from a place where it is opposed to the n+-type impurity region 52 with the gate insulating film 55 in between to a place where it is opposed to the n-type region 50.

Also when the gate electrodes 56 are comprised of the first and second gate electrodes 56c, 56d formed in different positions with their length made different from each other, the same effect as in the fifth embodiment can be obtained by taking the following measure: the first gate electrode 56c is caused to operate like the first gate electrode 56a described in relation to the fifth embodiment; and further the second gate electrode 56d is caused to operate like the second gate electrode 56b described in relation to the fifth embodiment.

The semiconductor device with such a structure as in this embodiment is basically formed by the same technique as the manufacturing method for conventional semiconductor devices having a horizontal MOSFET with a trench gate structure. However, the lengths of the trenches 54 in which the first gate electrode 56c and the second gate electrode 56d are placed are made different from each other through mask pattern designing. The other steps are the same as those in the manufacturing method for conventional semiconductor devices having a horizontal MOSFET with a trench gate structure.

Seventh Embodiment

Description will be given to the seventh embodiment of the disclosure. The semiconductor device in this embodiment is obtained by applying the same structure in the first embodiment to a vertical IGBT, not to a vertical MOSFET. The basic structure of the semiconductor device in this embodiment is the same as that in the first embodiment and description will be given only to a difference from the first embodiment.

Figure 12:
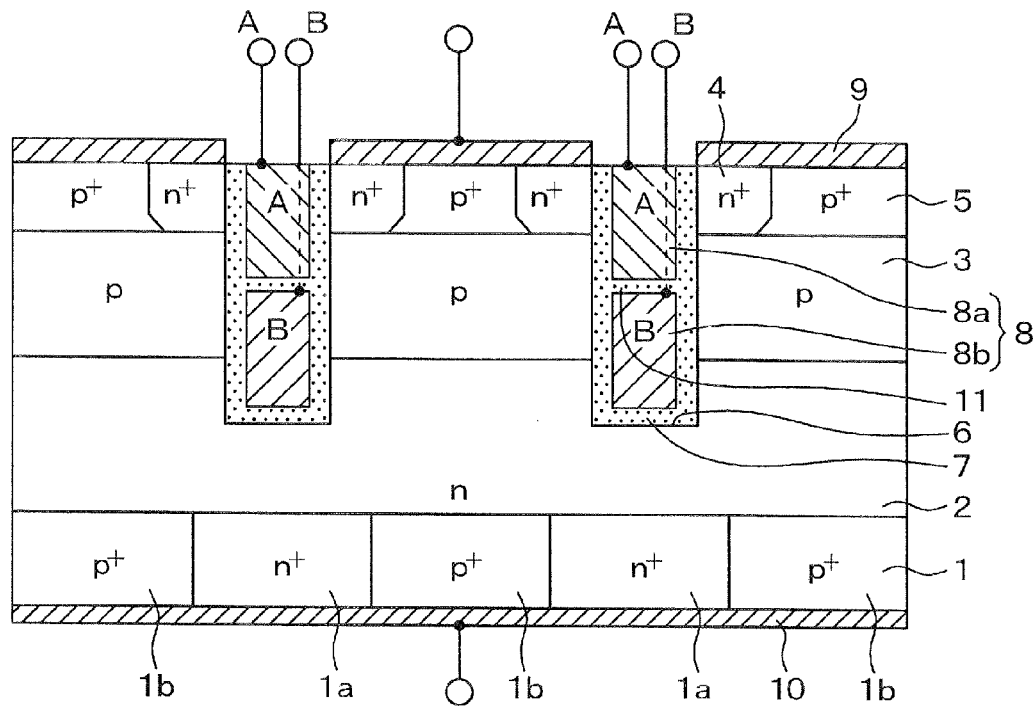
FIG. 12 is a diagram showing a cross sectional view of a vertical IGBT with a trench gate structure and FWD in a seventh embodiment.

FIG. 12 is a sectional view of a vertical IGBT with a trench gate structure and FWD in this embodiment. In this embodiment, as illustrated in this drawing, the semiconductor substrate 1 is so structured that a n+-type impurity region 1a and a p+-type impurity region 1b are alternately formed, for example, in a stripe pattern. The n+-type impurity regions 1a and the p+-type impurity regions 1b can be formed by a technique in which the semiconductor substrate 1 is formed of n+-type and the p+-type impurity regions 1b are formed by ion implantation or the like. Or, they can be formed by a technique in which the semiconductor substrate 1 is formed of p+-type and the n+-type impurity regions 1a are formed by ion implantation or the like.

With this structure, the following can be implemented: the FWD is formed of a p-n junction of the n+-type impurity region 1a and n−-type drift layer 2 and the p-type base region 3 and p+-type contact region 5; and the vertical IGBT is formed of the p+-type impurity region 1b, n−-type drift layer 2, p-type base region 3, and n+-type impurity region 4 and a trench gate structure.

With the structure in which the vertical IGBT with a trench gate structure and the FWD are coupled in parallel, the following can be implemented as in the first embodiment: the gate electrode 8 is provided with a double gate structure and includes the first and second gate electrodes 8a, 8b; and the first gate electrode 8a is caused to function as an excess carrier injection suppression gate and an IGBT driving gate and the second gate electrode 8b is caused to function as an IGBT driving gate together with the first gate electrode 8a. As a result, the same effect as in the first embodiment can be obtained.

Eighth Embodiment

Description will be given to the eighth embodiment of the disclosure. The semiconductor device in this embodiment is obtained by applying the same structure as in the second embodiment to a vertical IGBT, not to a vertical MOSFET. The basic structure of the semiconductor device in this embodiment is the same as that in the second embodiment and description will be given only to a difference from the second embodiment.

Figure 13:
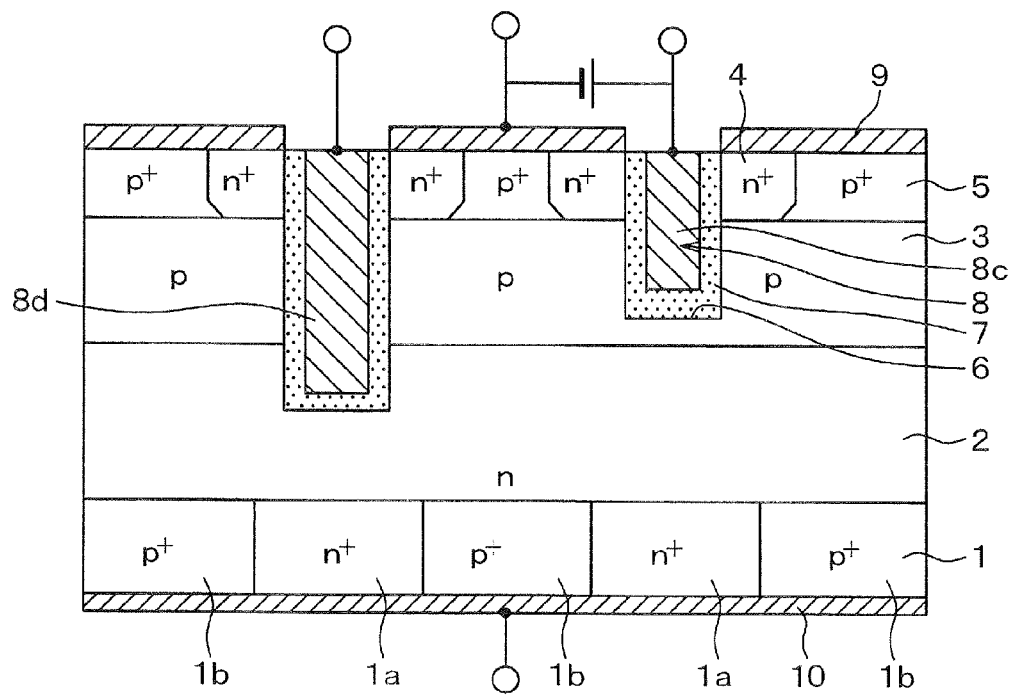
FIG. 13 is a diagram showing a cross sectional view of a vertical IGBT with a trench gate structure and FWD in an eighth embodiment.

FIG. 13 is a sectional view of a vertical IGBT with a trench gate structure and FWD in this embodiment. Also in this embodiment, as illustrated in this drawing, the semiconductor substrate 1 is so structured that a n+-type impurity region 1a and a p+-type impurity region 1b are alternately formed, for example, in a stripe pattern as in the seventh embodiment.

With this structure, the following can be implemented: the FWD is formed of a p-n junction of the n+-type impurity region 1a and n−-type drift layer 2 and the p-type base region 3 and p+-type contact region 5; and the vertical IGBT is formed of the p+-type impurity region 1b, n−-type drift layer 2, p-type base region 3, and n+-type impurity region 4 and a trench gate structure.

With this structure in which the vertical IGBT with a trench gate structure and the FWD are coupled in parallel, the following can be implemented as in the second embodiment: the gate electrode 8 is provided with such a structure that it includes first and second gate electrodes 8c, 8d formed in different places with their depths made different from each other; the first gate electrode 8c is caused to functions as an excess carrier injection suppression gate and the second gate electrode 8d is caused to function as a MOSFET driving gate. As a result, the same effect as in the second embodiment can be obtained.

Ninth Embodiment

Description will be given to the ninth embodiment of the disclosure. The semiconductor device in this embodiment is obtained by applying the same structure as in the fifth embodiment to a horizontal IGBT, not to a horizontal MOSFET. The basic structure of the semiconductor device in this embodiment is the same as that in the first embodiment and description will be given only to a difference from the first embodiment.

Figure 14A:
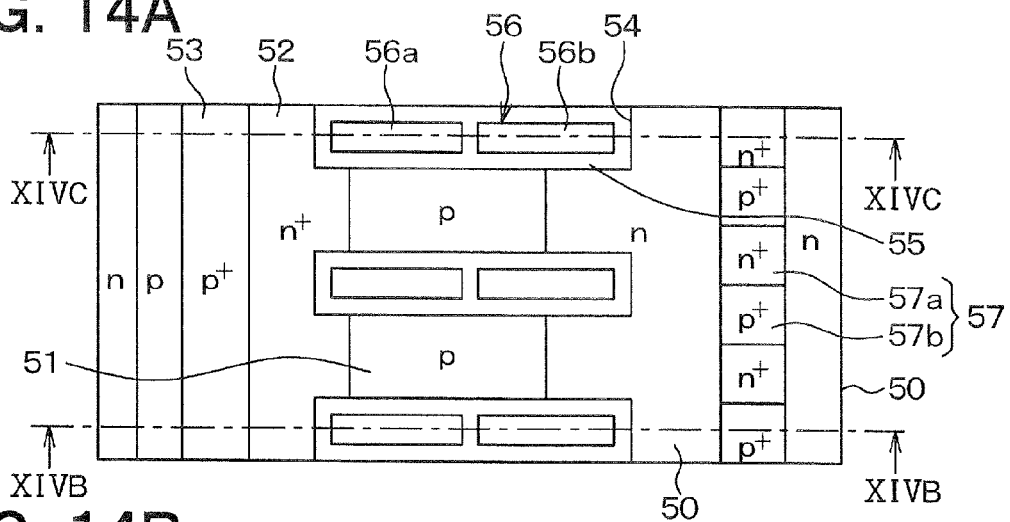
FIG. 14A is a diagram showing a layout chart illustrating a semiconductor device having a horizontal IGBT with a trench gate structure and FWD in a ninth embodiment.
Figure 14B:
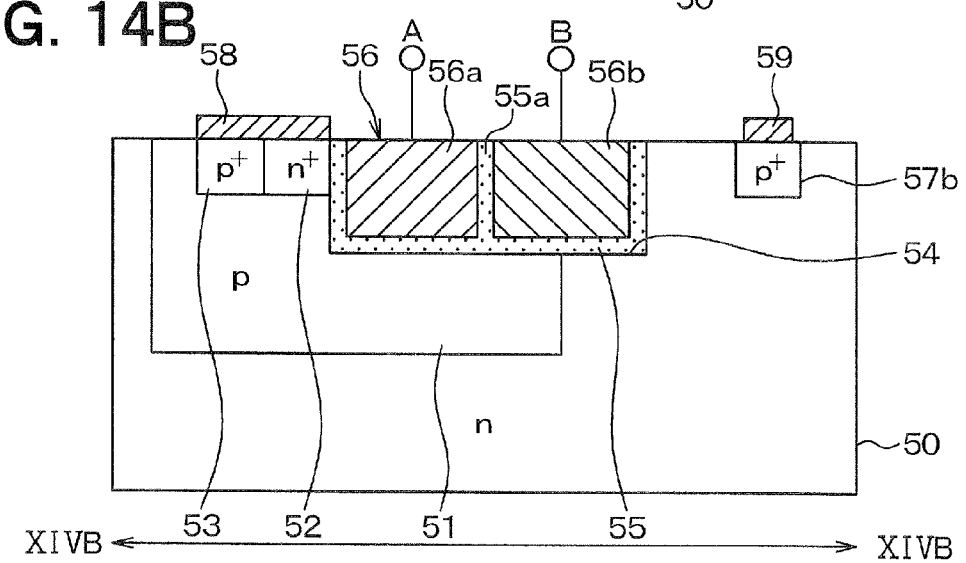
FIG. 14B is a diagram showing a cross sectional view taken along line XIVB-XIVB of FIG. 14A.
Figure 14C:
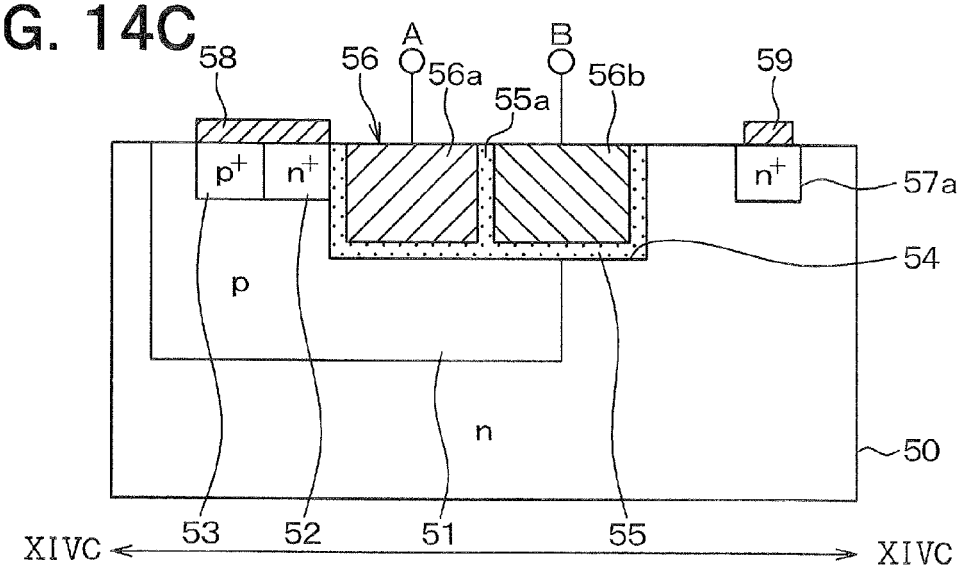
FIG. 14C is a diagram showing a cross sectional view taken along line XIVC-XIVC of FIG. 14A.

FIGS. 14A to 14C illustrate a semiconductor device having a horizontal IGBT with a trench gate structure and FWD in this embodiment. FIG. 14A is a layout chart, FIG. 14B is a sectional view taken along line XIVB-XIVB of FIG. 14A, and FIG. 14C is a sectional view taken along line XIVC- XIVC of FIG. 14A. Description will be given to the semiconductor device in this embodiment with reference to these drawings.

As illustrated in FIGS. 14A to 14C, the semiconductor device in this embodiment is so structured that the following is implemented: the impurity region 57 is extended in the same direction as that of the n$^+$-type impurity region 52 and a n$^+$-type first impurity region 57a and p$^+$-type second impurity region 57b are alternately formed.

With this structure, the following can be implemented: the FWD is formed of a p-n junction of the n$^+$-type first impurity region 57a and n-type region 50 and the p-type base region 51 and p$^+$-type contact region 53; and the horizontal IGBT is formed of the p$^+$-type second impurity region 57b, n-type region 50, p-type base region 51, and n$^+$-type impurity region 52 and a trench gate structure.

With this structure in which the horizontal IGBT with a trench gate structure and the FWD are coupled in parallel, the following can be implemented as in the fifth embodiment: the gate electrode 56 is provided with a double gate structure and includes first and second gate electrodes 56a, 56b; and the first gate electrode 56a is caused to function as an excess carrier injection suppression gate and an IGBT driving gate and the second gate electrode 56b is caused to function as a MOSFET driving gate together with the first gate electrode 56a. As a result, the same effect as in the fifth embodiment can be obtained.

10th Embodiment

Description will be given to the 10th embodiment of the disclosure. The semiconductor device in this embodiment is obtained by applying the same structure as in the sixth embodiment to such a horizontal IGBT with a trench gate structure as described in relation to the ninth embodiment. The basic structure of the semiconductor device in this embodiment is the same as that in the ninth embodiment and description will be given only to a difference from the ninth embodiment.

Figure 15A:
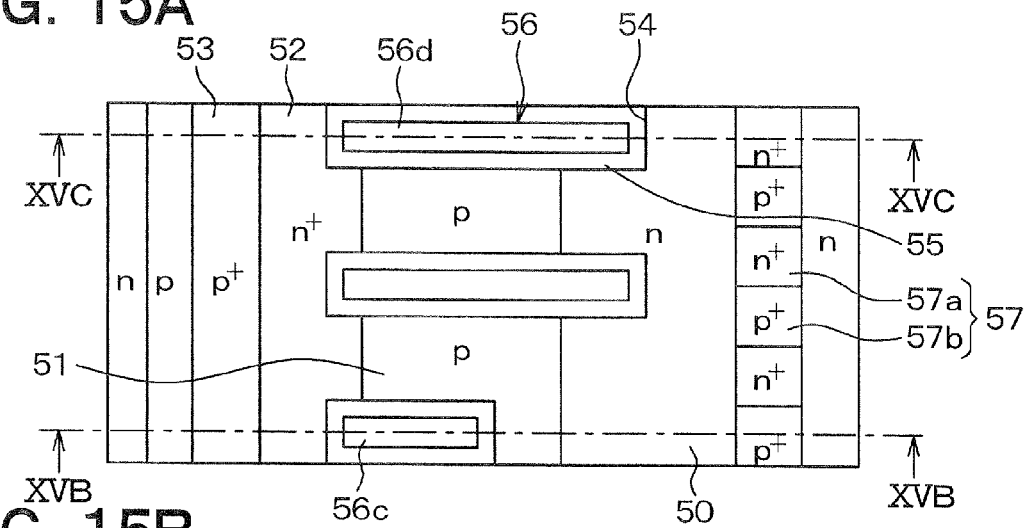
FIG. 15A is a diagram showing a layout chart illustrating a semiconductor device having a horizontal IGBT with a trench gate structure and FWD in a 10th embodiment.
Figure 15B:
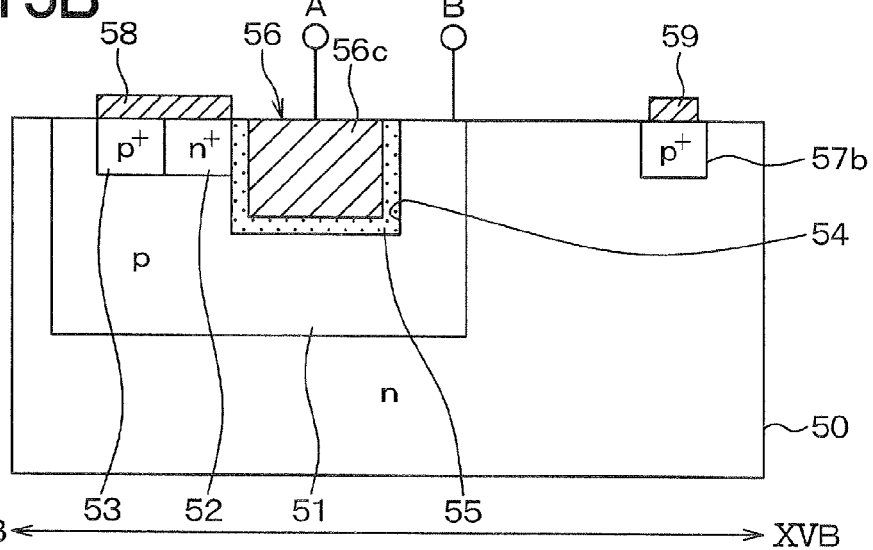
FIG. 15B is a diagram showing a cross sectional view taken along line XVB-XVB of FIG. 15A.
Figure 15C:
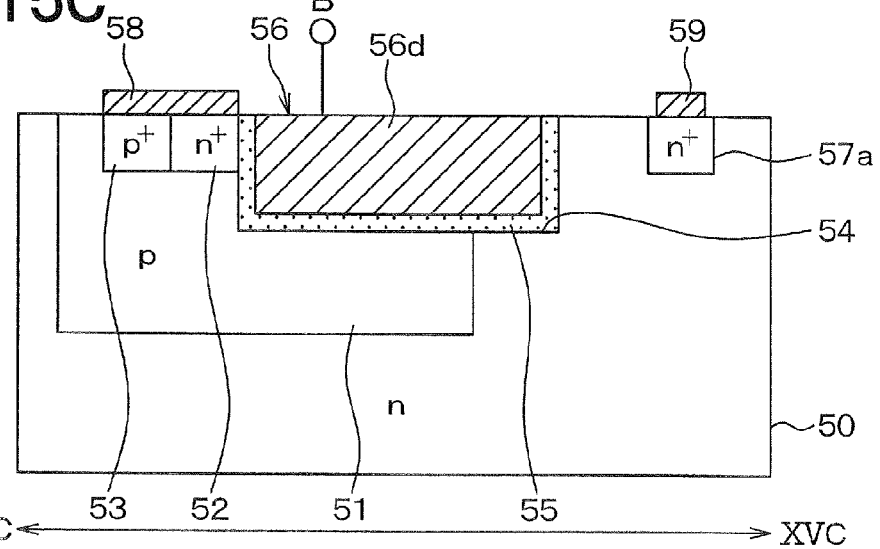
FIG. 15C is a diagram showing a cross sectional view taken along line XVC-XVC of FIG. 15A.

FIGS. 15A to 15C illustrate a semiconductor device having a horizontal IGBT with a trench gate structure and FWD in this embodiment. FIG. 15A is a layout chart, FIG. 15B is a sectional view taken along line XVB-XVB of FIG. 15A, and FIG. 15C is a sectional view taken along line XVC-XVC of FIG. 15A. Description will be given to the semiconductor device in this embodiment with reference to these drawings.

Also in the semiconductor device in this embodiment, as illustrated in FIGS. 15A to 15C, the following measure is taken: the impurity region 57 is extended in the same direction as that of the n$^+$-type impurity region 52; and the impurity region 57 is so structured that a n$^+$-type first impurity region 57a and a p$^+$-type second impurity region 57b are alternately formed. In addition, the gate electrode 56 is comprised of first and second gate electrodes 56c, 56d whose lengths are changed in different positions by changing the lengths of trenches 54 within a cell. With this structure in which the horizontal IGBT with a trench gate structure and the FWD are coupled in parallel, the following can be implemented as in the sixth embodiment: the first gate electrode 56c is caused to function as an excess carrier injection suppression gate and the second gate electrode 56d is caused to function as an IGBT driving gate.

As mentioned above, a mode in which the gate electrode 56 is comprised of the first and second gate electrodes 56c, 56d formed in different positions with their lengths made different from each other can be applied to a horizontal IGBT with a trench gate structure. As a result, the same effect as in the sixth embodiment can be obtained.

11th Embodiment

Description will be given to the 11th embodiment of the disclosure. The semiconductor device in this embodiment is obtained by applying the same structure as in the first embodiment to a planar vertical MOSFET. The other respects are the same as those in the first embodiment and description will be given only to a difference from the first embodiment.

Figure 16:
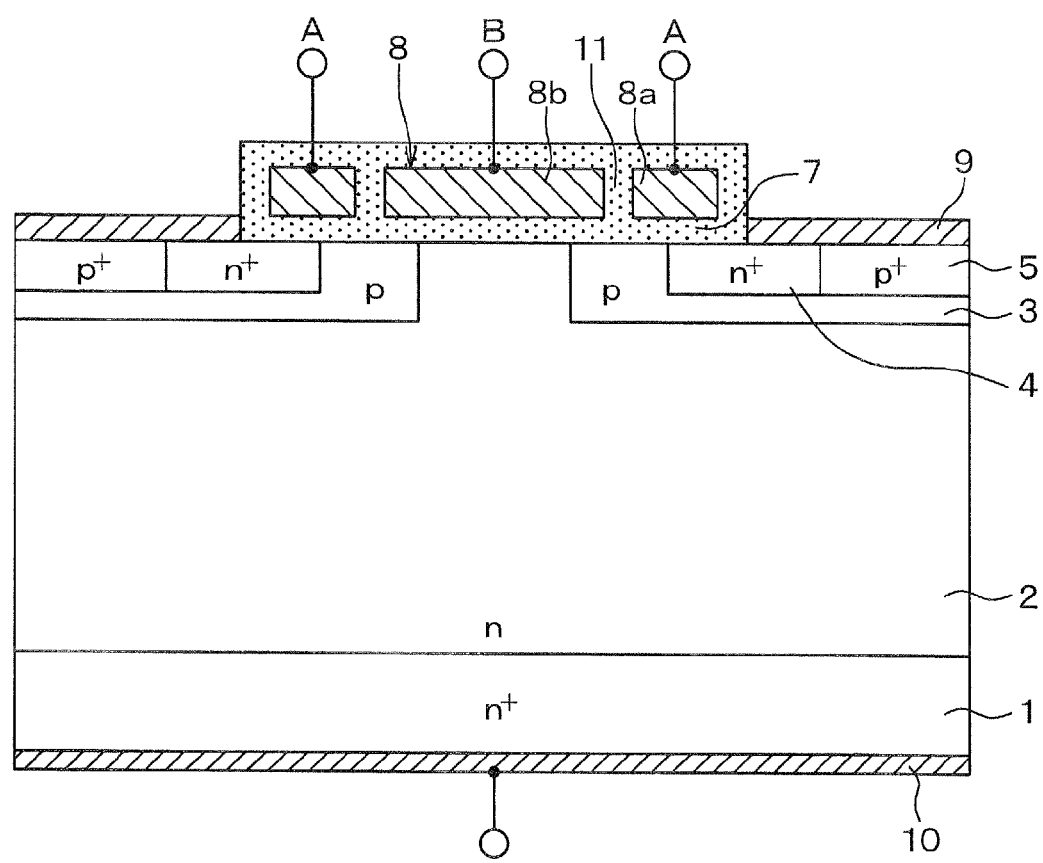
FIG. 16 is a diagram showing a cross sectional view of a semiconductor device having a planar vertical MOSFET and FWD in an 11th embodiment.

FIG. 16 is a sectional view of a semiconductor device having a planar vertical MOSFET and FWD in this embodiment. Description will be given to the semiconductor device in this embodiment with reference to this drawing.

As illustrated in FIG. 16, the n$^-$-type drift layer 2 is formed over the n$^+$-type semiconductor substrate 1 and the p-type base region 3 is formed in a predetermined region in the surface part of the n$^-$-type drift layer 2; and further, the n$^+$-type impurity region 4 comprising a source region and a p$^+$-type contact region 5 are formed. The p-type base region 3, n$^+$-type impurity region 4, and p$^+$-type contact region 5 are extended with the direction perpendicular to the plane of the drawing taken as the direction of length. Adjacent p-type base regions 3, n$^+$-type impurity regions 4, and p$^+$-type contact regions 5 are arranged at a predetermined distance in between and the surface of the n$^-$-type drift layer 2 is partly exposed therebetween. The surficial portion of the portion of the p-type base region 3 located between the n$^+$-type impurity region 4 and the n$^-$-type drift layer 2 whose surface is exposed is taken as a channel region. A gate electrode 8 is formed over this channel region and the exposed surface of the n$^-$-type drift layer 2 with a gate insulating film 7 in between.

The electrode 8 is extended in the direction of channel width (the direction of the length of the p-type base region 3 and the like) and it is divided in the direction of channel length and the first and second gate electrodes 8a, 8b are thereby formed. They are insulated and separated from each other by the insulating film 11 placed therebetween. The first gate electrode 8a functions as an excess carrier injection suppression gate and a MOSFET driving gate. It is so formed that it is extended from a place where it is opposed to the n$^+$-type impurity region 4 with the gate insulating film 7 in between to a place where it is opposed to an intermediate position in the p-type base region 3. The second gate electrode 8b functions as a MOSFET driving gate. It is so formed that it is extended from a place where it is opposed to an intermediate position in the p-type base region 3 with the gate insulating film 7 in between to a place where it is opposed to the n$^-$-type drift layer 2.

The semiconductor device in this embodiment is configured by: in addition, providing the first electrode 9 equivalent to a source electrode electrically coupled to the n$^+$-type impurity region 4 and the p$^+$-type contact region 5; and forming the second electrode 10 equivalent to a drain electrode in the back surface of the semiconductor substrate 1.

With this structure, the semiconductor device in which the planar vertical MOSFET and the FWD are coupled in parallel is configured. In this semiconductor device, a channel is formed in the p-type base region 3 located below the gate electrode 8 by applying positive voltage both to the first gate electrode 8a and to the second gate electrode 8b. As a result, the planar vertical MOSFET performs the operation of passing a current between the first electrode 9 and the second electrode 10 in the direction parallel to the surface of the n$^-$-type drift layer 2. Thus this embodiment is different from the first embodiment in that the gate electrode 8 is formed in the surface of the substrate and the channel is formed in the surface of the substrate; however, the other basic operations are the same as those in the first embodiment.

As described up to this point, the same structure as in the first embodiment can also be applied to a planar vertical MOSFET. Even with this structure, the same effect as in the first embodiment can be obtained.

The semiconductor device with such a structure as in this embodiment is basically formed by the same technique as the manufacturing method for conventional semiconductor devices with a planar vertical MOSFET. However, this embodiment is different in the method for forming the first gate electrode 8a and second gate electrode 8b and the insulating film 11. The insulating film 11 is formed by taking, for example, the following procedure: doped Poly-Si is patterned to simultaneously form the first and second gate electrodes 8a, 8b and, when the first and second gate electrodes 8a, 8b are thereafter covered with an interlayer insulating film from above, it is caused to also get into therebetween. Thus the planar vertical MOSFET illustrated in FIG. 16 can be manufactured.

12th Embodiment

Description will be given to the 12th embodiment of the disclosure. The semiconductor device in this embodiment is obtained by applying the same structure as in the second embodiment to such a planar vertical MOSFET as described in relation to the 11th embodiment. The basic structure of the semiconductor device in this embodiment is the same as that in the 11th embodiment and description will be given only to a difference from the 11th embodiment.

Figure 17:
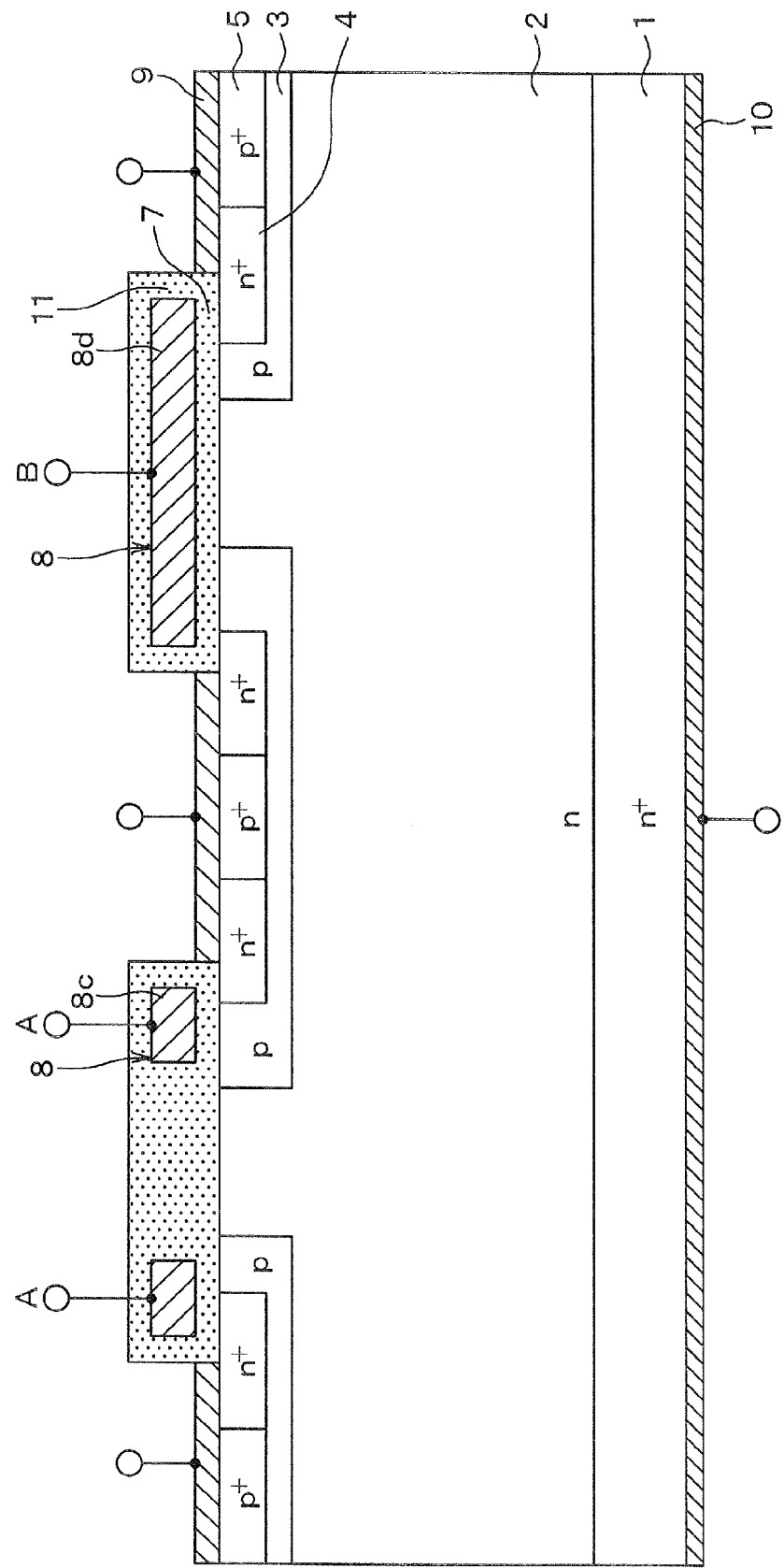
FIG. 17 is a diagram showing a drawing illustrating a semiconductor device having a planar vertical MOSFET and FWD in a 12th embodiment.

FIG. 17 illustrates a semiconductor device having a planar vertical MOSFET and FWD in this embodiment.

In the semiconductor device in this embodiment, as illustrated in FIG. 17, a cell caused to function as an excess carrier injection suppression gate and a cell caused to function as a MOSFET driving gate are provided in different positions. More specific description will be given. The cell caused to function as an excess carrier injection suppression gate is provided with the first gate electrode 8c as a gate electrode 8. The first gate electrode 8c is so formed that it is extended from a place where it is opposed to the n$^+$-type impurity region 4 with the gate insulating film 7 in between to a place where it is opposed to an intermediate position in the p-type base region 3. The cell caused to function as a MOSFET driving gate is provided with the second gate electrode 8d as a gate electrode 8. The second gate electrode 8d is extended from a place where it is opposed to the n$^+$-type impurity region 4 with the gate insulating film 7 in between to a place where it is opposed to the n$^-$-type drift layer 2 by way of the following place: a place where it is opposed to the p-type base region 3.

Even when the gate electrode 8 is comprised of the first and second gate electrodes 8c, 8d formed in different positions with their lengths made different from each other as mentioned above, the same effect as in the second embodiment can be obtained. This is done by taking the following measure: the first gate electrode 8c is caused to operate like the first gate electrode 8a described in relation to the second embodiment; and further the second gate electrode 8d is caused to operate like the second gate electrode 8b described in relation to the second embodiment.

The semiconductor device with such a structure as in this embodiment is basically formed by the same technique as the manufacturing method for the semiconductor devices having a planar vertical MOSFET with the structure described in relation to the 11th embodiment. The mask pattern used to form the gate electrode 8 only has to be changed.

13th Embodiment

Description will be given to the 13th embodiment of the disclosure. The semiconductor device in this embodiment is obtained by applying the same structure as in the first embodiment to a planar horizontal MOSFET. The basic structure of the planar horizontal MOSFET is the same as that of the horizontal MOSFET with a trench gate structure described in relation to the fifth embodiment and description will be given only to a difference from the fifth embodiment.

Figure 18A:
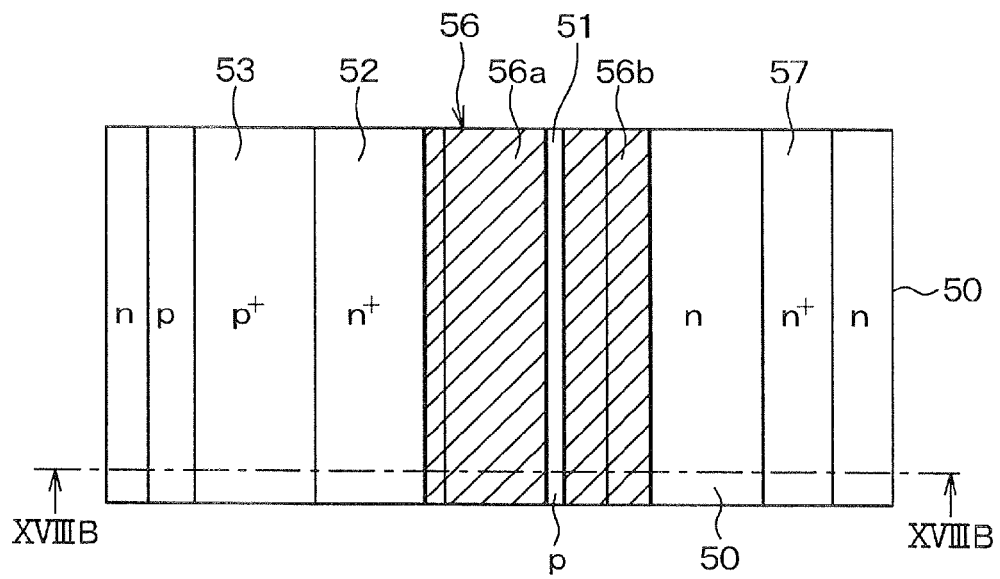
FIG. 18A is a diagram showing a layout chart illustrating a semiconductor device having a planar horizontal MOSFET and FWD in a 13th embodiment.
Figure 18B:
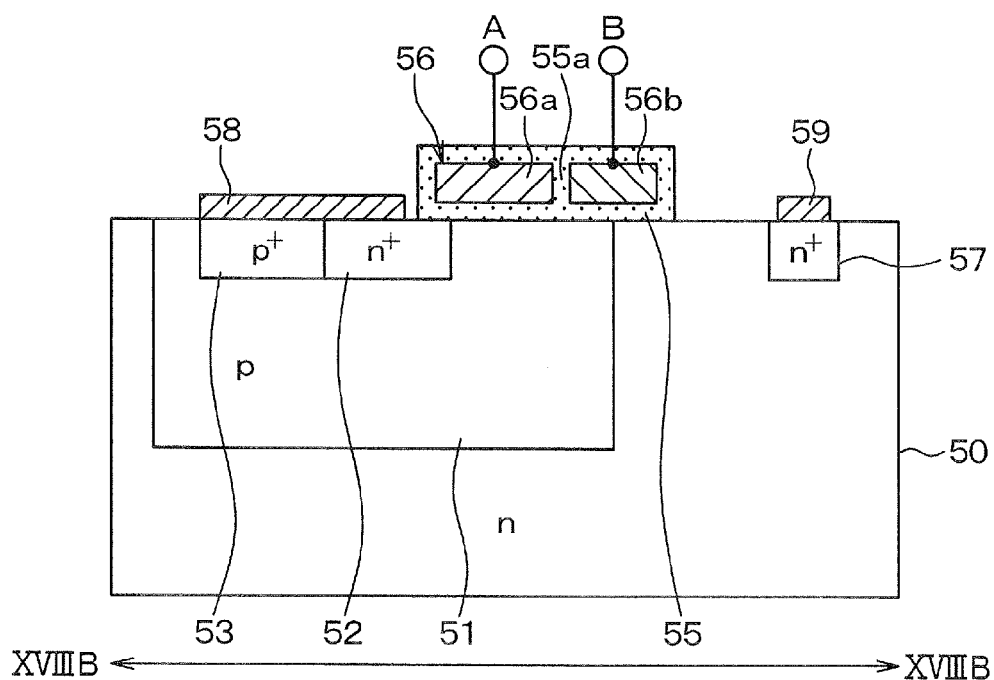
FIG. 18B is a diagram showing a cross sectional view taken along line XVIIIB-XVIIIB of FIG. 18A.

FIGS. 18A and 18B illustrate a semiconductor device having a planar horizontal MOSFET and FWD in this embodiment. FIG. 18A is a layout chart and FIG. 18B is a sectional view taken along line XVIIIB-XVIIIB of FIG. 18A. Though FIG. 18A is not a sectional view, it is partially hatched for facilitating visualization. Hereafter, description will be given to the semiconductor device in this embodiment with reference to these drawings.

As illustrated in FIGS. 18A and 18B, the p-type base region 51 is formed in a predetermined region in the surface part of the n-type region 50; and further the n$^+$-type impurity region 52 and the p$^+$-type contact region 53 are formed in predetermined regions in this p-type base region 51.

The gate electrode 56 is extended in the direction of channel width (the direction of the length of the p-type base region 51 and the like) and it is divided in the direction of channel length and the first and second gate electrodes 56a, 56b are thereby formed. They are insulated and separated from each other by the insulating film 55a placed therebetween. The first gate electrode 56a functions as an excess carrier injection suppression gate and a MOSFET driving gate. It is so formed that it is extended from a place where it is opposed to the n$^+$-type impurity region 52 with the gate insulating film 55 in between to a place where it is opposed to an intermediate position in the p-type base region 51. The second gate electrode 56b functions as a MOSFET driving gate. It is so formed that it is extended from a place where it is opposed to an intermediate position in the p-type base region 51 with the gate insulating film 55 in between to a place where it is opposed to the n-type region 50.

The semiconductor device in this embodiment is configured by, in addition, providing the following electrodes: the first electrode 58 electrically coupled to the n$^+$-type impurity region 52 and the p$^+$-type contact region 53; and the second electrode 59 electrically coupled to the n$^+$-type impurity region 57 formed away from the p-type base region 51, n$^+$-type impurity region 52, and p$^+$-type contact region 53.

With this structure, the semiconductor device in which the planar horizontal MOSFET and the FWD are coupled in parallel is configured. In this semiconductor device, a channel is formed in the p-type base region 51 located below the gate electrode 56 by applying positive voltage both to the first gate electrode 56a and to the second gate electrode 56b. As a result, the planar horizontal MOSFET performs the operation of passing a current between the first electrode 58 and the second electrode 59 in the direction parallel to the substrate (horizontal direction). The other basic operations are the same as in the first embodiment.

As described up to this point, the same structure as in the first embodiment can also be applied to a planar horizontal MOSFET. Even with this structure, the same effect as in the first embodiment can be obtained.

The semiconductor device with such a structure as in this embodiment is basically formed by the same technique as the manufacturing method for conventional semiconductor devices with a planar horizontal MOSFET. However, this embodiment is different in the method for forming the first gate electrode 56a and second gate electrode 56b and the insulating film 55a. The insulating film 55a is formed by taking, for example, the following procedure: doped Poly-Si is patterned to simultaneously form the first and second gate electrodes 56a, 56b and, when the first and second gate electrodes 56a, 56b are thereafter covered with an interlayer insulating film from above, it is caused to also get into therebetween. Thus the planar vertical MOSFET illustrated in FIGS. 18A and 18B can be manufactured.

14th Embodiment

Description will be given to the 14th embodiment of the disclosure. The semiconductor device in this embodiment is obtained by applying the same structure as in the second embodiment to such a planar horizontal MOSFET as described in relation to the 13th embodiment. The basic structure of the semiconductor device in this embodiment is the same as that in the 13th embodiment and description will be given only to a difference from the 13th embodiment.

Figure 19A:
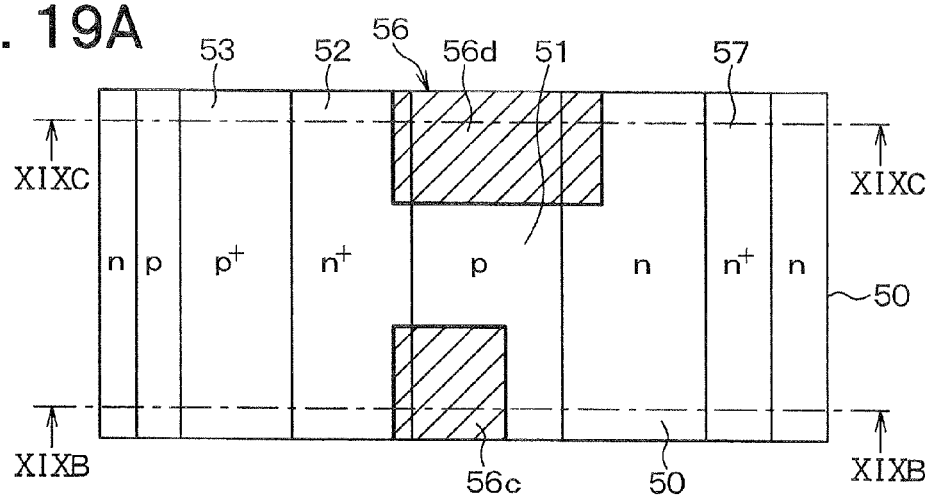
FIG. 19A is a diagram showing a layout chart illustrating a semiconductor device having a planar horizontal MOSFET and FWD in a 14th embodiment.
Figure 19B:
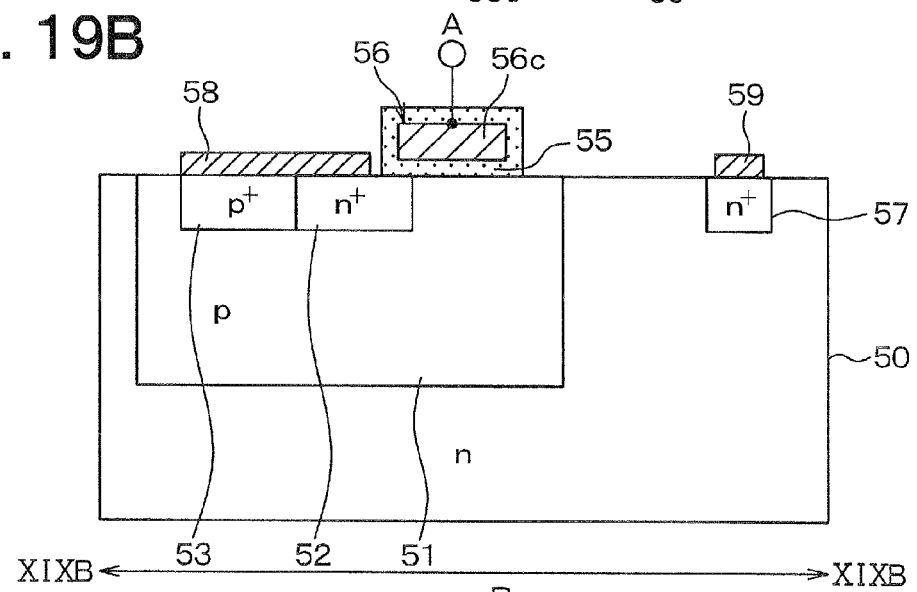
FIG. 19B is a diagram showing a cross sectional view taken along line XIXB-XIXB of FIG. 19A.
Figure 19C:
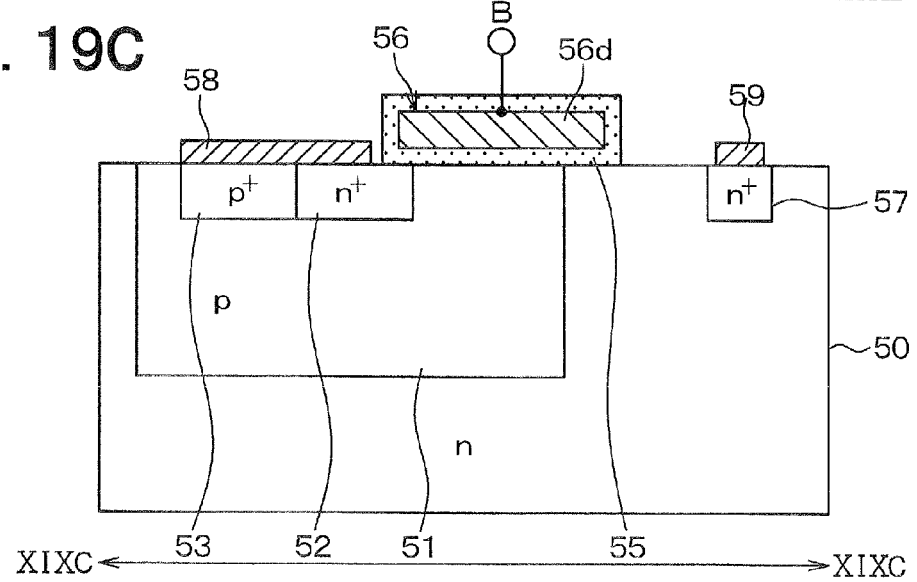
FIG. 19C is a diagram showing a cross sectional view taken along line XIXC-XIXC of FIG. 19A.

FIGS. 19A to 19C illustrate a semiconductor device having a planar horizontal MOSFET and FWD in this embodiment. FIG. 19A is a layout chart, FIG. 19B is a sectional view taken along line XIXB-XIXB of FIG. 19A, and FIG. 19C is a sectional view taken along line XIXC-XIXC of FIG. 19A.

In the semiconductor device in this embodiment, as illustrated in FIGS. 19A to 19C, a cell caused to function as an excess carrier injection suppression gate and a cell caused to function as a MOSFET driving gate are provided in different positions. More specific description will be given. The cell caused to function as an excess carrier injection suppression gate is provided with the first gate electrode 56c as a gate electrode 56. The first gate electrode 56c is so formed that it is extended from a place where it is opposed to the n$^+$-type impurity region 52 with the gate insulating film 55 in between to a place where it is opposed to an intermediate position in the p-type base region 51. The cell caused to function as a MOSFET driving gate is provided with the second gate electrode 56d as a gate electrode 56. The second gate electrode 56d is extended form a place where it is opposed to the n$^+$-type impurity region 52 with the gate insulating film 55 in between to a place where it is opposed to the n-type region 50 by way of the following place: a place where it is opposed to the p-type base region 51.

Even when the gate electrode 56 is comprised of the first and second gate electrodes 56c, 56d formed in different positions with their lengths made different from each other as mentioned above, the same effect as in the second embodiment can be obtained. This is done by taking the following measure: the first gate electrode 56c is caused to operate like the first gate electrode 56a described in relation to the second embodiment; and further the second gate electrode 56d is caused to operate like the second gate electrode 56b described in relation to the second embodiment.

The semiconductor device with such a structure as in this embodiment is basically formed by the same technique as the manufacturing method for semiconductor devices having a planar vertical MOSFET with the structure described in relation to the 13th embodiment. The mask pattern used to form the gate electrode 56 only has to be changed.

15th Embodiment

Description will be given to the 15th embodiment of the disclosure. The semiconductor device in this embodiment is obtained by forming the same double gate structure as in the first embodiment only in some of the gate electrodes 8. The other respects are the same as those in the first embodiment and description will be given only to a difference from the first embodiment.

Figure 20:
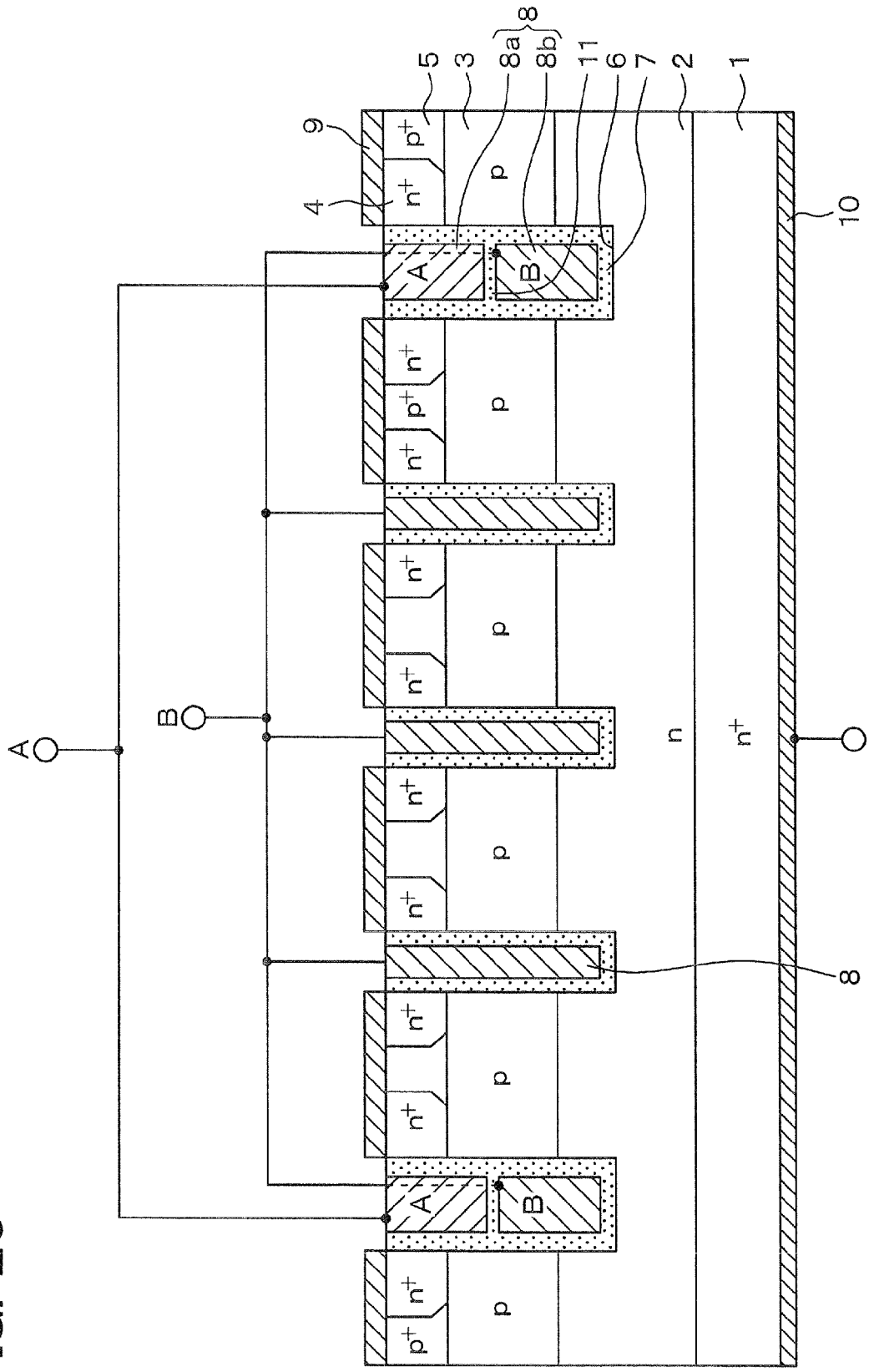
FIG. 20 is a diagram showing a cross sectional view of a semiconductor device having a vertical MOSFET with a trench gate structure and FWD in a 15th embodiment.

FIG. 20 is a sectional view of a semiconductor device having a vertical MOSFET with a trench gate structure and FWD in this embodiment. In this embodiment, as illustrated in this drawing, multiple trench gate structures extended in the direction perpendicular to the plane of the drawing are arranged in parallel. A certain proportion of them are taken as gate electrodes 8 with a double gate structure. In the example in FIG. 20, the gate electrodes are laid out so that the following is implemented: the ratio of the gate electrodes 8 with a double gate structure having a first gate electrode 8a and a second gate electrode 8b to the gate electrodes 8 with a single gate structure caused to function as a MOSFET driving gate is 3:1.

As mentioned above, all the gate electrodes 8 may be not provided with a double gate structure but only some of the gate electrodes 8 may be provided with a double gate structure. When this structure is adopted, the gate electrodes 8 with a single gate structure caused to function as a MOSFET driving gate can be made smaller in width than the gate electrodes 8 with a double gate structure. Therefore, integration can be accordingly facilitated. As a result, it is possible to miniaturize a semiconductor device or increase the amount of current that can be passed when a semiconductor device is configured in the same size.

16th Embodiment

Description will be given to the 16th embodiment of the disclosure. The semiconductor device in this embodiment is obtained by configuring the same double gate structure as in the first embodiment without the insulating film 11 in the gate electrodes 8. The other respects are the same as those in the first embodiment and description will be given only to a difference from the first embodiment.

Figure 21:
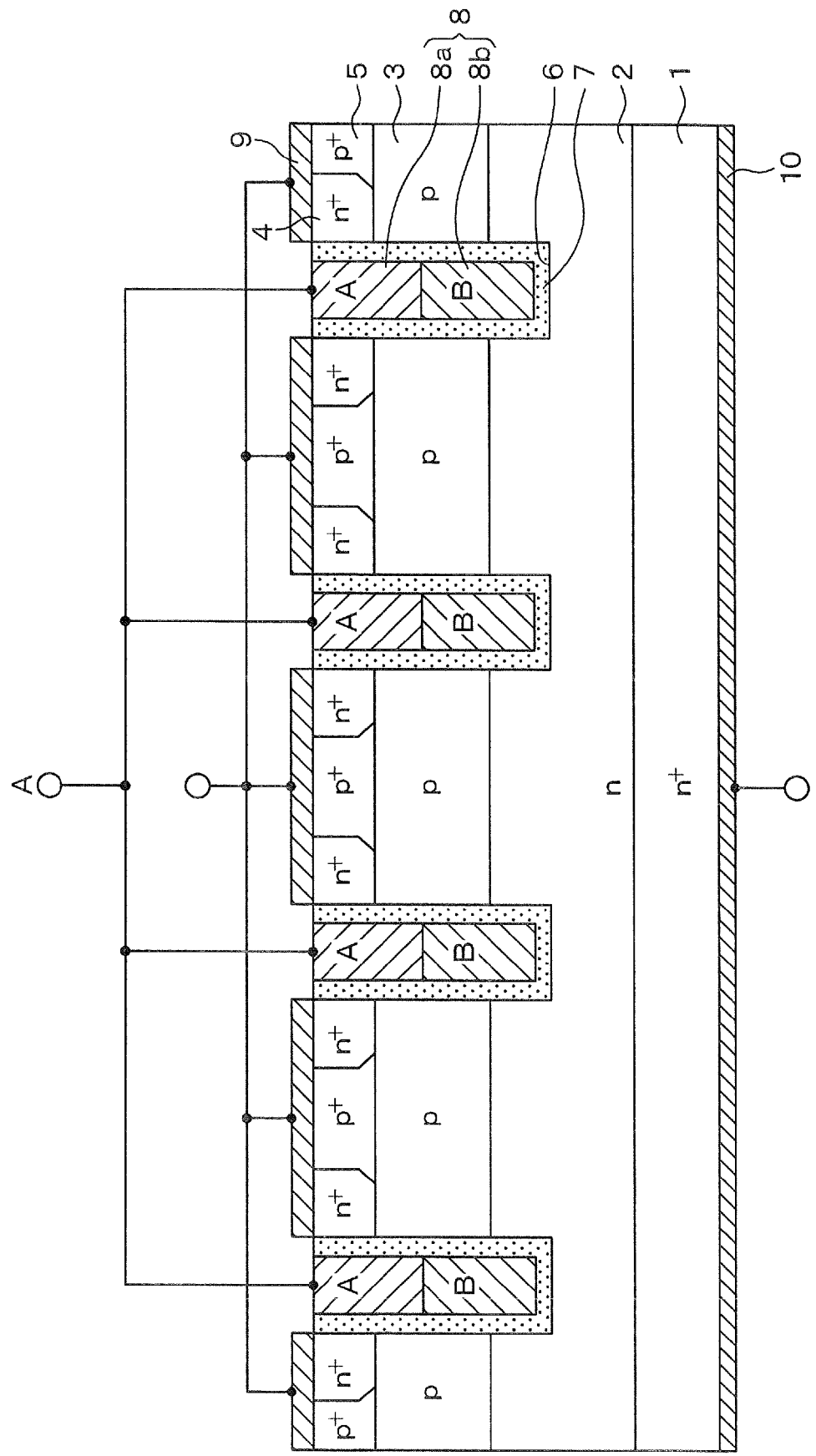
FIG. 21 is a diagram showing a cross sectional view of a semiconductor device having a vertical MOSFET with a trench gate structure and FWD in a 16th embodiment.

FIG. 21 is a sectional view of a semiconductor device having a vertical MOSFET with a trench gate structure and FWD in this embodiment. In this embodiment, as illustrated in the drawing, the insulating film 11 is not provided between the first gate electrode 8a and the second gate electrode 8b. Instead, the first gate electrode 8a and the second gate electrode 8b are formed of materials different in work function. Based on the work function difference between them, the first gate electrode 8a is caused to function as an excess carrier injection suppression gate and the second gate electrode 8b is caused to function as a MOSFET driving gate together with the first gate electrode 8a.

For example, the first gate electrode 8a is formed of p-type doped Poly-Si and the second gate electrode 8b is formed of n-type doped Poly-Si. With this configuration, the following takes place when positive voltage is applied to a gate electrode 8: first, the voltage is applied to the first gate electrode 8a and as a result, the p-type base region 3 is inverted to the depth of the first gate electrode 8a. Therefore, the first gate electrode 8a can be caused to function as an excess carrier injection suppression gate. When the voltage applied to the gate electrode 8 is subsequently increased beyond the work function difference between the first gate electrode 8a and the second gate electrode 8b, the following takes place: the p-type base region 3 is inverted to the depth of the second gate electrode 8b and a channel is formed. As a result, the MOSFET can be caused to operate. Therefore, the second gate electrode 8*b* can be caused to function as a MOSFET driving gate together with the first gate electrode 8*a*.

Even when the first gate electrode 8*a* and the second gate electrode 8*b* are formed of materials different in work function as mentioned above, the same effect as in the first embodiment can be obtained. However, the following measure must be taken with respect to the work function difference between the first gate electrode 8*a* and the second gate electrode 8*b*: the materials of the first and second gate electrodes 8*a*, 8*b* must be selected so that the above work function difference is smaller than the work function difference between the first gate electrode 8*a* and the gate insulating film 7. More specific description will be given. If the work function difference between the first gate electrode 8*a* and the gate insulating film 7 is smaller than the work function difference between the first gate electrode 8*a* and the second gate electrode 8*b*, the following will take place: voltage is not applied to the second gate electrode 8*b* and substantially all the gate voltage is applied to between the first gate electrode 8*a* and the gate insulating film 7. To prevent this, the materials of the first and second gate electrodes 8*a*, 8*b* are selected so that the above condition is met.

In this description, a case where the first gate electrode 8*a* and the second gate electrode are respectively formed of p-type doped Poly-Si and n-type doped Poly-Si has been taken as an example. Instead, the first and second gate electrodes 8*a*, 8*b* may be formed of two different kinds of metal materials different in work function.

Figure 22:
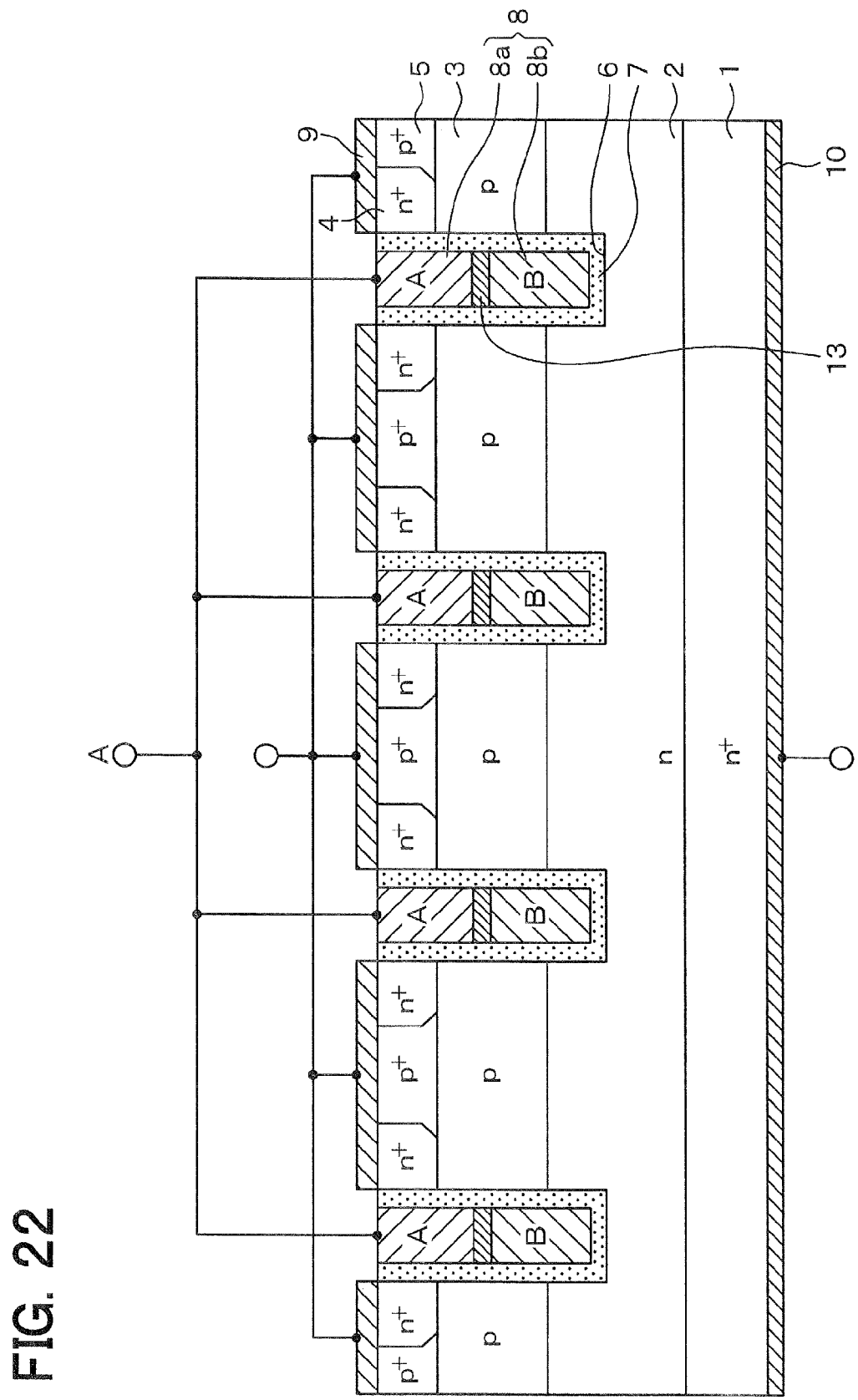
FIG. 22 is a diagram showing a cross sectional view of a semiconductor device having a vertical MOSFET with a trench gate structure and FWD in a modification to the 16th embodiment.

In addition, as in the modification shown in FIG. 22, an intermediate member 13 formed of a material different from the materials of the first and second gate electrodes 8*a*, 8*b* may be provided therebetween. For example, the first gate electrode 8*a*, intermediate member 13, and second gate electrode 8*b* are respectively formed of p-type dope Poly-Si, metal, and n-type doped Poly-Si or the like. In case of this mode, the following takes place when gate voltage is applied: the gate voltage is applied to the first gate electrode 8*a* to the intermediate member 13 to the second gate electrode 8*b* in this order. The position in the p-type base region 3 where an inversion layer is formed can be set to the depth of the first gate electrode 8*a* or the depth of the second gate electrode 8*b* by controlling this voltage. Even in this case, the same operation as that of the semiconductor device illustrated in FIG. 12 can be performed. When this structure is adopted, the materials of the first gate electrode 8*a*, intermediate member 13, and second gate electrode 8*b* can be combined in any way regardless of whether they are metal material or semiconductor material. In this structure, the number of layers of the intermediate member 13 as intermediate material provided between the first and second gate electrodes 8*a*, 8*b* need not be one and more materials different in work function may be laminated.

Other Embodiments

In the first embodiment, the second gate electrode 8*b* is formed at some midpoint in the direction of length of the trench 6 so that it is extended to the surface of the substrate when the gate electrode 8 is provided with a double gate structure. However, this just illustrates an example of how to draw out the gate electrode 8 and any other structure may be adopted. For example, the following measure may be taken as shown in the schematic perspective view of a trench gate structure in FIG. 23: the second gate electrode 8*b* is formed in the end position in the direction of length of the trench 6 so that it is extended to the surface of the substrate; and a gate wiring is drawn out in this position or a pad is formed in this position.

Figure 23:
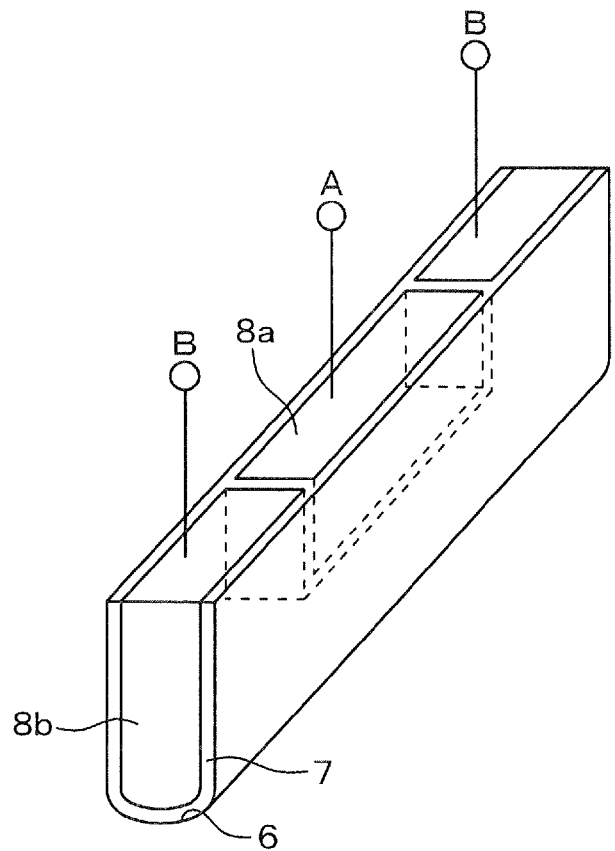
FIG. 23 is a diagram showing a schematic perspective view of the trench gate structure of a semiconductor device in another embodiment corresponding to FIG. 1.
Figure 24:
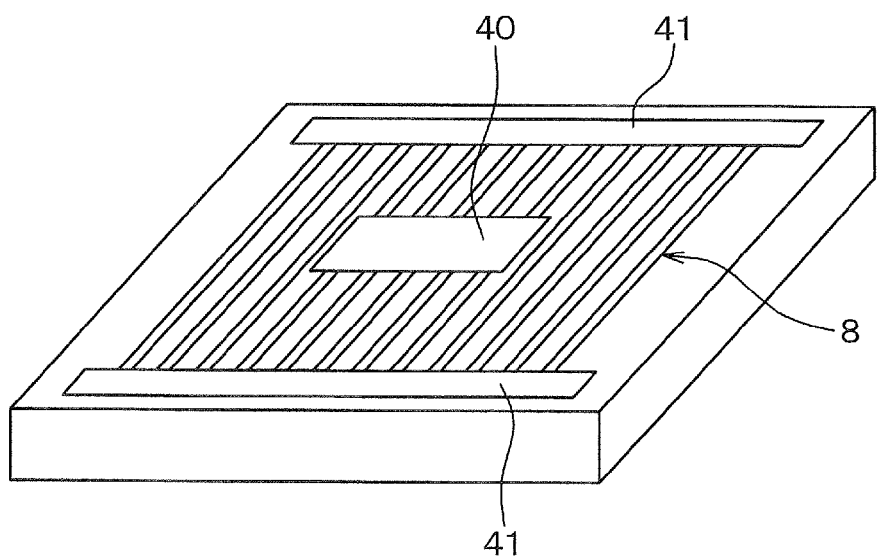
FIG. 24 is a diagram showing a perspective view illustrating an example of the layout of a semiconductor device in another embodiment corresponding to FIG. 1.

FIG. 24 is a perspective view illustrating an example of the layout of a semiconductor device obtained in the following cases: a case where the second gate electrode 8*b* is formed at some midpoint in the direction of length of the trench 6 so that it is extended to the surface of the substrate as illustrated in FIG. 6; or a case where it is formed in the end position in the direction of length of the trench 6 so that it is extended to the surface of the substrate as illustrated in FIG. 23. As illustrated in this drawing, a pad 40 is formed in the middle position in the chip comprising the semiconductor device and pads 41 are formed at ends of the chip.

When the second gate electrode 8*b* is formed at some midpoint in the direction of length of the trench 6 so that it is extended to the surface of the substrate as illustrated in FIG. 6, the pads are used as follows: the pad 40 shown in FIG. 24 is used as is coupled to the second gate electrode 8*b* and the pads 41 are used as are coupled to the first gate electrodes 8*a*. When the second gate electrode 8*b* is formed in the end position in the direction of length of the trench 6 so that it is extended to the surface of the substrate as illustrated in FIG. 23, the pads are used as follows: the pad 40 illustrated in FIG. 24 is used as is coupled to the first gate electrode 8*a* and the pads 41 are used as are coupled to the second gate electrodes 8*b*.

Figure 25:
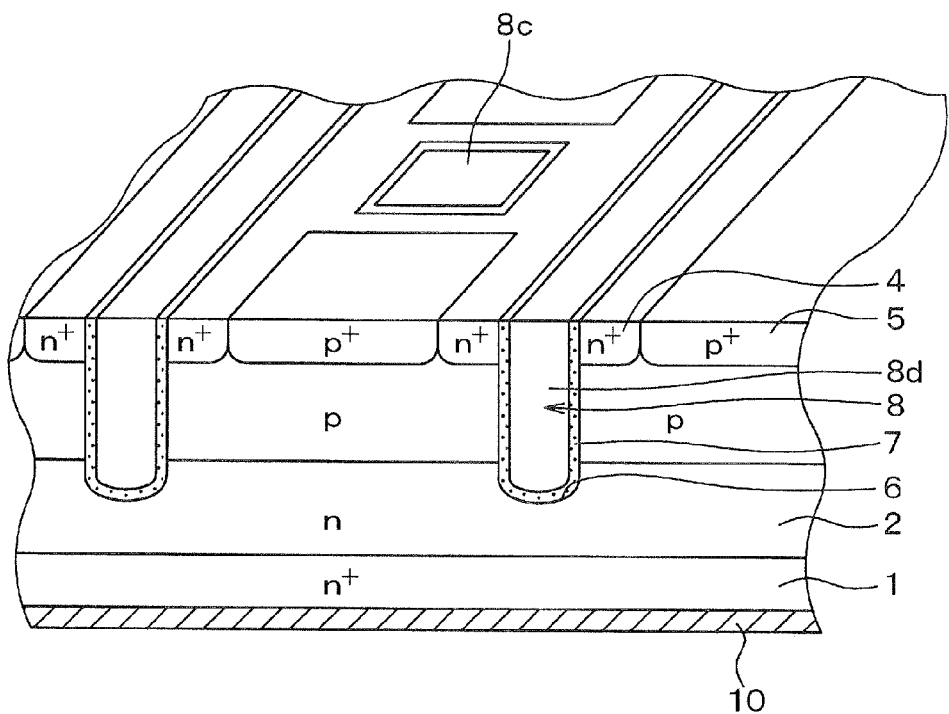
FIG. 25 is a diagram showing a schematic perspective view of the trench gate structure of a semiconductor device in another embodiment corresponding to FIG. 6.

In the description of the second to fourth embodiments, cases where the trench gate structure is formed in a stripe pattern, that is, the first gate electrodes 8*c*, 8*e*, 8*g* and the second gate electrodes 8*d*, 8*f*, 8*h* are laid out in a stripe pattern have been taken as examples. However, they just illustrate examples and various layouts can be adopted. FIG. 25 is a perspective view illustrating an example of the layout of the first and second gate electrodes 8*c*, 8*d* in the second embodiment. As shown in this drawing, the semiconductor device can be so configured that the second gate electrodes 8*d* are arranged in a stripe pattern and the first gate electrode 8*c* is partly arranged between the second gate electrodes 8*d*.

Figure 26:
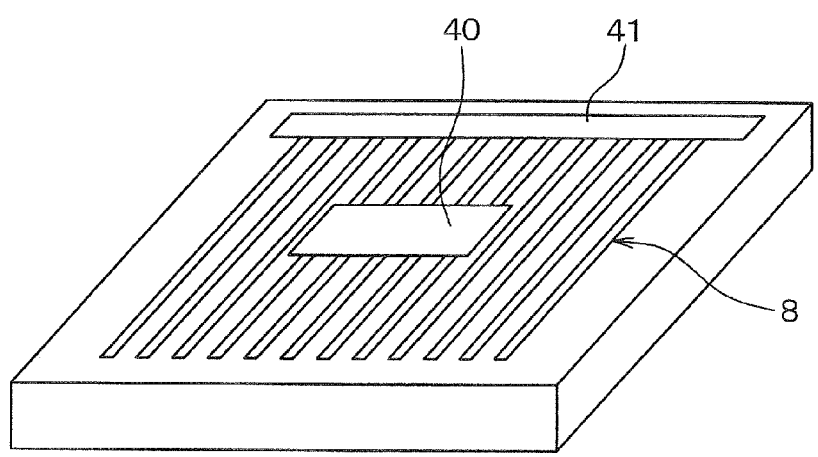
FIG. 26 is a diagram showing a perspective view illustrating an example of the layout of a semiconductor device in another embodiment corresponding to FIG. 6.

FIG. 26 is a perspective view illustrating an example of the layout of a semiconductor device taken when it is so configured that the first gate electrode 8*c* is partly arranged between the second gate electrodes 8*d*. As shown in this drawing, the semiconductor device is so configured that a pad 40 is formed in the middle position in the chip comprising the semiconductor device and a pad 41 is formed at an end of the chip.

When the configuration in which the first gate electrode 8*c* is partly arranged between the second gate electrodes 8*d* as shown in FIG. 25 is adopted, the pads are used as follows: the pad 40 is used as is coupled to the first gate electrode 8*c* and the pad 41 is used as is coupled to the second gate electrode 8*d*. In this description, the semiconductor device in the second embodiment has been taken as an example. However, the same layout can also be adopted in the third and fourth embodiments.

In the above description of each embodiment, an n-channel MOSFET in which the first conductivity type is n-type and the second conductivity type is p-type has been taken as an example. However, the disclosure can also be applied to a p-channel MOSFET in which the conductivity type of each component is inverted.

Figure 27A:
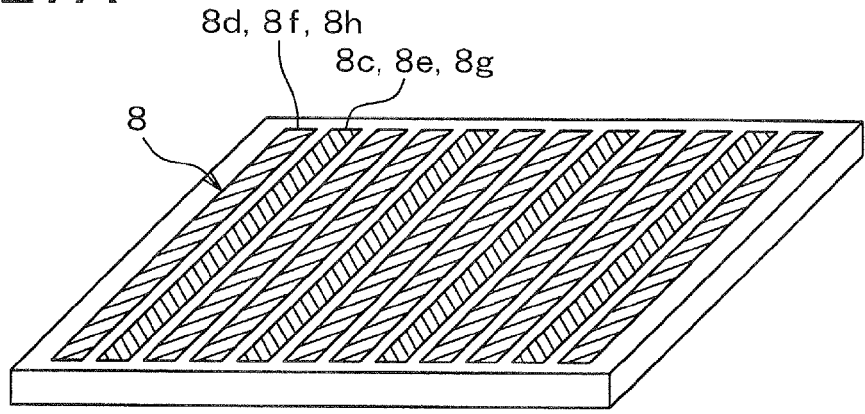
FIG. 27A is a diagram showing a perspective layout chart of a semiconductor device in another embodiment.
Figure 27B:
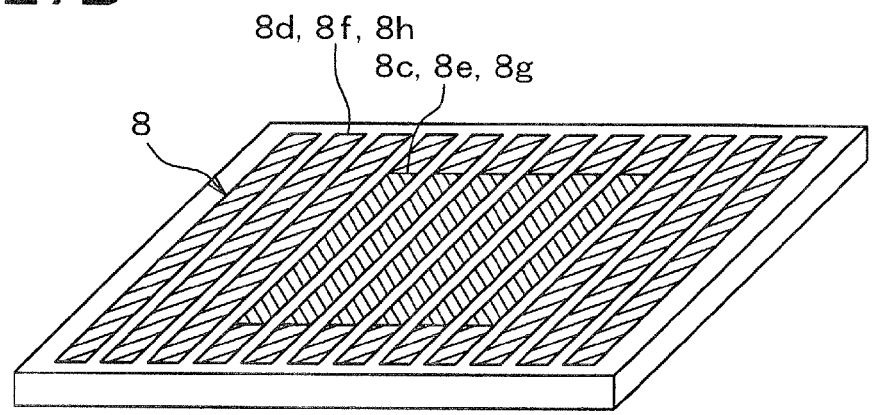
FIG. 27B is a diagram showing a perspective layout chart of a semiconductor device in another embodiment.
Figure 27C:
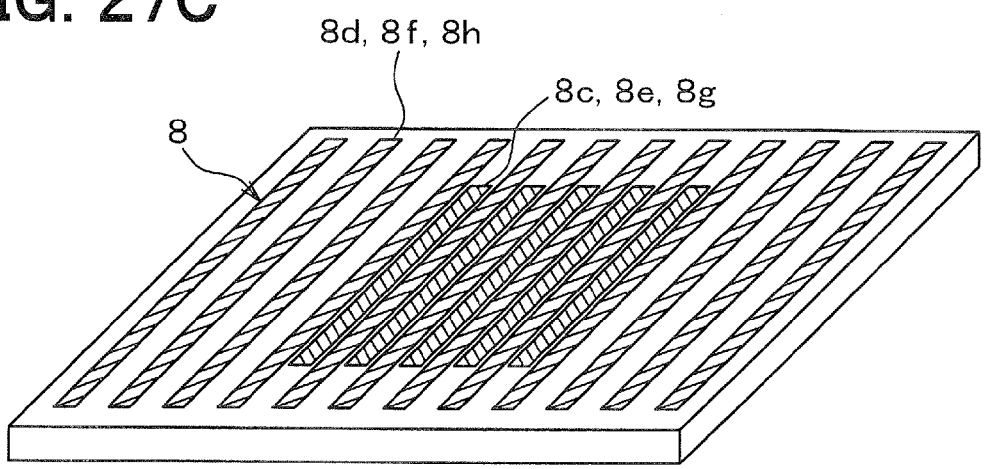
FIG. 27C is a diagram showing a perspective layout chart of a semiconductor device in another embodiment.

In the description of the second to fourth embodiments, a layout in which gate electrodes 8 comprising a MOSFET driving gate and an excess carrier injection suppression gate are adjacently arranged and they are formed at a ratio of 1:1 has been taken as examples. However, they just cite examples and any other layout may be adopted. FIGS. 27A to 27C are perspective layout charts illustrating example of other layouts. In FIGS. 27A to 27C, only the layout of gate electrodes 8 is shown. Though FIGS. 27A to 27C are not sectional views, gate electrodes 8 are hatched for the sake of convenience to facilitate visualization.

The layout shown in FIG. 27A may be adopted. In this layout, one gate electrode 8c, 8e, 8g comprising an excess carrier injection suppression gate is placed for arranged multiple (two in the drawing) gate electrodes 8d, 8f, 8h comprising a MOSFET driving gate. This makes it possible to increase the area of a portion that can be caused to operate as MOSFET as compared with cases where gate electrodes 8 comprising a MOSFET driving gate and an excess carrier injection suppression gate are formed at a ratio of 1:1.

The layout shown in FIG. 27B may be adopted. In this layout, gate electrodes 8c, 8e, 8g partly comprising an excess carrier injection suppression gate are concentrated in the central part of multiple gate electrodes 8 arranged in parallel; and gate electrodes 8d, 8f, 8h comprising a MOSFET driving gate are arranged in the other places.

The layout shown in FIG. 27C may be adopted. In this layout, multiple gate electrodes 8d, 8f, 8h comprising a MOSFET driving gate are arranged in parallel; gate electrodes 8c, 18e, 8g partly comprising an excess carrier injection suppression gate are provided therebetween only in the central part; and only gate electrodes 8d, 8f, 8h comprising a MOSFET driving gate are provided in the other places.

Also in cases where both the gate electrodes 8 with a single gate structure and those with a double gate structure, described in relation to the 15th embodiment, are formed, the structures shown in FIGS. 27A to 27C can be adopted. That is, the positions of the gate electrode 8c, 8e, 8g comprising an excess carrier injection suppression gate shown in FIGS. 27A to 27C can be taken as gate electrodes 8 with a double gate structure; and the positions of gate electrodes 8d, 8f, 8h comprising a MOSFET driving gate can be taken as gate electrodes 8 with a single gate structure.

Up to this point, description has been given to examples of the layouts illustrated in FIGS. 27A to 27C; however, any layout other than those shown in FIGS. 27A to 27C may also be adopted, needless to add.

A superjunction structure can also be applied to a semiconductor device in which a vertical or horizontal planar MOSFET is applied as the above-mentioned semiconductor switching element with an insulated gate structure.

Figure 28:
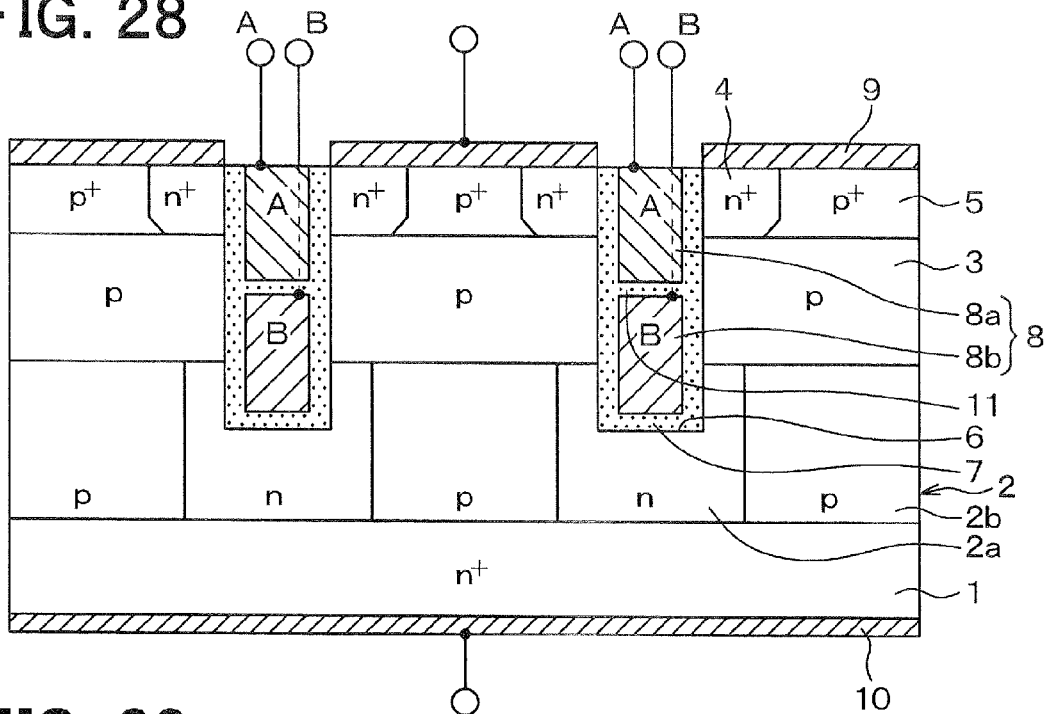
FIG. 28 is a diagram showing a cross sectional view of a semiconductor device with a superjunction structure applied to a vertical MOSFET in another embodiment.

FIG. 28 illustrates a semiconductor device having a vertical MOSFET described in relation to the first embodiment in which a superjunction structure is applied to the vertical MOSFET. Specifically, the semiconductor device is provided with a superjunction structure in which a $n^-$-type column 2a and a $p^-$-type column 2b are alternately repeated by taking the following measure: trenches are formed in the $n^-$-type drift layer 2 and a $p^-$-type layer is buried therein or p-type impurity is ion-implanted in multiple stages during the growth of the $n^-$-type drift layer 2. Also in cases where a superjunction structure is adopted as mentioned above, the same effect as in the first embodiment can be obtained by providing the same trench gate structure as in the first embodiment. Up to this point, description has been given to a case where the superjunction structure is applied to the first embodiment. However, the superjunction structure can also be applied to a semiconductor device to which any other MOSFET is applied, needless to add.

In the above description of each embodiment, a vertical or horizontal planar MOSFET or IGBT has been taken as an example of a semiconductor switching element with an insulated gate structure. However, the disclosure can also be applied to MOSFET or IGBT with any other structure, for example, a concave semiconductor switching element. In the description of the 11th to 14th embodiments, MOSFET has been taken as an example; however, IGBT with the same structure may be configured. That is, the semiconductor substrate 1 can be comprised of a $n^+$-type impurity region 1a and a $p^+$-type impurity region 1b or the impurity region 57 can be comprised of a $n^+$-type first impurity region 57a and a $p^+$-type second impurity region 57b. In the above description of each embodiment, a structure in which a semiconductor switching element with an insulated gate structure and FWD are contained in one chip has been taken as an example. However, the disclosure is not limited to semiconductor devices with a semiconductor switching element with an insulated gate structure and FWD contained in one chip. It can also be applied to semiconductor devices in which they are formed in different chip as long as the semiconductor device is so structured that they are coupled in parallel.

In case of IGBT, the following takes place when the IGBT and FWD are formed in different chips: a $n^+$-type impurity region is need not be formed in the semiconductor substrate 1 and a $n^+$-type first impurity region 57a need not be formed in the impurity region 57.

Figure 29:
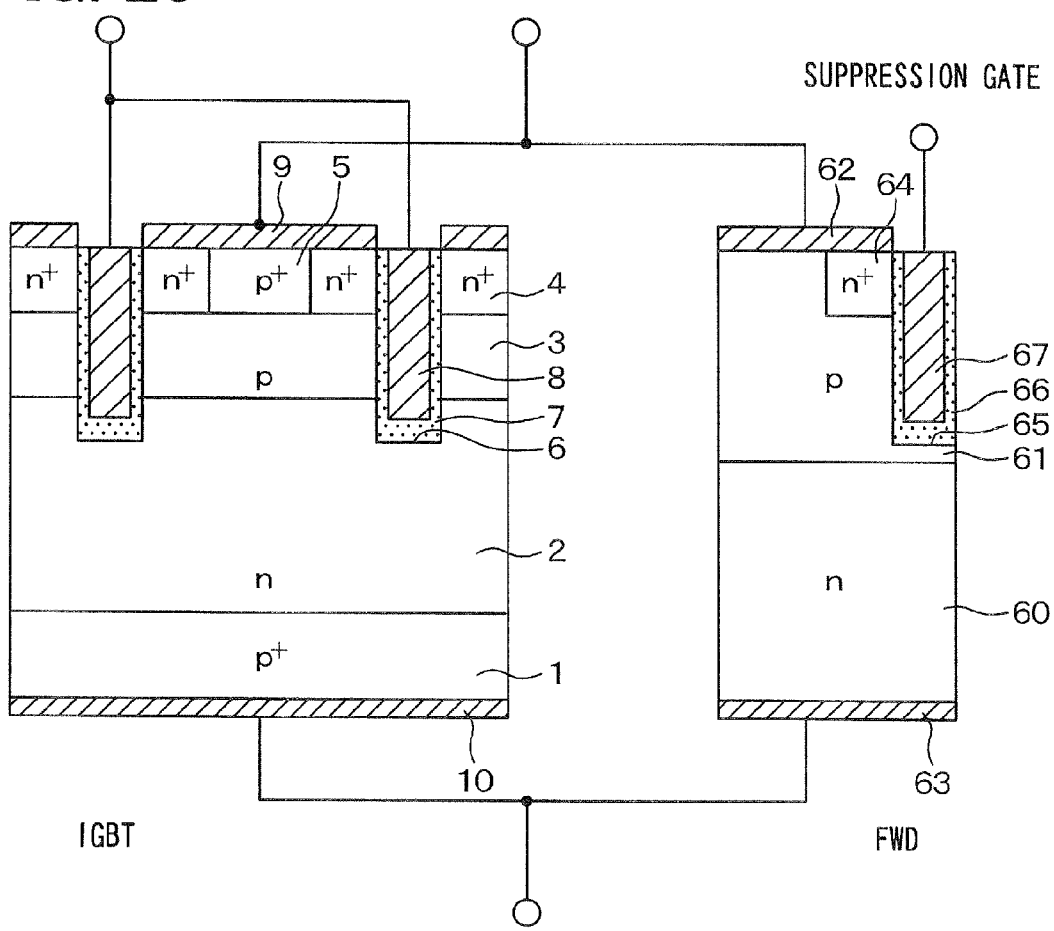
FIG. 29 is a diagram showing a schematic cross sectional view obtained when a vertical IGBT with a trench structure and FWD are formed in different chips in another embodiment.
Figure 30:
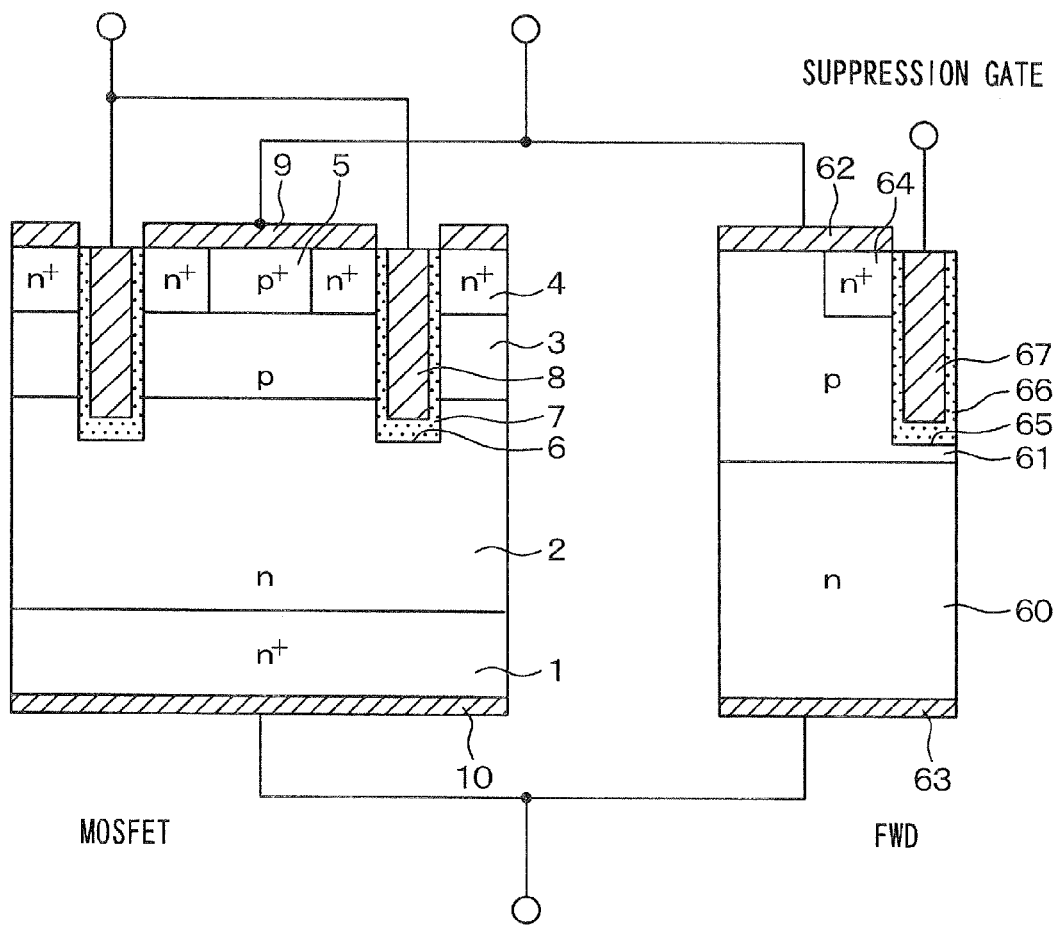
FIG. 30 is a diagram showing a cross sectional view obtained when a vertical MOSFET with a trench structure and FWD are formed in different chips in another embodiment.

FIG. 29 is a schematic sectional view obtained when a vertical IGBT with a trench structure and FWD are formed in different chips. FIG. 30 is a sectional view obtained when a vertical MOSFET with a trench structure and FWD are formed in different chips.

In the chip in which a vertical IGBT or a vertical MOSFET is formed, as illustrated in these drawings, the vertical IGBT or the vertical MOSFET is configured with the same structure as in each the above embodiment. That is, the $n^-$-type drift layer 2 and the p-type base region 3 are formed over the $p^+$-type or $n^+$-type semiconductor substrate 1; and the $n^+$-type impurity region 4 is formed in the surface part of the p-type base region 3. The gate electrode 8 is formed in the trench 6 with the gate insulating film 7 in between. Further, the first electrode 9 coupled to the p-type base region 3 through the $n^+$-type impurity region 4 and the $p^+$-type contact region 5 is formed and the second electrode 10 electrically coupled to the semiconductor substrate 1 is formed.

In the chip with FWD formed therein, a p-n junction is formed of an n-type cathode layer 60 comprising a first conductivity type layer and a p-type anode layer 61 comprising a second conductivity type layer formed thereover. A first electrode 62 comprising an anode electrode is electrically coupled to the p-type anode layer 61 and a second electrode 63 comprising a cathode electrode is electrically coupled to the n-type cathode layer 60. A $n^+$-type impurity region 64 higher in impurity concentration than the n-type cathode layer 60 and comprising a first impurity region is formed in the surface part of the p-type anode layer 61; and a trench 65 extended from this $n^+$-type impurity region 64 to the p-type anode region 61 is formed. A gate electrode 67 comprising a first gate electrode is formed in the trench 65 with a gate insulating film 66 in between.

With this structure, FWD can be formed in a different chip. When the first electrodes 9, 62 in the respective chips are electrically coupled and the respective second electrodes 10, 63 are electrically coupled, the following is implemented: a semiconductor device in which a vertical IGBT or a vertical MOSFET and FWD formed in different chips are coupled in parallel is configured. A vertical IGBT or a vertical MOSFET and FWD can also be formed in different chips as mentioned above.

When a vertical IGBT and FWD are formed in different chips, it is necessary to provide the FWD with an excess carrier injection suppression gate because recovery does not occur in the vertical IGBT. Therefore, the same effect as in the first embodiment and the like can be obtained by forming the gate electrode 67 comprising an excess carrier injection suppression gate in the chip in which the FWD is formed. When a vertical MOSFET and FWD are formed, the performance of the FWD is inevitably degraded with a structure in which they are contained in one chip as compared with cases where a vertical MOSFET and FWD are formed in different chips. For this reason, the FWD may be formed in a chip different from that of the vertical MOSFET and be externally added.

In the description given here, a case where FWD is formed in a chip different from that of a vertical IGBT or a vertical MOSFET with a trench structure has been taken as an example. However, the vertical IGBT or vertical MOSFET need not be of a trench structure and FWD may be formed in a chip different from that of a planar vertical IGBT or vertical MOSFET. The foregoing applies not only to the vertical IGBT or vertical MOSFET but also to horizontal IGBTs and horizontal MOSFETs.

Figure 31:
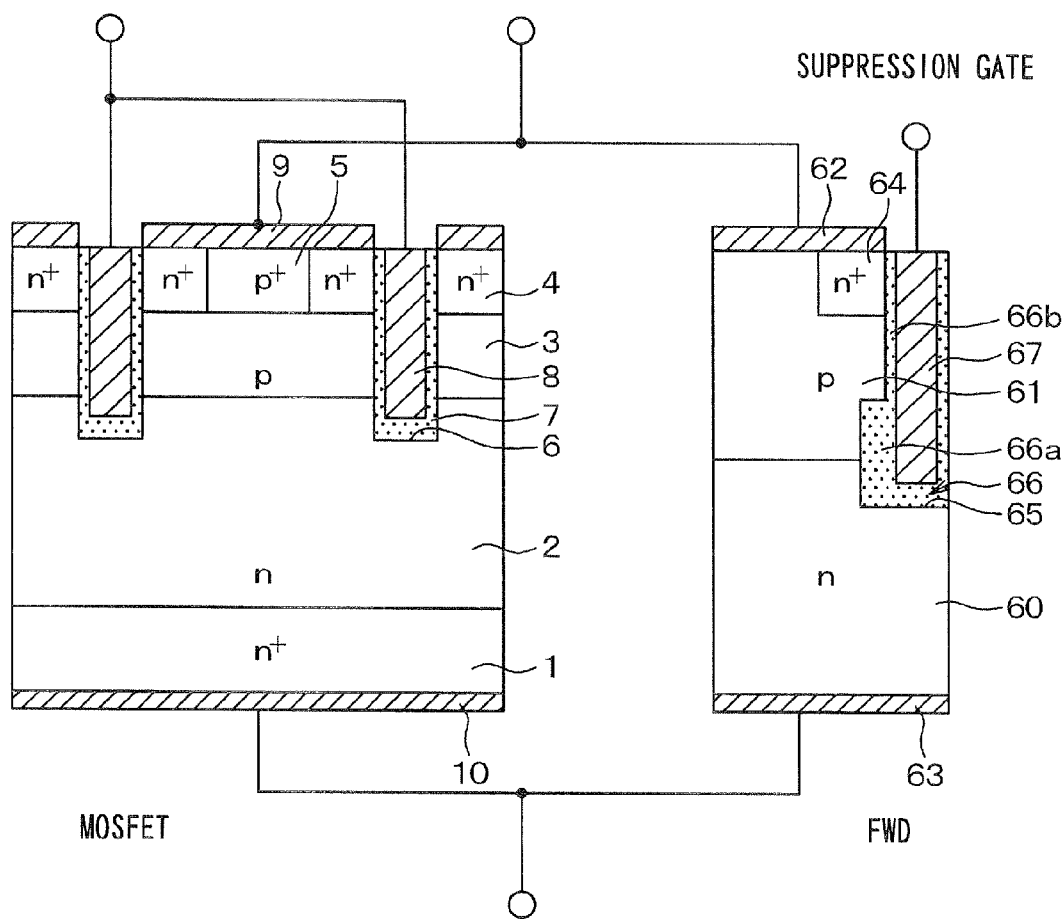
FIG. 31 is a diagram showing a schematic cross sectional view obtained when a vertical IGBT with a trench structure and FWD are formed in different chips in another embodiment.
Figure 32:
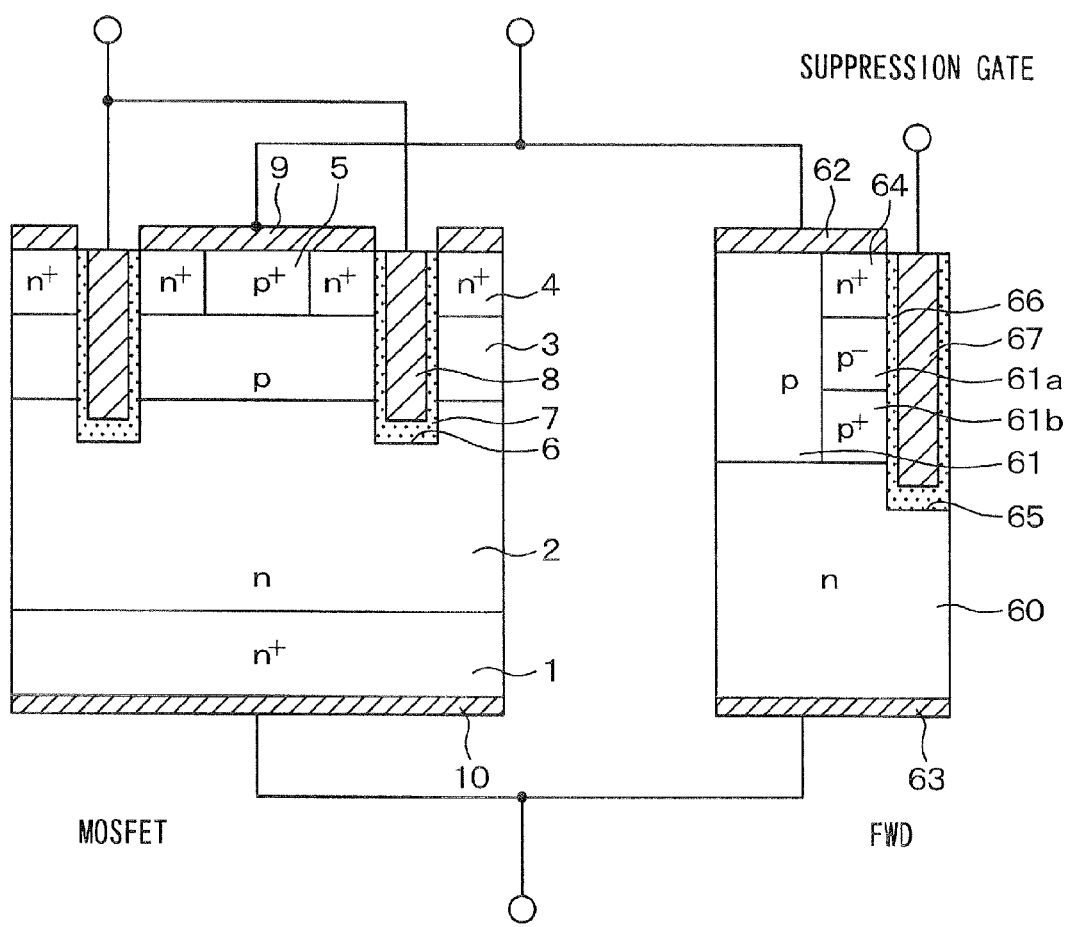
FIG. 32 is a diagram showing a cross sectional view obtained when a vertical MOSFET with a trench structure and FWD are formed in different chips in another embodiment.

Also with respect to the semiconductor devices illustrated in FIG. 7 and FIG. 9 described in relation to the third and fourth embodiments, the vertical IGBT and the FWD can be formed in different chips. FIG. 31 and FIG. 32 are schematic sectional views obtained when the vertical MOSFET with a trench structure and the FWD in the third and fourth embodiments are formed in different chips.

In the semiconductor device illustrated in FIG. 31, the chip with the vertical MOSFET formed therein has the same structure as in FIG. 30 and the chip with the FWD formed therein has substantially the same structure as in FIG. 30. However, the semiconductor device illustrated in FIG. 31 is different in the structure of the excess carrier injection suppression gate. More specific description will be given. A position deeper than the upper part of the n-type cathode layer 60 and shallower than the upper part of the n-type cathode layer 60 is taken as an intermediate position. The gate insulating film 66 is different in thickness between a first portion 66a deeper than the intermediate position and a second portion 66b shallower than it. It is thicker at the first portion 66a than at the second portion 66b. With this structure, the vertical MOSFET and the FWD of a semiconductor device that performs the same operation as in the third embodiment can be formed in different chips.

Also in the semiconductor device illustrated in FIG. 32, the chip with the vertical MOSFET formed therein has the same structure as in FIG. 30 and the chip with the FWD formed therein has substantially the same structure as in FIG. 30. However, the semiconductor device illustrated in FIG. 32 is different in the structure of the p-type anode layer 61 around the excess carrier injection suppression gate. That is, the measure described below is taken with respect to the impurity concentration of the p-type anode layer 61 located along the side of the trench 65. A position deeper than the upper part of the p-type anode layer 61 and shallower than the upper part of the n-type cathode layer 60 is taken as an intermediate position. The impurity concentration is different between a first region 61a shallower than the intermediate position and a second region 61b deeper than it. The second region 61b is higher in impurity concentration than the first region 61a. With this structure, the vertical MOSFET and the FWD of a semiconductor device that performs the same operation as in the fourth embodiment can be formed in different chips.

17th Embodiment

Figure 33:
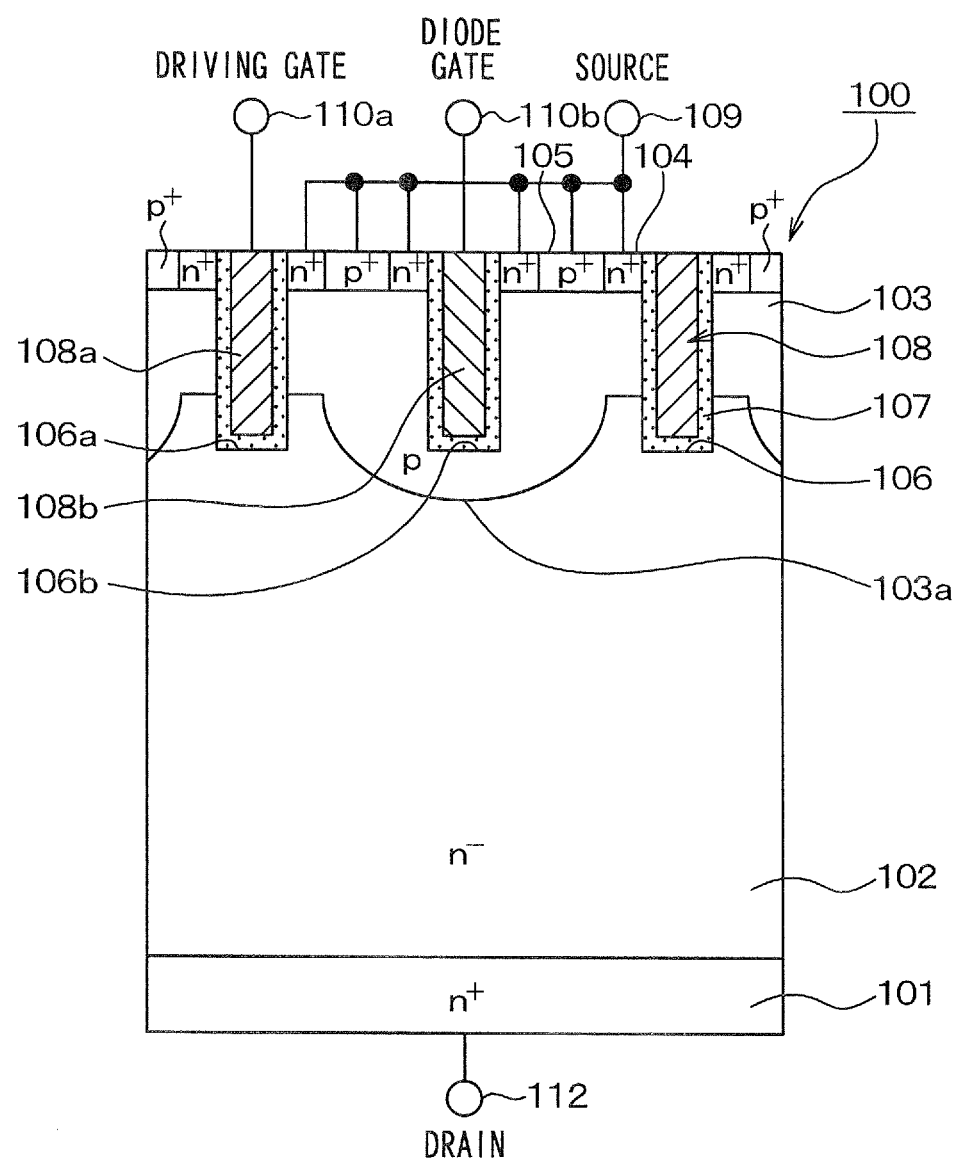
FIG. 33 is a diagram showing a cross sectional view of a semiconductor device 100 in a 17th embodiment.
Figure 34:
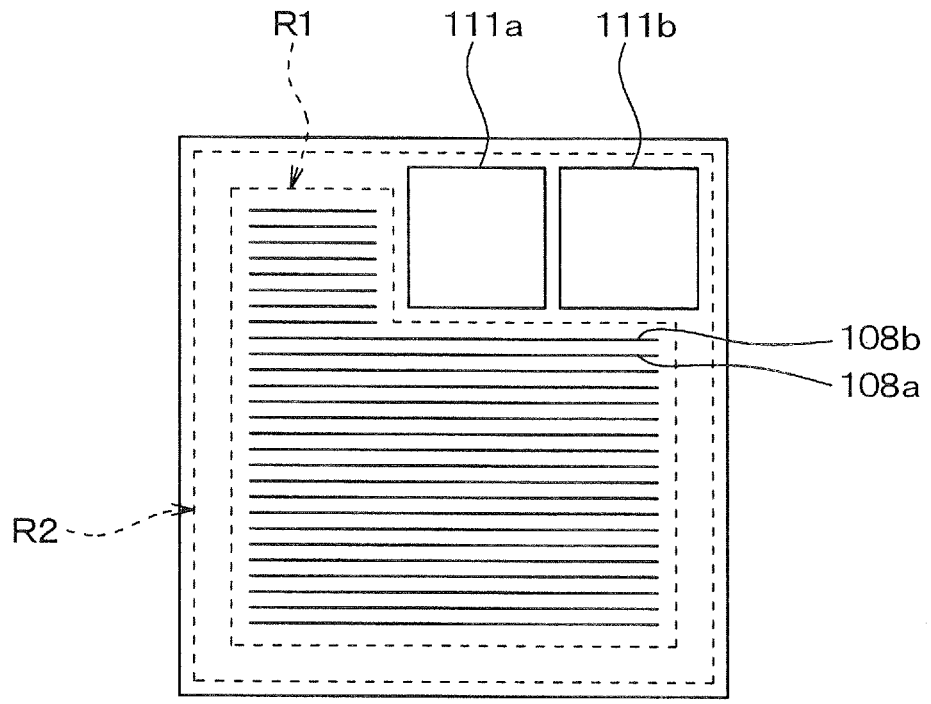
FIG. 34 is a diagram showing a top layout chart of the semiconductor device 100 illustrated in FIG. 33.

Description will be given to the 17th embodiment of the disclosure. In the description of this embodiment, a semiconductor device 100 in which an n-channel vertical MOSFET and FWD are formed in a cell region will be taken as an example. FIG. 33 is a sectional view of the semiconductor device 100 in this embodiment. FIG. 34 is a top layout chart of the semiconductor device 100 illustrated in FIG. 33. Hereafter, description will be given to the structure of the semiconductor device 100 in this embodiment with reference to these drawings.

The semiconductor device 100 illustrated in FIG. 33 has the structure illustrated in FIG. 34. That is, it includes: a cell region R1 where a vertical MOSFET and FWD are formed; and a peripheral region R2 where a peripheral high-breakdown voltage structure surrounding the cell region R1. However, FIG. 33 depicts only the cell region R1. The structure of the semiconductor device 100 in the areas other than the cell region R1 is the same as conventional and description will be given only to the cell region R1 here.

The semiconductor device 100 is formed using a $n^+$-type substrate (semiconductor layer of first conductivity type) 101 formed of semiconductor material, such as silicon, high in impurity concentration. Over the surface of the $n^+$-type substrate 101, the following are formed in the following order: a $n^-$-type drift layer 102 lower in impurity concentration than the $n^+$-type substrate 101 and a p-type base region 103 whose impurity concentration is set relatively low. Over the $n^-$-type drift layer 102, p-type body layers 103a extended to the lower part of the p-type base region 103 are formed at equal intervals. The p-type body layers 103a are for forming the anode of a body diode comprising the FWD and are extended with one direction, specifically, the direction perpendicular to the plane of FIG. 33 taken as the direction of length.

In the surface part of the p-type base region 103, $n^+$-type impurity regions (impurity regions of first conductivity type) 104 equivalent to a source region, higher in impurity concentration than the $n^-$-type drift layer 102, are provided; and further $p^+$-type contact regions 105 higher in impurity concentration than the p-type base region 103 are formed. Multiple trenches 106 identical in depth are formed from the substrate surface side. A gate insulating film 107 is formed so as to cover the inner wall surfaces of the trenches 106 and gate electrodes 108 formed of doped Poly-Si are provided over the surface of the gate insulating film 107. The trench gate structure comprised of the trenches 106, gate insulating film 107, and gate electrodes 108 is laid out in a stripe pattern formed by arranging multiple trenches 106 in the same direction as illustrated in, for example, FIG. 34.

Two different kinds of gate electrodes 108 are provided. One is taken as a vertical MOSFET driving gate electrode 108a and the other is taken as a diode gate electrode 108b.

The driving gate electrode 108a is formed in a region where a p-type body layer 103a is not formed and the trench (first trench) 106a in which the driving gate electrode 108a is placed is so structured that the following is implemented: it penetrates the $n^+$-type impurity region 104 and the p-type base region 103 and is extended from the substrate surface side to the $n^-$-type drift layer 102. For this reason, the following takes place when gate voltage is applied to the driving gate electrode 108a: an inversion layer is formed in the p-type base region 103 located along the side of the gate electrode 108a; and continuity can be established between the $n^+$-type impurity region 104 and the $n^-$-type drift layer 102 using this inversion layer as a channel.

The diode gate electrode 108b is formed in a region where a p-type body layer 103a is formed. The trench (second trench) 106b in which the diode gate electrode 108b is placed is so structured that the following is implemented: it is shallower than the p-type body layer 103a and its bottom portion is positioned in the p-type body layer 103a and does not reach the n⁻-type drift layer 102. For this reason, the following takes place when gate voltage is applied to the diode gate electrode 108b: an inversion layer is formed in the p-type base region 103 located along the side of the gate electrode 108b but continuity is not established between the n⁺-type impurity region 104 and the n⁻-type drift layer 102.

Voltage is independently applied to the driving gate electrode 108a and to the diode gate electrode 108b. The proportion of the driving gate electrodes 108a and diode gate electrodes 108b formed is arbitrary. In this embodiment, the formation ratio is set to 1:1 by alternately arranging a driving gate electrode 108a and a diode gate electrode 108b.

An interlayer insulating film (not shown) comprised of an oxide film or the like is formed so as to cover the gate electrodes 108. In addition to a front surface electrode 109 equivalent to a source electrode, a driving gate wiring 110a and a diode gate wiring 110b are formed over the interlayer insulating film. The front surface electrode 109, driving gate wiring 110a, and diode gate wiring 110b are insulated by the interlayer insulating film and are respectively electrically coupled to desired regions in the vertical MOSFET. Specifically, the front surface electrode 109 is electrically coupled to the n⁺-type impurity region 104 and the p⁺-type contact region 105 through a contact hole formed in the interlayer insulating film. The driving gate wiring 110a and the diode gate wiring 110b are also respectively electrically coupled to the driving gate electrode 108a or the diode gate electrode 108b through a contact hole formed in the interlayer insulating film.

Substantially the whole of the cell region R1 is used as the front surface electrode 109 and the driving gate wiring 110a and the diode gate wiring 110b are laid out so that the front surface electrode 109 is avoided. For example, the driving gate wiring 110a and the diode gate wiring 110b are routed in the periphery of the cell region R1; and they are respectively electrically coupled to a driving gate pad 111a and a diode gate pad 111b placed at the corner located at the upper right of the plane of FIG. 34.

Figure 35:
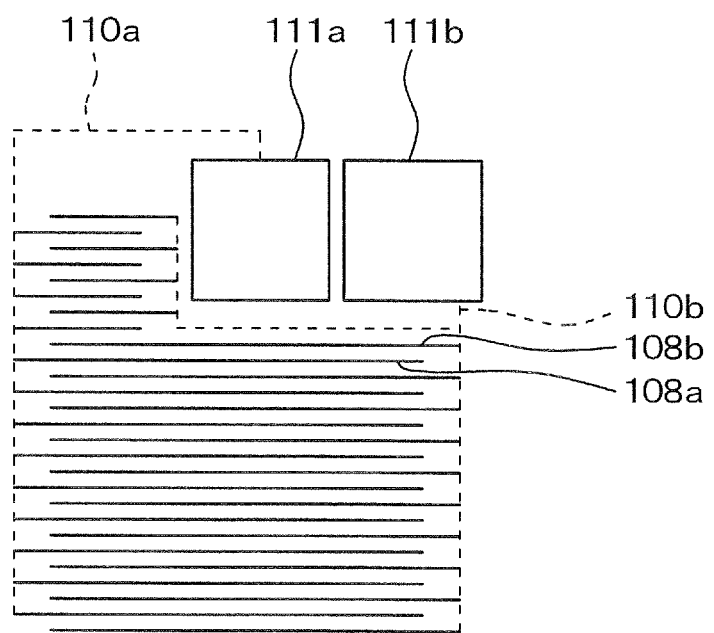
FIG. 35 is a diagram showing a conceptual drawing of the wire drawing structure of the semiconductor device 100 illustrated in FIG. 33.

When the structure illustrated in the conceptual drawing of a wire drawing structure in FIG. 35 is adopted, for example, wiring layout is facilitated. That is, the driving gate wiring 110a is routed to the driving gate pad 111a so that it is coupled to one end of each driving gate electrode 108a in the direction of length. The diode gate wiring 110b is routed to the diode gate pad 111b so that it is coupled to the other end of each diode gate electrode 108b in the direction of length. That is, the wirings 110a, 110b are drawn out in different directions on the chip. This makes it unnecessary to adopt a layout in which both the driving gate wiring 110a and the diode gate wiring 110b are overlapped and arranged in the periphery of the cell region R1. As a result, wiring layout can be facilitated.

A back surface electrode 112 equivalent to a drain electrode is formed over the surface of the n⁺-type substrate 101 located on the opposite side to the n⁻-type drift layer 2. FIG. 33 depicts only a portion in which one cell of FWD is provided between two cells of vertical MOSFETs. The cell region R1 in the layout in FIG. 34 is configured by alternately arranging these multiple cells of vertical MOSFETs and FWDs.

With this structure, the semiconductor device 100 having the following vertical MOSFET and FWD is configured: a vertical MOSFET that forms an inversion layer in the p-type base region 103 located along the side of the trench 106 and thereby passes a current between source and drain through the n⁺-type impurity region 104, n⁻-type drift layer 102, and n⁺-type substrate 101; and FWD utilizing a p-n junction formed between the p-type body region 103a as a p-type body layer comprising an anode and the n⁻-type drift layer 102 comprising a cathode.

Subsequently, description will be given to the operation of the semiconductor device 100 having the vertical MOSFET and FWD configured as mentioned above.

First, description will be given to the basic operations of the vertical MOSFET and FWD provided in the semiconductor device 100 having the above configuration.

(1) When the front surface electrode 109 is grounded and positive voltage is applied to the back surface electrode 112, the following takes place: the p-n junction formed between the p-type body region 103a as a p-type body layer and the n⁻-type drift layer 102 is brought into an inverse voltage state. For this reason, when voltage is not applied to each gate electrode 108a, 108b and they are off, a depletion layer is formed at the p-n junction and a current between source and drain is interrupted.

(2) To turn on the vertical MOSFET, the front surface electrode 109 is grounded and positive voltage is applied to the driving gate electrode 108a with positive voltage applied to the back surface electrode 112. As a result, an inversion layer is formed in the portion of the p-type base region 103 in contact with the trench 106 in the periphery of the driving gate electrode 108a. Then a current is passed between source and drain using it as a channel.

(3) To cause the FWD to perform diode operation, positive voltage is applied to the front surface electrode 109 and further the back surface electrode 12 is grounded and voltage application to each gate electrode 108a, 108b is stopped to turn them off. As a result, an inversion layer is not formed in the p-type base region 103; therefore, the FWD formed between source and drain performs diode operation.

In a semiconductor device configured as in this embodiment, it is possible to switch a vertical MOSFET between on and off and cause FWD to perform diode operation. Control for achieving both back flow reduction and recovery loss reduction is carried out by use of the semiconductor device with this structure.

Figure 36:
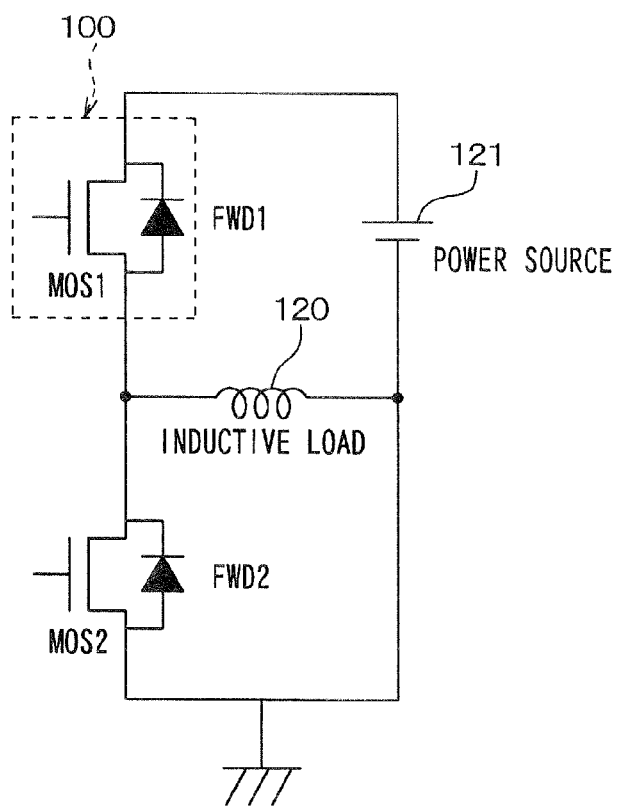
FIG. 36 is a diagram showing a circuit diagram illustrating an example of an inverter circuit to which the semiconductor device 100 illustrated in FIG. 33 is applied.
Figure 37:
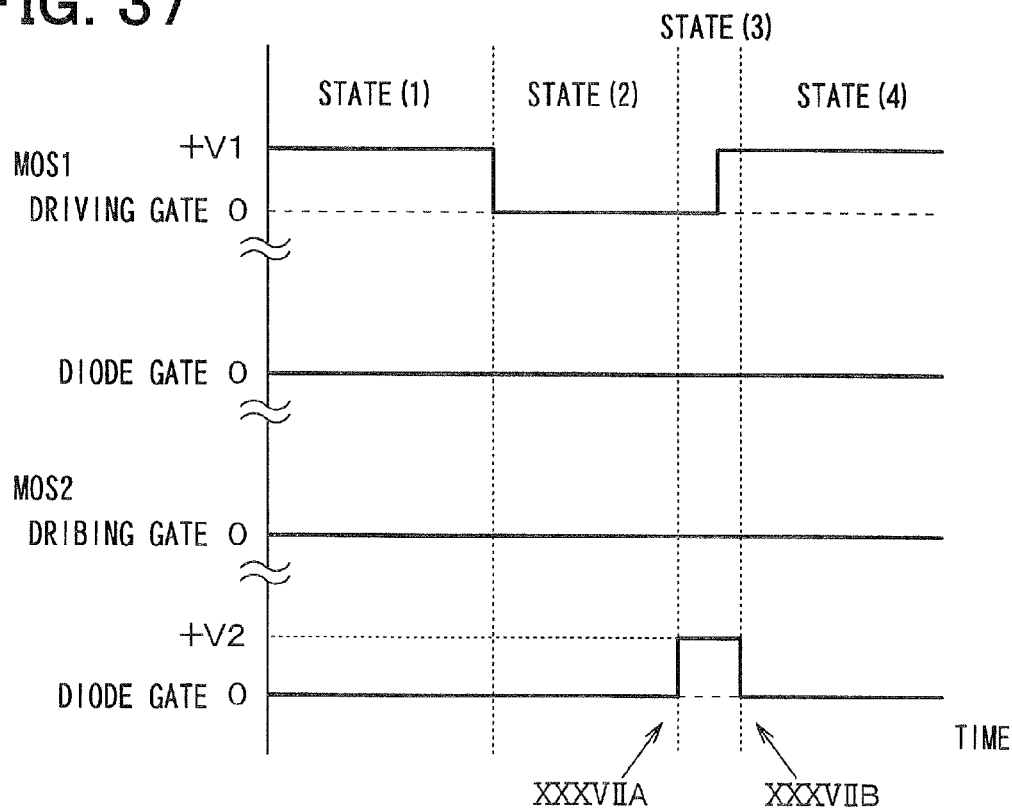
FIG. 37 is a diagram showing a timing chart indicating the operation of the semiconductor device 100 in an inverter circuit.
Figure 38A:
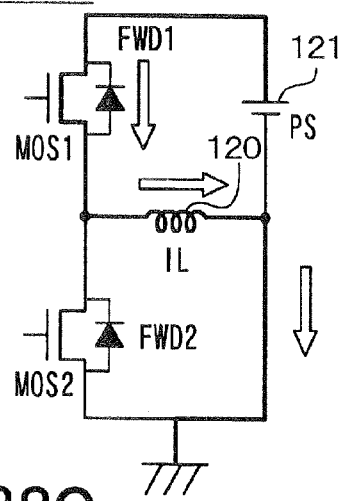
FIG. 38A is a diagram showing an explanatory drawing of the operation of an inverter circuit.
Figure 38B:
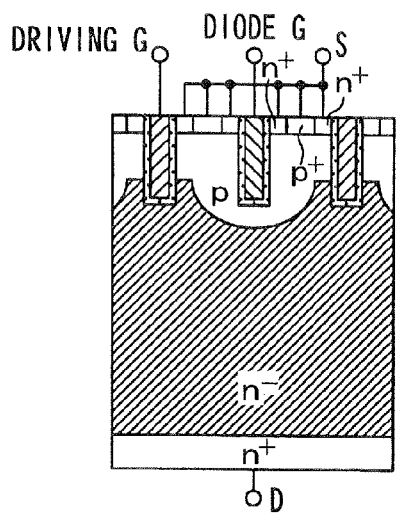
FIG. 38B is a diagram showing a cross sectional view illustrating the state in the semiconductor device 100 at the time of FIG. 38A.
Figure 38C:
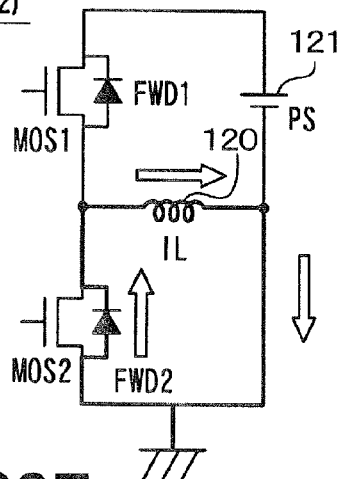
FIG. 38C is a diagram showing an explanatory drawing of the operation of an inverter circuit.
Figure 38D:
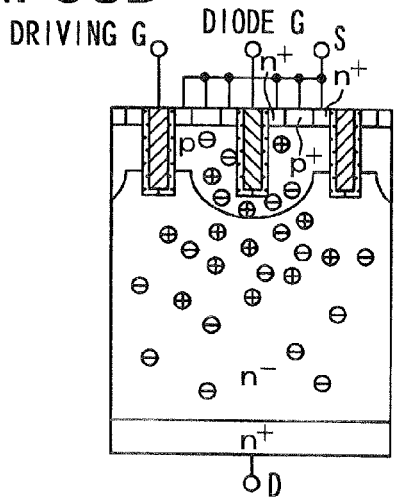
FIG. 38D is a diagram showing a cross sectional view illustrating the state in the semiconductor device 100 at the time of FIG. 38C.
Figure 38E:
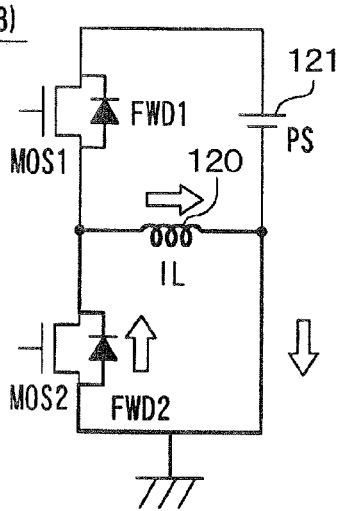
FIG. 38E is a diagram showing an explanatory drawing of the operation of an inverter circuit.
Figure 38F:
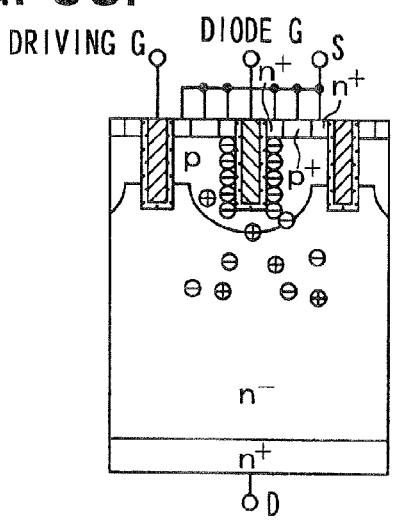
FIG. 38F is a diagram showing a cross sectional view illustrating the state in the semiconductor device 100 at the time of FIG. 38E.

Description will be given to this control method using an example of a circuit to which the semiconductor device 100 in this embodiment is applied. FIG. 36 is a circuit diagram illustrating an example of an inverter circuit to which the semiconductor device 100 in this embodiment is applied. FIG. 37 is a timing chart indicating the operation of the semiconductor device 100 in the inverter circuit. In FIG. 37, +V1 and +V2 may be an identical voltage or may be different voltages corresponding to performance. At XXXVIIA, FWD2 is turned on immediately before MOS1 turns on again (that is, immediately before the recovery operation of MOS2). At XXXVIIB, the re-turn-on of MOS1 and the turn-off of FWD2 may be overlapped with each other as required. FIGS. 38A to 38F are explanatory drawings illustrating the operation of the inverter circuit and sectional views illustrating the state of the interior of the semiconductor device 100 at that time and correspond to States (1) to (4) in FIG. 37. FIGS. 38C and 38D illustrate the diode operation by carrier injection; and FIGS. 38E and 38F show how easily electron extraction and hole annihilation are carried out by the formation of an inversion layer.

The semiconductor device 100 configured as in this embodiment is used as follows: two semiconductor devices 100 are coupled in series as illustrated in, for example, FIG. 36 and are used in a half bridge circuit for driving an inductive load 120. The inductive load 120 is driven by switching the vertical MOSFETs respectively provided in the two semiconductor devices 100 between on and off to change the direction of current supplied from a direct-current power source 121 to the inductive load 120. In the following description, the vertical MOSFET and the FWD provided in the high-side one of the two semiconductor devices 100 comprising the half bridge circuit will be respectively designated as MOS1 and FWD1; and the vertical MOSFET and the FWD provided in the low-side one will be respectively designated as MOS2 and FWD2. In the following description, a control method used when MOS1 in on state is switched off and is switched on again will be taken as an example. The states of the interior of the semiconductor device 100 shown in FIGS. 38A to 38F relate to the semiconductor device 100 on the low side.

In State (1) in FIG. 37, first, positive voltage (+V1) is applied to the MOS1 driving gate electrode 108a; and gate voltage is not applied to the MOS2 driving gate electrode 108a or the diode gate electrode 108b of each of FWD1 and FWD2. At this time, MOS1 is turned on and a current is passed through the inductive load 120 based on power supply from the power source 121 by the path indicated by the arrows in FIGS. 38A to 38F. Then the p-n junction formed between the p-type body region 103a as a p-type body layer and the n"-type drift layer 102 of MOS2 is brought into an inverse voltage state. Therefore, as illustrated in FIGS. 38A to 38F, a depletion layer is formed at the p-n junction and a current between source and drain is interrupted.

In State (2) in FIG. 37, subsequently, the application of positive voltage to the MOS1 driving gate electrode 108a is stopped to turn off MOS1. At this time, the inductive load 20 is going to continue the passage of current previously passed; therefore, an induced current is passed by the path indicated by the arrows in FIGS. 38A to 38F, that is, by the path running through FWD2. For this reason, FWD2 is turned on based on the potential difference across the inductive load 120 arising from the passage of the induced current. In the semiconductor device 100 on the low side, diode operation by carrier injection is carried out and electrons and holes exist.

In State (3) in FIG. 37, for this reason, the following processing is carried out immediately before MOS1 is turned on again as in State (4) in FIG. 37 when a predetermined time has passed after the turn-off of MOS1: MOS1 and MOS2 are kept off and positive voltage (+V2) is applied to the diode gate electrode 108b of FWD2. As a result, electrons in the p-type base region 103 are attracted to the vicinity of the diode gate electrode 108b of FWD2; and an inversion layer is formed in a place in the side surface of the trench 106 corresponding to the diode gate electrode 108b. For this reason, electrons are extracted to the front surface electrode 109 through the inversion layer. Holes are also recombined with electrons and can be easily annihilated. Therefore, the efficiency of carrier injection to FWD2 is reduced and loss at the time of recovery can be reduced.

In the semiconductor device 100 in this embodiment, as described up to this point, trenches 6 identical in depth are used to form the driving gate electrode 108a for driving a vertical MOSFET and a diode gate electrode 108b for forming an inversion layer on the FWD side. The diode gate electrode 108b is formed in a region where a p-type body layer 103a is formed and is so structured that the trench 106b in which the diode gate electrode 108b is placed does not reach the n⁻-type drift layer 102.

Using the semiconductor device 100 with this structure, an inversion layer is formed by applying positive voltage to the diode gate electrode 108b immediately before MOS1 once turned off is switched on again. The carrier injection efficiency can be thereby reduced. Therefore, it is possible to achieve both back flow loss reduction and recovery loss reduction without need for trench gates different in depth.

The semiconductor device 100 with this structure can be basically manufactured by the same manufacturing method as for conventional ordinary semiconductor devices in which a vertical MOSFET and FWD are contained in one chip. Since the trenches 106a, 106b are made equal in depth, however, they can be formed at the same step. For this reason, in addition, the manufacturing process for the semiconductor device 100 can be simplified.

In the above description, +V1 is taken for the voltage applied to the MOS1 driving gate electrode 108a and +V2 is taken for the voltage applied to the diode gate electrode 108b of FWD2. V1 and V2 may be an identical voltage or may be different voltages according to the performance of the vertical MOSFETs and FWDs. As shown in FIG. 37, a period during which MOS1 is turned on again and a period during which FWD2 is turned off are overlapped with each other. They only have to be provided as required and may be not overlapped.

18th Embodiment

Description will be given to the 18th embodiment of the disclosure. The semiconductor device in this embodiment is obtained by applying a superjunction structure to the 17th embodiment. The other respects are the same as those in the 17th embodiment and description will be given only to a difference from the 17th embodiment.

Figure 39:
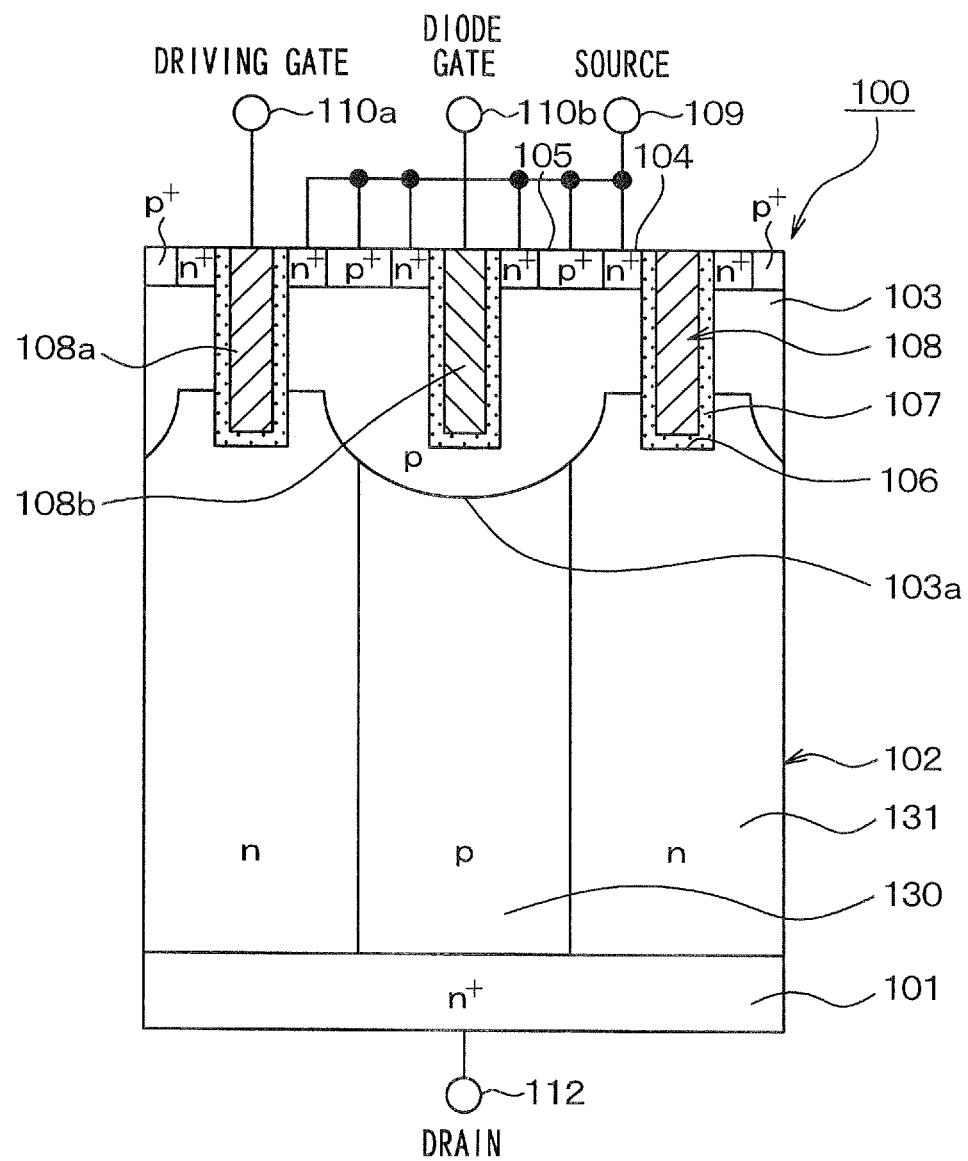
FIG. 39 is a diagram showing a cross sectional view of a semiconductor device with a vertical MOSFET and FWD formed therein in an 18th embodiment.

FIG. 39 is a sectional view of a semiconductor device in which a vertical MOSFET and FWD are formed in this embodiment. As illustrated in this drawing, p-type columns 130 are formed in the n⁻-type drift layer 102; and a superjunction structure is comprised of an n-type column 131 equivalent to a portion of the n⁻-type drift layer 102 sandwiched between p-type columns 130 and a p-type column 130. The p-type columns 130 and the n-type columns 131 are extended with the direction perpendicular to the plane of the drawing taken as the direction of length and are alternately arranged in a stripe pattern. The formation positions of the p-type columns 130 are matched with the p-type body layers 103a.

As mentioned above, a superjunction structure can also be adopted in the semiconductor device 100. Adoption of this superjunction structure makes it possible to obtain a desired breakdown voltage and reduce on resistance more than conventional.

When such a superjunction structure as described in relation to this embodiment is adopted, the following structure can be obtained when a p-type column 130 is formed below the diode gate electrode 108b: a structure in which the diode gate electrode 108b is not in contact with the n⁻-type drift layer 102. When a superjunction structure is adopted, for this reason, the following can be implemented even though the p-type body layers 103a are eliminated: the carrier injection efficiency can be reduced by applying positive voltage to the diode gate electrode 108b to form an inversion layer. Therefore, it is possible to achieve both back flow loss reduction and recovery loss reduction without need for trench gates different in depth as in each the above embodiment.

19th Embodiment

Description will be given to the 19th embodiment of the disclosure. The semiconductor device 100 in this embodiment is also obtained by applying a superjunction structure to the 17th embodiment. The other respects are the same as those in the 17th embodiment and description will be given to a difference from the 17th embodiment.

Figure 40:
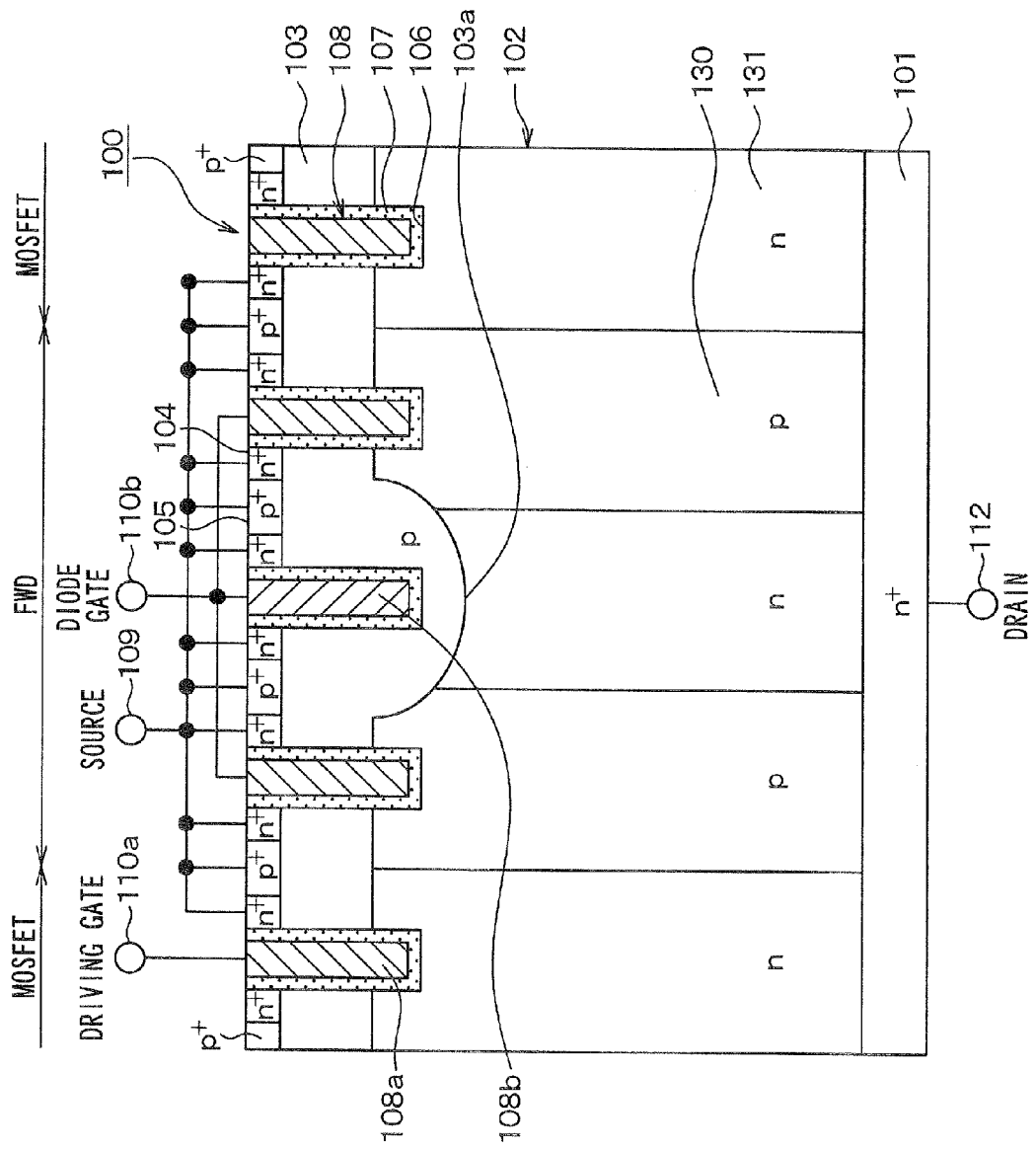
FIG. 40 is a diagram showing a cross sectional view of a semiconductor device with a vertical MOSFET and FWD formed therein in a 19th embodiment.

FIG. 40 is a sectional view of a semiconductor device 100 in which a vertical MOSFET and FWD are formed in this embodiment. As illustrated in this drawing, this embodiment is also so structured that a superjunction structure of an n-type column 131 and a p-type column 130 is provided. However, the formation positions of the p-type columns 131 are not matched with the formation positions of the p-type body layers 103a. Instead, they are matched with the formation positions of the gate electrodes 108 on both adjacent sides of a gate electrode 108 whose formation position is matched with that of a p-type body layer 103a.

In case of the semiconductor device 100 with this structure, those of the gate electrodes 108 made identical in formation position with a p-type body layer 103a or a p-type column 130 are taken as diode gate electrodes 108; and those formed in positions where a p-type body layer 103a or a p-type column 130 is not formed are taken as driving gate electrodes 108a. A portion of the semiconductor device 100 where a diode gate electrode 108b is formed functions as FWD and a portion where a driving gate electrode 108a is formed functions as a vertical MOSFET.

As mentioned above, the diode gate electrodes 108b can also be formed in correspondence both with the p-type body layers 103a and with the p-type columns 130. In this case, the formation ratio of the driving gate electrode 108a and the diode gate electrodes 108b is not 1:1. Since the formation ratio can be arbitrarily set, however, no problem arises.

20th Embodiment

Description will be given to the 20th embodiment of the disclosure. The semiconductor device 100 in this embodiment is provided with a vertical IGBT in place of the vertical MOSFET described in relation to the 17th embodiment. The other respects are the same as those in the 17th embodiment and description will be given only to a difference from the 17th embodiment.

Figure 41:
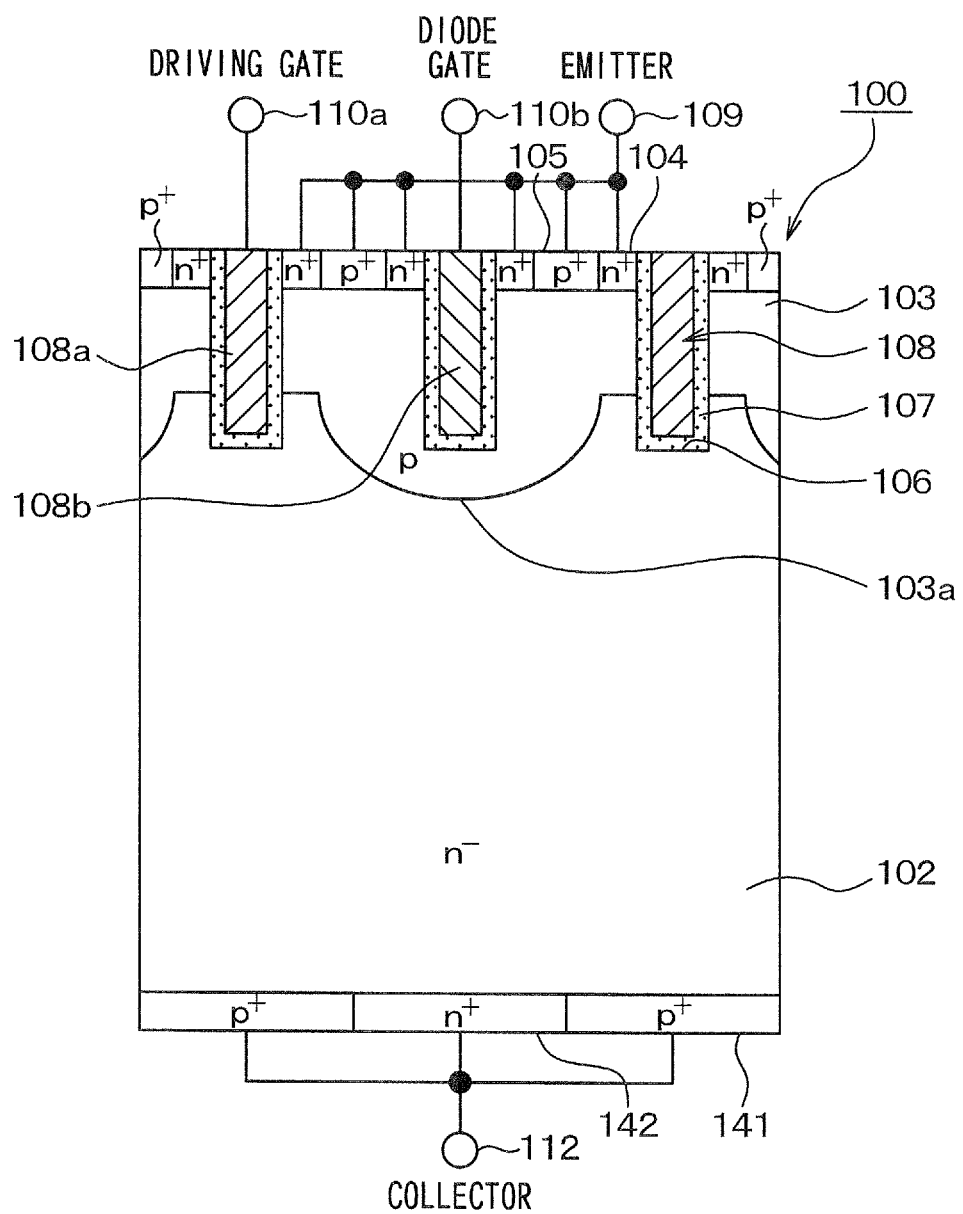
FIG. 41 is a diagram showing a cross sectional view of a semiconductor device with a vertical IGBT and FWD formed therein in a 20th embodiment.

FIG. 41 is a sectional view of a semiconductor device 100 in which a vertical IGBT and FWD are formed in this embodiment. As illustrated in this drawing, this embodiment is provided on the back surface side of the n⁻-type drift layer 102 with the following layers in place of the n⁺-type substrate 101 described in relation to the 17th embodiment: a p⁺-type impurity layer (semiconductor layer of second conductivity type) 141 equivalent to a collector region and a n⁺-type impurity layer (semiconductor layer of first conductivity type) 142 equivalent to a cathode region. In the thus configured semiconductor device 100 in this embodiment, the n⁺-type impurity region 104 functions as an emitter region and a structure in which a vertical IGBT and FWD are coupled in parallel is obtained.

Even when the semiconductor device 100 is so structured as to include a vertical IGBT and FWD, the same effect as in the 17th embodiment can be obtained by adopting the following structure: a structure in which the diode gate electrode 108b is formed in a position corresponding to a p-type body layer 103a and the trench 106b is not in contact with the n⁻-type drift layer 102.

Other Embodiments

In the above description of each embodiment, an n-channel vertical MOSFET or vertical IGBT in which the first conductivity type is n-type and the second conductivity type is p-type has been taken as an example. However, the disclosure can also be applied to a p-channel vertical MOSFET or vertical IGBT in which the conductivity type of each component is inverted.

Figure 42:
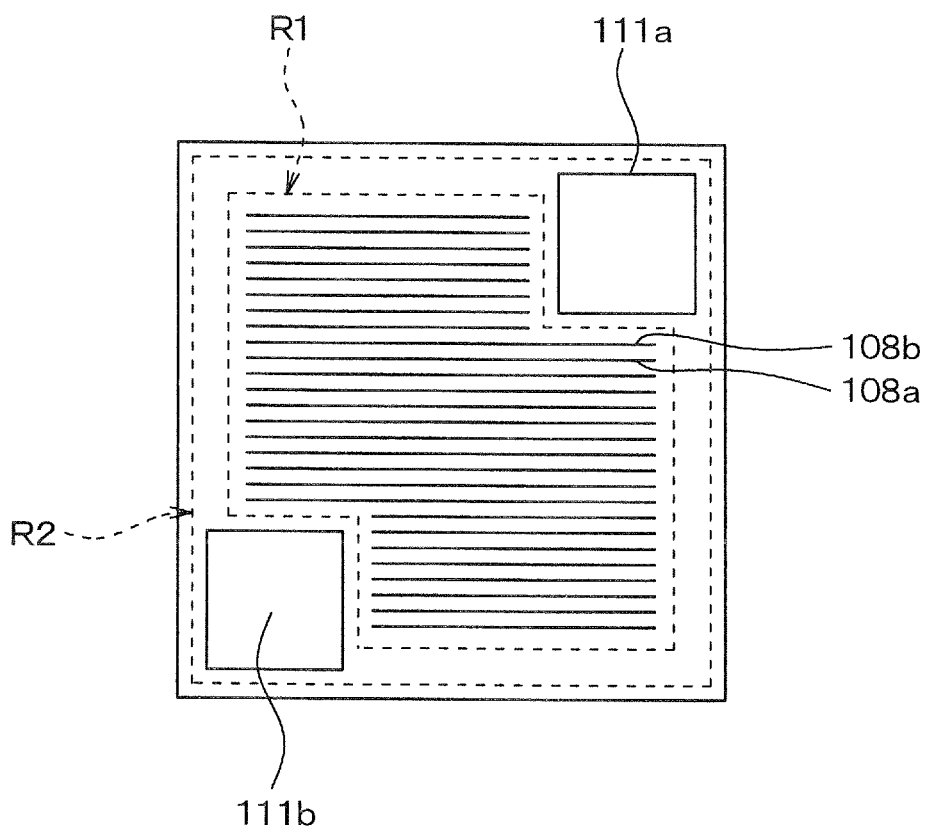
FIG. 42 is a diagram showing a drawing illustrating an example of the top layout of the semiconductor device 100 described in relation to another embodiment.

The detailed design of the structure of the semiconductor device 100 described in relation to each the above embodiment can be appropriately modified. As described in relation to the 17th embodiment, for example, a structure in which a driving gate pad 111a and a diode gate pad 111b are arranged side by side at one corner of a chip is adopted. However, this layout also just illustrates an example. Instead, the gates pads may be arranged as in the top layout chart in FIG. 42. That is, the driving gate pad 111a and the diode gate pad 111b may be respectively arranged in diagonal positions in a chip.

Further, a threshold value at which an inversion layer is formed at the diode gate electrode 108b may be made lower than a threshold value at which an inversion layer is formed at the driving gate electrode 108a. This makes it possible to form more inversion layers in proximity to the diode gate electrode 108b and carrier extraction is facilitated. Also with respect to the gate drive circuit for applying voltage to each gate electrode 108, applied voltage to the diode gate electrode 108b can be reduced and thus the burden on the circuit can be reduced.

While the disclosure has been described with reference to preferred embodiments thereof, it is to be understood that the disclosure is not limited to the preferred embodiments and constructions. The disclosure is intended to cover various modification and equivalent arrangements. In addition, while the various combinations and configurations, which are preferred, other combinations and configurations, including more, less or only a single element, are also within the spirit and scope of the disclosure.

What is claimed is:

1. A semiconductor device comprising:
a first conductivity type semiconductor layer;
a drift layer having the first conductivity type, arranged on the semiconductor layer, and having an impurity concentration lower than the semiconductor layer;
a base region having a second conductivity type, arranged on the drift layer opposite to the semiconductor layer;
a first conductivity type impurity region arranged on the base region, and having an impurity concentration higher than the drift layer;
a second conductivity type impurity layer arranged at a position deeper than the base region, and contacting the base region;
a trench arranged on a surface of the base region, wherein the trench extends in a longitudinal direction, and the first conductivity type impurity region and the base region are arranged on both sides of the trench;
a gate insulating film arranged on a surface of the trench;
a gate electrode arranged in the trench through the gate insulating film;
a front surface electrode electrically coupled to the first conductivity type impurity region and the base region; and
a back surface electrode arranged on a back surface of the first conductivity type semiconductor layer opposite to the drift layer,
wherein, when a voltage is applied to the gate electrode, an inversion layer is generated in a surface portion of the base region located on a side of the trench,
wherein a current flows between the front surface electrode and the back surface electrode through the first conductivity type impurity region, the inversion layer, and the drift layer so that an inverting vertical semiconductor switching element is provided, wherein a p-n junction is provided between the base region and the drift layer so that a free wheel diode having a diode operation is provided, wherein the semiconductor switching element and the free wheel diode are arranged in one chip, wherein the trench includes a first trench and a second trench, wherein the first trench is deeper than the base region and reaches the drift layer, wherein the second trench has a same depth as the first trench, reaches the second conductivity type impurity layer and is shallower than a bottom portion of the second conductivity type impurity layer, wherein the gate electrode includes a driving gate electrode for driving the vertical semiconductor switching element and a diode gate electrode for generating an inversion layer in the base region at a position where the free wheel diode is arranged, wherein the driving gate electrode is arranged in the first trench, wherein the diode gate electrode is arranged in the second trench, wherein a voltage is independently applied to the driving gate electrode and the diode gate electrode, and wherein the gate insulating film is between, and directly contacts, the diode gate electrode and the first conductivity type impurity region.

2. The semiconductor device of claim 1, wherein the second conductivity type impurity layer is a second conductivity type body layer arranged at a lower part of the base region.

3. The semiconductor device of claim 1, wherein the longitudinal direction of the driving gate electrode is parallel to the longitudinal direction of diode gate electrode, and wherein the driving gate electrode and the diode gate electrode are arranged in a stripe pattern having a predetermined formation ratio.

4. The semiconductor device of claim 3, further comprising:

a driving gate wiring coupled to the driving gate electrode; and a diode gate wiring coupled to the diode gate electrode, wherein the driving gate wiring is drawn from one end of the driving gate electrode in the longitudinal direction, and wherein the diode gate wiring is drawn from the other end of the diode gate electrode in the longitudinal direction.

5. The semiconductor device of claim 1, wherein a threshold value in a case where an inversion layer is formed when a voltage is applied to the diode gate electrode is lower than a threshold value in a case where an inversion layer is formed when a voltage is applied to the driving gate electrode.

6. The semiconductor device of claim 1, wherein the vertical semiconductor switching element is a vertical MOSFET, wherein the first conductivity type impurity region is a source region, wherein the front surface electrode is a source electrode, and wherein the back surface electrode is a drain electrode.

7. A control method for an apparatus including two semiconductor devices connected in series with each other, and an inductive load connected at a junction point between the two semiconductor devices, each of the semiconductor devices comprising:

a first conductivity type semiconductor layer;

a drift layer having the first conductivity type, arranged on the semiconductor layer, and having an impurity concentration lower than the semiconductor layer;

a base region having a second conductivity type, arranged on the drift layer opposite to the semiconductor layer;

a first conductivity type impurity region arranged on the base region, and having an impurity concentration higher than the drift layer;

a second conductivity type impurity layer arranged at a position deeper than the base region, and contacting the base region;

a trench arranged on a surface of the base region, wherein the trench extends in a longitudinal direction, and the first conductivity type impurity region and the base region are arranged on both sides of the trench;

a gate insulating film arranged on a surface of the trench;

a gate electrode arranged in the trench through the gate insulating film;

a front surface electrode electrically coupled to the first conductivity type impurity region and the base region; and a back surface electrode arranged on a back surface of the first conductivity type semiconductor layer opposite to the drift layer, wherein when a voltage is applied to the gate electrode, an inversion layer is generated in a surface portion of the base region located on a side of the trench, a current flows between the front surface electrode and the back surface electrode through the first conductivity type impurity region, the inversion layer, and the drift layer so that an inverting vertical semiconductor switching element is provided, a p-n junction is provided between the base region and the drift layer so that a free wheel diode having a diode operation is provided, the semiconductor switching element and the free wheel diode are arranged in one chip, the trench includes a first trench and a second trench, the first trench is deeper than the base region and reaches the drift layer, the second trench has a same depth as the first trench, reaches the second conductivity type impurity layer and is shallower than a bottom portion of the second conductivity type impurity layer, the gate electrode includes a driving gate electrode for driving the vertical semiconductor switching element and a diode gate electrode for generating an inversion layer in the base region at a position where the free wheel diode is arranged, the driving gate electrode is arranged in the first trench, and the diode gate electrode is arranged in the second trench, the method comprising:

switching the vertical semiconductor switching element in one of the semiconductor devices arranged on a high side from an off state to an on state, and switching the free wheel diode in the other semiconductor device arranged on a low side from an on state to an off state; and before the vertical semiconductor switching element in the one of semiconductor devices on the high side is switched from the off state to the on state, applying a gate voltage to the diode gate electrode in the other semiconductor device on the low side in order to generate an inversion layer in the base region located on the side of the second trench, in which the diode gate electrode is arranged.

\* \* \* \* \*